United States Patent
Tagawa

(10) Patent No.: US 11,796,919 B2
(45) Date of Patent: Oct. 24, 2023

(54) RESIST PATTERN FORMATION METHOD

(71) Applicant: OSAKA UNIVERSITY, Osaka (JP)

(72) Inventor: Seiichi Tagawa, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 545 days.

(21) Appl. No.: 17/251,722

(22) PCT Filed: Jun. 14, 2019

(86) PCT No.: PCT/JP2019/023750
§ 371 (c)(1),
(2) Date: Dec. 11, 2020

(87) PCT Pub. No.: WO2019/240279
PCT Pub. Date: Dec. 19, 2019

(65) Prior Publication Data
US 2021/0216016 A1 Jul. 15, 2021

(30) Foreign Application Priority Data
Jun. 14, 2018 (JP) .................. 2018-113560

(51) Int. Cl.
*G03F 7/38* (2006.01)
(52) U.S. Cl.
CPC ..................... *G03F 7/38* (2013.01)
(58) Field of Classification Search
CPC .... G03F 7/0045; G03F 7/2022; G03F 7/2059; G03F 7/38; G03F 7/20; G03F 7/11;
(Continued)

(56) References Cited

U.S. PATENT DOCUMENTS

| 9,977,332 B2 | 5/2018 | Tagawa et al. |
| 10,031,416 B2 | 7/2018 | Enomoto |

(Continued)

FOREIGN PATENT DOCUMENTS

| JP | H05-021331 A | 1/1993 |
| JP | H05-144693 A | 6/1993 |

(Continued)

OTHER PUBLICATIONS

The extended European search report issued by the European Patent Office dated Jul. 20, 2021, which corresponds to European Patent Application No. 19819098.5-1010 and is related to U.S. Appl. No. 17/251,722.

(Continued)

*Primary Examiner* — Deoram Persaud
(74) *Attorney, Agent, or Firm* — Studebaker & Brackett PC

(57) ABSTRACT

A resist pattern formation method includes: forming on a substrate a resist layer containing a base resin, a sensitizer precursor, an acid generator, a base generator, and a base; generating a sensitizer from the sensitizer precursor; generating an acid from the acid generator and a base from the base generator; performing heat treatment on the resist layer after flood exposure; and developing the resist layer after the heat treatment. A ratio (C1=A1/B1) of a value (A1) representing an acid in pattern exposure to a value (B1) representing a base in the pattern exposure satisfies a relationship $0.9 \times C1 < C2 < 10 \times C1$ relative to a ratio (C2=A2/B2) of a value (A2) representing an acid in flood exposure to a value (B2) representing a base in the flood exposure.

12 Claims, 21 Drawing Sheets

(58) Field of Classification Search
CPC ...... G03F 7/2024; G03F 7/2026; G03F 7/203;
G03F 7/2045; G03F 7/40; H01L 21/0274;
H01L 21/0271; H01L 21/0276; H01L
21/311; H01L 21/31144; H01L 21/56;
H01L 22/20; H01L 2224/0345; H01L
2224/03912; H01L 2224/05647; H01L
2224/11462; H01L 2224/1182; H01L
2224/1191; H01L 2224/13083; H01L
23/3171; H01L 23/3192; H01L 24/11;
H01L 24/12; H01L 24/13
See application file for complete search history.

(56) References Cited

U.S. PATENT DOCUMENTS

| | | | |
|---|---|---|---|
| 10,670,967 B2 | 6/2020 | Tagawa et al. | |
| 11,163,236 B2 * | 11/2021 | Carcasi | G03F 7/2026 |
| 2015/0241783 A1 * | 8/2015 | Carcasi | G03F 7/30 430/324 |
| 2016/0004160 A1 | 1/2016 | Tagawa et al. | |
| 2016/0187773 A1 | 6/2016 | Enomoto | |
| 2016/0357103 A1 | 12/2016 | Nagahara et al. | |
| 2017/0097570 A1 | 4/2017 | Tagawa | |
| 2017/0131633 A1 | 5/2017 | Nakagawa et al. | |
| 2017/0242342 A1 * | 8/2017 | Carcasi | G03F 7/0382 |
| 2017/0242344 A1 * | 8/2017 | Carcasi | G03F 7/70616 |
| 2017/0329229 A1 * | 11/2017 | Carcasi | G03F 7/40 |
| 2018/0231892 A1 | 8/2018 | Tagawa et al. | |
| 2018/0348639 A1 * | 12/2018 | Liu | G03F 7/325 |
| 2018/0356731 A1 | 12/2018 | Tagawa | |
| 2019/0094698 A1 * | 3/2019 | Carcasi | G03F 7/091 |

FOREIGN PATENT DOCUMENTS

| | | |
|---|---|---|
| JP | H06-053106 A | 2/1994 |
| JP | 2002-174894 A | 6/2002 |
| JP | 2005-150182 A | 6/2005 |
| JP | 2016-530340 A | 9/2016 |
| WO | 2014/129556 A1 | 8/2014 |
| WO | 2015/178464 A1 | 11/2015 |
| WO | 2017/090745 A1 | 6/2017 |

OTHER PUBLICATIONS

International Search Report issued in PCT/JP2019/023750; dated Sep. 3, 2019.
Seiichi Tagawa et al.; "Super High Sensitivity Enhancement by Photo-Sensitized Chemically Amplified Resist (PS-CAR) Process"; Journal of Photopolymer, Science and Technology; 2013; p. 825; vol. 26, No. 6.
Seiji Nagahara et al.; "EUV Resist Sensitization and Roughness Improvement by PSCAR™ with In-line UV Flood Exposure System"; Proc. SPIE vol. 10586, Advances in Patterning Materials and Processes XXXV, 10586-5 (2018).

* cited by examiner

150 μC/cm² 0 min

CD:82.25nm

180 μC/cm² 0 min

CD:93.47nm

84 μC/cm² 1 min

CD:81.53nm

120 μC/cm² 1 min

CD:84.53nm

144 μC/cm² 1 min

CD:75.37nm $$PAG \rightarrow Ac \qquad (1)$$
$$Ac + Pp \rightarrow Ps \qquad (2)$$
$$Ac + Ba \rightarrow Ne + WAc \qquad (3a)$$
$$WAc + Pp \rightarrow Ps \qquad (3b)$$
FIG. 16
$$PAG \xrightarrow{Ps} Ac$$
FIG. 17
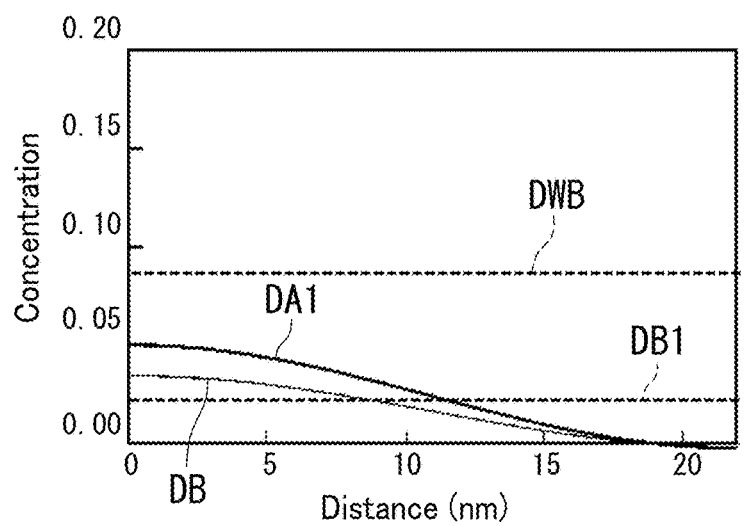
FIG. 18A
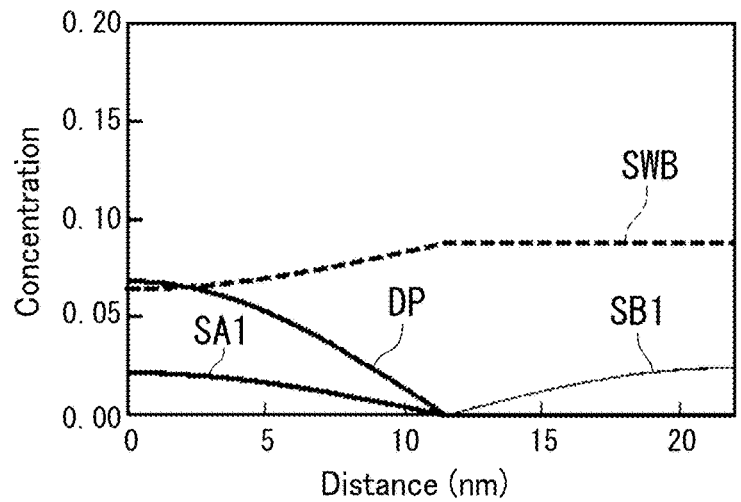
FIG. 18B

RESIST PATTERN FORMATION METHOD

TECHNICAL FIELD

The present invention relates to a resist pattern formation method.

BACKGROUND ART

Miniaturization of semiconductor devices has been promoted year after year in order to achieve high-concentration integration and high speed operation of the semiconductor devices, and therefore, further fine patterning is demanded in photolithography for the semiconductor devices. Shortening of the wavelength in exposure light sources has been mainly studied as a method for implementing fine patterning.

For example, the extreme ultraviolet (EUV, wavelength: 13.5 nm) gathers attention as a promising technique for manufacture of next-generation semiconductor devices and development thereof is being promoted. However, it has been difficult until recently to develop a light source device including a light source with an output power (250 W) necessary for application to mass production. Here, the light source device is to be mounted in a light exposure device. Accordingly, light exposure has sometimes been performed for a long time for pattern latent image formation. When further miniaturization advances in future, significant problems will arise about a decrease in throughput due to for example combinational use of double patterning or multi-patterning. Furthermore, in electron beam direct drawing using electron beams (EB), of which beam diameter is small, it takes time to form a complicated pattern with a large area although fine patterns can be formed with high dimensional accuracy. As such, in the light exposure technique using the extreme ultraviolet or electron beams, the problem of low throughput remains although fine pattern formation can be achieved.

In order to solve the problem of insufficient light source intensity, an increase in sensitivity of resist material is promoted for reducing the exposure time as far as possible. For example, in a resist composite disclosed in Patent Literature 1, a composition including a specific resin and a specific compound is used to increase sensitivity and resolution of a resist.

CITATION LIST

Patent Literature

[Patent Literature 1] Japanese Patent Application Laid-Open Publication No. 2002-174894

SUMMARY OF INVENTION

Technical Problem

However, three significant performances of resists, that is, sensitivity, resolution, and line width roughness (LWR) performance fall in a trade-off relationship. Therefore, when sensitivity of a resist is simply increased, resolution and line width roughness performance shall decrease. For the above reason, there remains in conventional methods a limit on improvement in resist sensitivity without involving decreases in resolution and line width roughness performance and it has been accordingly impossible to sufficiently solve the problem of low throughput. Moreover, defects resulting from random noise such as photon shot noise are perceived as a problem more significant than the conventional problem of trade-off.

The present invention has been made in view of the aforementioned problems and has its object of providing a resist pattern formation method that can solve all the problems of decreases in sensitivity, resolution, and line width roughness performance of a resist.

Solution to Problem

A resist pattern formation method according to an aspect of the present invention includes: forming a resist layer on a substrate, the resist layer containing a base resin, a sensitizer precursor, an acid generator, a base, and a base generator; generating an acid from the acid generator and a sensitizer from the sensitizer precursor by performing pattern exposure on the resist layer; generating, after the pattern exposure, an acid from the acid generator and a base from the base generator by performing flood exposure on the resist layer in which the sensitizer has been generated; performing heat treatment on the resist layer after the flood exposure; and developing the resist layer after the heat treatment. A ratio ($C1=A1/B1$) of a value (A1) representing an acid in the pattern exposure to a value (B1) representing a base in the pattern exposure satisfies a relationship $0.9 \times C1 < C2 < 10 \times C1$ relative to a ratio ($C2=A2/B2$) of a value (A2) representing an acid in the flood exposure to a value (B2) representing a base in the flood exposure.

In an embodiment, the value (A1) representing the acid in the pattern exposure indicates a peak concentration of the acid generated from the acid generator in the pattern exposure. The value (B1) representing the base in the pattern exposure indicates a concentration of the base contained in the resist layer in the forming a resist layer. The value (A2) representing the acid in the flood exposure indicates a peak concentration of a sum of an acid remaining after neutralization between the acid in the pattern exposure and the base in the pattern exposure and the acid generated from the acid generator by the flood exposure. The value (B2) representing the base in the flood exposure indicates a concentration of a sum of the base contained in the resist layer in the forming a resist layer and the base generated from the base generator by the flood exposure.

In an embodiment, the value (A1) representing the acid in the pattern exposure indicates an amount of an acid generated from the acid generator in an acid remaining region of the resist layer in which an acid remains after neutralization between the acid in the pattern exposure and the base in the pattern exposure. The value (B1) representing the base in the pattern exposure indicates an amount of a base contained in the acid remaining region of the resist layer in the forming a resist layer. The value (A2) representing the acid in the flood exposure indicates a sum of an amount of an acid remaining in the acid remaining region of the resist layer after the neutralization between the acid in the pattern exposure and the base in the pattern exposure and an amount of the acid generated from the acid generator by the flood exposure. The value (B2) representing the base in the flood exposure indicates an amount of a base generated in the acid remaining region of the resist layer from the base generator by the flood exposure.

In one embodiment, a size (Wb) of a region in which an acid remains after neutralization between the acid in the flood exposure and the base in the flood exposure is equal to or smaller than a size (Wa) of a region in which an acid remains after neutralization between the acid in the pattern exposure and the base in the pattern exposure.

In an embodiment, a difference (A2−B2) between the value (A2) representing the acid in the flood exposure and the value (B2) representing the base in the flood exposure is larger than a difference (A1−B1) between the value (A1) representing the acid in the pattern exposure and the value (B1) representing the base in the pattern exposure.

In an embodiment, the generating an acid from the acid generator and a sensitizer from the sensitizer precursor includes heating the resist layer after acid generation from the acid generator by the pattern exposure on the resist layer.

In an embodiment, the pattern exposure uses electromagnetic waves including a KrF excimer laser, an ArF excimer laser, or extreme ultraviolet having a wavelength shorter than 250 nm.

In an embodiment, the pattern exposure uses charge beams including electron beams or ion beams.

Advantageous Effects of Invention

According to the present invention, decreases in all of sensitivity, resolution and line width roughness performance of a resist can be achieved.

BRIEF DESCRIPTION OF DRAWINGS

FIG. 16 presents main chemical equations of reactions caused in a resist layer in the pattern exposure.

FIG. 17 presents a main chemical equation of a reaction caused in the resist layer in the flood exposure.

FIG. 18A is a schematic diagram illustrating a concentration distribution of an acid and a concentration distribution of a base each in the resist layer in the pattern exposure. FIG. 18B is a schematic diagram illustrating a concentration distribution of an acid and a concentration distribution of a base each remaining after neutralization between an acid and a base in the resist layer in the pattern exposure.

DESCRIPTION OF EMBODIMENTS

The following describes an embodiment of a resist pattern formation method according to the present invention with reference to the accompanying drawings. However, the present invention is no way limited to the following embodiment.

First, a resist pattern formation method according to the present embodiment will be described with reference to FIGS. 1A to 1E. Examples of resist layers made of a resist material include a positive resist layer and a negative resist layer. The positive resist layer has an exposure portion that dissolves in a developer, whereas the negative resist layer has an exposure portion that does not dissolve in a developer. The positive resist layer is described as an example in the following description. The resist layer may be a chemically amplified resist layer containing an acid generator that generates an acid through light exposure and a base material (base resin) that changes in solubility in a developer through action of an acid.

FIGS. 1A to 1E are schematic diagrams illustrating respective steps of the resist pattern formation method according to the present embodiment.

Figure 1A:
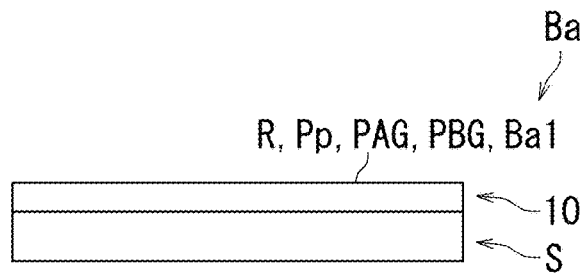
FIGS. 1A to 1E are schematic diagrams illustrating respective steps of a resist pattern formation method according to an embodiment of the present invention.

First, a resist layer 10 is formed on a substrate S as illustrated in FIG. 1A. For example, a resist layer 10 is formed in a manner in which a resist material dissolved in a solution is applied onto a prepared substrate S (e.g., a wafer) and prebaking is performed thereon. Typically, a target for photolithography (e.g., a semiconductor layer or an insulating layer) has been formed on the surface of the substrate S.

The resist layer 10 contains a base resin R, a sensitizer precursor Pp, an acid generator PAG, a base generator PBG, and a base Ba. Note that the resist layer 10 may be formed directly on the substrate S or formed on an underlying layer provided on the substrate S. Relative to 100 parts by mass of the base resin R in the resist layer 10, for example: the amount of the sensitizer precursor Pp is at least 0.1 parts by mass and no greater than 40 parts by mass; the amount of the acid generator PAG is at least 0.1 parts by mass and no greater than 40 parts by mass; the amount of the base Ba is greater than 0 parts by mass and no greater than 10 parts by mass; and the amount of the base generator PBG is greater than 0 parts by mass and no greater than 40 parts by mass.

The base resin R is methyl methacrylate (also referred to below as "MMA")-based polymer, for example. An intermediate, radicals, ions (cations or anions), and the like participate in chemical reaction in association with at least one of pattern exposure L1 and flood exposure L2, which will be described later, while a MMA resin is less likely to annul the intermediate, the radicals, and the ions. However, the base resin R may include a polyhydroxystyrene resin (PHS resin). Alternatively, the base resin R may be a mixture of a MMA resin and a PHS resin.

Alternatively, the base resin R may be a phenolic resin or any of various resins having an acetal protecting group. In EUV exposure or EB exposure, protons are generated mainly from the base resin R and move in the base resin R or between molecules of the base resin R to react with anions generated by dissociation of the acid generator PAG, thereby generating an acid. The base resin R may include a low molecular weight compound in addition to a high molecular compound. However, it is preferable that protons generated from the low molecular weight compound move between the molecules of the base resin to react with anions generated by dissociation of the acid generator PAG, thereby generating an acid. Furthermore, the base resin R may be a resin that does not generate protons that move in the base resin R or between the molecules of the base resin R. Alternatively, the base resin R may be an inorganic material. Note that a radiation-chemical reaction is caused in the resist layer 10 when EUV beams or EB are radiated, whereas a photochemical reaction is caused in the resist layer 10 when ArF laser beams or KrF laser beams are radiated. As such, different irradiation beam sources cause different acid generating reactions.

Not that the base resin R may be decomposed by at least one of the pattern exposure L1 and the flood exposure L2 to generate an intermediate, radicals, and ions. In particular, the base resin R is relatively easily decomposed when electron beams or EUV beams are used as the beams of the pattern exposure L1.

The sensitizer precursor Pp may be of acetal type or alcohol type. Where the sensitizer precursor Pp is of acetal type, the acetal compound may be one obtained from an aldehyde or one obtained from a ketone. Alternatively, the sensitizer precursor Pp may be a ketal or a hemiacetal (semiketal) other than an acetal. For example, the sensitizer precursor Pp is a dimethoxybenzhydrol derivative (DOBzMM).

The sensitizer precursor Pp may be mixed with the base resin R. Alternatively, the sensitizer precursor Pp may be bonded to a component in the resist layer 10. For example, the sensitizer precursor Pp may be bonded to the base resin R.

Furthermore, where the sensitizer precursor Pp is of alcohol type, the resist layer 10 contains a radical generating component. The radical generating component may be mixed with the base resin R. Alternatively, the radical generating component may be bonded to another component in the resist layer 10. For example, the radical generating component may be bonded to the base resin R or bonded to the acid generator PAG.

The sensitizer Ps is generated from the sensitizer precursor Pp in presence of radicals generated from the radical generating component in the resist layer 10. For example, the sensitizer precursor Pp includes at least one of alcohol type sensitizer precursors such as bis(4-methoxyphenyl) methanol (DOMeBzH) and trimethoxybenzhydrol (Tri-OMeBzH). Alternatively, the sensitizer precursor Pp may be of mixed type of acetal and alcohol.

An acid Ac is generated from the acid generator PAG. The acid generator PAG may for example be diphenyliodomium perfluorobutanesulfonate (DPI-PFBS) of iodonium salt ($R_2IX$) base or triphenylsulfonium perfluorobutanesulfonate (TPS-PFBS) of sulfonium salt ($R_3SX$) base. Alternatively, the acid generator PAG may be an iodonium salt such as phenyl dibenzothionium nonafluorobutanesulfonate (PBpS-PFBS).

Note that the acid generator PAG is preferably a bulky acid generator having a small diffusion coefficient but may be bonded to the base resin R. The acid generator PAG is preferably one that efficiently receives electrons transferred from a sensitizer Ps in an excited state. Furthermore, it is preferable that the concentration of the acid generator PAG is high so that electron transfer tends to readily occur. Note that a single compound may function as both the sensitizer precursor Pp and the acid generator PAG.

The base generator PBG may be of non-ion type or ion type. An example of a non-ion type base generator PBG is 9-anthyrylmethyl-N,N-diethyl carbamate. Examples of an ion type base generator PBG include cyclohexylammonium 2-(3-benzoilphenyl)propionate and dicyclohexylammoium 2-(3-benzoilphenyl)propionate. Note that a base Ba generated from the base generator PBG preferably has a small diffusion coefficient.

The base Ba reacts with an acid Ac generated from the acid generator PAG to be neutralized. Note that a base Ba generated from the base generator PBG also reacts with the acid Ac generated from the acid generator PAG to be neutralized. In the present description, the base Ba contained in advance in the resist layer 10 may be referred to as a base Ba1. The type of the base Ba1 may be the same as or different from that of the base Ba generated from the base generator PBG.

The resist layer 10 is basic due to presence of the base Ba1. Therefore, decomposition of the sensitizer precursor Pp can be inhibited and an acid at an extremely low concentration can be removed that is generated in a region where no acid is necessary by out-of-band light in a case where EUV light is used as beams of the pattern exposure L1.

For example, an amine compound such as trioctylamine is used as the base (basic compound) Ba1. The base Ba1 may be mixed with the base resin R. Alternatively, the base Ba1 may be bonded to another component in the resist layer 10. For example, the base Ba1 is bonded to the base resin R. Preferably, the base Ba1 has a small diffusion coefficient. As a result of a small amount of the base Ba1 being added to the resist layer 10 in advance, contrast and resolution can be improved and generation of a small amount of an acid in association with irradiation of regions 10b with stray light or out-of-band light can be inhibited, thereby improving resist performance.

Figure 1B:
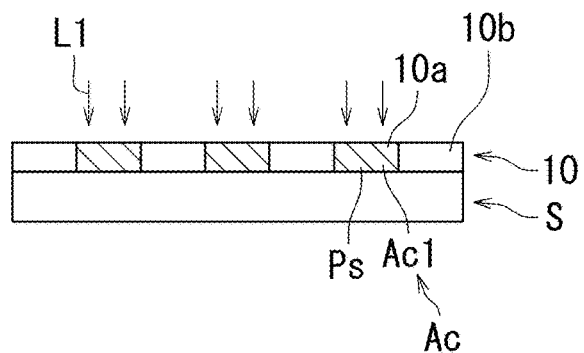

Next, the pattern exposure L1 is performed on the resist layer 10 as illustrated in FIG. 1B. Beams of the pattern exposure L1 are radiated on regions 10a of the resist layer 10 at a high dose while being radiated on regions 10b of the resist layer 10 at a low dose. Arrows indicating the beams of the pattern exposure L1 are schematically drawn over the regions 10a being irradiated at a high dose in FIG. 1B.

The pattern exposure L1 supplies energy to each region 10a and each region 10b of the resist layer 10. With the energy supplied to the resist layer 10, the composition in the resist layer 10 is excited or ionized to be in an active state, thereby generating a sensitizer Ps from the sensitizer precursor Pp in the resist layer 10.

Furthermore, with the energy supplied to the resist layer 10, an acid Ac is generated from the acid generator PAG in the region 10a of the resist layer 10. Note that the acid Ac in the pattern exposure L1 may be referred to as an acid Ac1 in the present description. For example, the acid Ac1 is generated from the acid generator PAG by the pattern exposure L1.

The acid Ac1 generated in the resist layer 10 is neutralized with the base Ba1. Note that the acid Ac1 has a higher concentration than the base Ba1 in at least part of the region 10a of the resist layer 10. Therefore, at least a portion of the acid Ac remains after neutralization between the acid Ac1 and the base Ba1. Typically, the acid Ac remains in at least a central part of the region 10a.

Note that the environment surrounding the resist layer 10 is preferably in an atmosphere in which decay of either or both an acid and radicals participating in generation of a sensitizer Ps is controllable, for example. The atmosphere in which decay of either or both the acid and the radicals participating in generation of the sensitizer Ps is controllable may be a vacuum atmosphere or an inert gas atmosphere that contains no basic substances. Alternatively, a top coat layer that blocks either or both basic substances and oxygen may be provided on the resist layer 10. In a case where the environment surrounding the resist layer 10 is set in an inert gas atmosphere, examples of the inert gas include nitrogen gas, helium gas, and argon gas. In this case, the pressure may be reduced pressure or increased pressure. In a case where the environment surrounding the resist layer 10 is set in a vacuum atmosphere, only the surroundings of the resist layer 10 need be vacuum and it is preferable that the pressure of the surroundings of the resist layer 10 is in a vacuum state at an air pressure of equal to or lower than 1 Pa. In the environment of the inert gas atmosphere or the vacuum atmosphere, decay of the acid and the radicals participating in generation of a sensitizer Ps in the resist layer 10 can be inhibited.

In a case where the sensitizer precursor Pp is of acetal type, the pattern exposure L1 is preferably performed in an atmosphere in which acid deactivation is not caused. Acid activation is not caused when a base removing filter is further provided in a light exposure device installed in a clean room as in production of a chemically amplified resist that is mainly used in a process of current mass production of semiconductors. Furthermore, in a case where the sensitizer precursor Pp is of alcohol type, the pattern exposure L1 is preferably performed in a vacuum or inactive atmosphere in which acid deactivation is not caused.

Electromagnetic waves are used for example as the beams of the pattern exposure L1. Preferably, the electromagnetic waves have a wavelength of shorter than 250 nm. Examples of the beams that can be preferably used in the pattern exposure L1 include the extreme ultraviolet (EUV), the ArF excimer laser, and the KrF excimer laser. Charged beams may for example be used as the beams of the pattern exposure L1. Examples of the charged beams include electron beams (EB) and ion beams. Furthermore, a top coat layer that blocks either or both basic substances and oxygen may be provided on the resist layer 10.

Note that an acid Ac is generated from the acid generator PAG by the pattern exposure L1, whereas no sensitizer Ps may be generated from the sensitizer precursor Pp by only the pattern exposure L1. In this case, it is possible that by heating the resist layer 10 after an acid Ac is generated by the pattern exposure L1, a sensitizer Ps is generated from the sensitizer precursor Pp in working with the generated acid Ac.

Figure 1C:
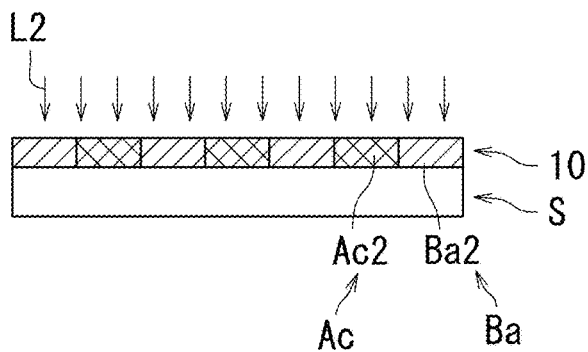

Next, the flood exposure L2 is performed on the resist layer 10 as illustrated in FIG. 1C. By the flood exposure L2, energy is supplied to the entirety of the resist layer 10 in which the sensitizer Ps has been generated. When energy is supplied, an acid Ac is generated from the acid generator PAG. Note that the acid Ac in the flood exposure L2 may be referred to as an acid Ac2 in the present description. The acid Ac2 is a sum of an acid Ac remaining after neutralization between an acid Ac and the base Ba in the pattern exposure L1 and an acid Ac generated from the acid generator PAG in the flood exposure L2. Note that the type of the acid generator PAG that generates an acid Ac by the flood exposure L2 may be the same as or different from the type of the acid generator PAG that generates an acid Ac by the pattern exposure L1.

Furthermore, a base Ba is generated from the base generator PBG in the entirety of the resist layer 10 by the flood exposure L2. In the present description, the base Ba in the flood exposure L2 may be referred to as a base Ba2. For example, the base Ba2 is a sum of a base Ba remaining after neutralization between an acid Ac and the base Ba1 in the pattern exposure L1 and a base Ba generated from the base generator PBG by the flood exposure L2.

Once a base Ba is generated from the base generator PBG by the flood exposure L2, the concentration of the base Ba is level at a specific value regardless of the location. Note that the resist layer 10 initially contains the base Ba1 before the pattern exposure L1 as described above and value representing the base Ba2 is accordingly the concentration of the base Ba generated by the flood exposure L2.

For example, the sensitizer Ps transitions to an excited state by the flood exposure L2. An acid Ac is generated from the acid generator PAG in presence of the sensitizer Ps. Note that a base Ba may be generated directly from the base generator PBG in the entirety of the resist layer 10 by the flood exposure L2 as described above. Alternatively, a base Ba may be generated from the base generator PBG in presence of the sensitizer Ps by the flood exposure L2.

In generation of an acid Ac from the acid generator PAG in presence of the sensitizer Ps, when electrons in the excited stated of the sensitizer Ps move to the acid generator PAG, the excited state of the sensitizer Ps becomes cationically radical. Also, the acid generator PAG decomposes through a dissociative electron addition reaction, thereby generating anions. Thereafter, an acid Ac and a sensitizer Ps before being excited are newly generated through a complicated reaction.

When the flood exposure L2 is continued on the region 10a in which the sensitizer Ps and the acid generator PAG are present, an acid Ac and a sensitizer Ps are generated until almost all of the acid generator PAG and the sensitizer precursor Pp are annulled.

As described above, when energy is supplied by the flood exposure L2, an acid Ac is generated from the acid generator PAG in the resist layer 10 and a base Ba is generated from the base generator PBG in the resist layer 10. Furthermore, the acid Ac generated from the acid generator PAG is neutralized with the base Ba generated from the base generator PBG. Through the above, the acid generator PAG and the base generator PBG are consumed.

The generated base Ba is neutralized with the generated acid Ac to be annulled in the vicinity of the center of the region 10a of the resist layer 10. Accordingly, the concentration of the base Ba present in the resist layer 10 is almost zero in the vicinity of the center of the region 10a and is at a specific value in almost all part of the region 10b.

Typically, the beam intensity in the flood exposure L2 is higher than the beam intensity in the pattern exposure L1, and therefore, the flood exposure L2 can be performed using a light source much cheaper than one used in the pattern exposure L1. Also typically, beams having a longer wavelength than the beams of the pattern exposure L1 are used in the flood exposure L2. However, the present invention is not limited to the above and beams having a shorter wavelength than that of the beams of the pattern exposure L1 may be used in the flood exposure L2. For example, a UV beam light source may be used as a light source for the flood exposure L2. In a case where the resist layer 10 is a positive resist layer, a latent image is formed in which the regions 10a of the resist layer 10 can be removed.

Note that the entirety of the resist layer 10 is preferably irradiated with the beams of the flood exposure L2. However, a partial area out of the entirety of the resist layer 10 may be irradiated with the beams of the flood exposure L2.

Figure 1D:
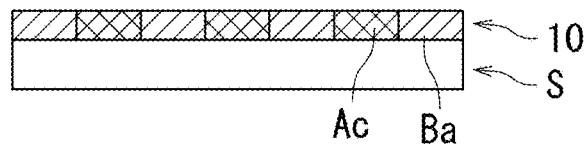

Thereafter, heat treatment is performed on the resist layer 10 as illustrated in FIG. 1D. The heat treatment is performed by heating the resist layer 10 and may be called post exposure bake (PEB). The heat treatment may be pulse heat treatment, for example. The heat treatment causes an acid diffusion reaction. For example, the heat treatment is performed at a temperature of 100° C. or higher and 110° C. or lower. In addition, translation treatment for reversal between positive and negative may be performed on the resist layer 10 after the flood exposure L2 or the heat treatment.

The acid Ac and the base Ba are re-bonded to each other by the heat treatment (PEB). Re-bonding between the acid Ac and the base Ba neutralizes and consumes the acid Ac and the base Ba. The acid Ac reacts with the base resin R in a re-bonding reaction zone at a temperature of the heat treatment (PEB) to change solubility of the resist layer 10 in a developer.

Figure 1E:
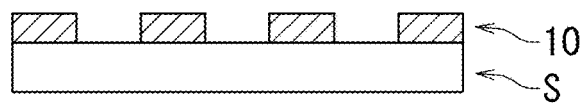

Thereafter, the resist layer 10 is developed as illustrated in FIG. 1E. Through development, at least a portion of the region 10a is dissolved in the developer to be removed.

A resist material in the present embodiment contains a resist composite including the base resin R, the sensitizer precursor Pp, the acid generator PAG, the base generator PBG, and the base Ba. When the resist composite of the resist material is irradiated with the beams of the pattern exposure L1, a sensitizer Ps that exhibits strong absorption for beams having a wavelength different from that of the beams of the pattern exposure L1 is generated from the sensitizer precursor Pp. This sensitizer Ps is generated in a pattern shape according to beam irradiation in the pattern exposure L1. Furthermore, when the beams of the flood exposure L2 are radiated, the sensitizer Ps absorbs the beams of the flood exposure L2 to prompt a reaction that is caused in presence of the sensitizer Ps. For example, an acid Ac is generated from the acid generator PAG in presence of the sensitizer Ps, which can facilitate formation of a predetermined latent pattern. Furthermore, beam irradiation in the flood exposure L2 generates a base Ba from the base generator PBG in the resist layer 10.

In the present embodiment, after a sensitizer Ps is generated in the resist layer 10 by the pattern exposure L1, an acid Ax is generated from the acid generator PAG through excitation of the sensitizer Ps by the flood exposure L2 and a base Ba is generated from the base generator PBG by the flood exposure L2. This enables formation of a latent image having an appropriate pattern shape even when a low-power light source is used as a beam light source for the pattern exposure L1. For example, a latent image can be formed in the region 10a in a manner in which radiation of EUV beams as the beams of the pattern exposure L1 is performed on the region 10a of the resist layer 10 followed by radiation of UV beams as the beams of the flood exposure L2 on the resist layer 10. In this case, a time of irradiation with the EUV beams can be shortened with a result that high throughput can be yielded even using a low-power light source.

Furthermore, in the present embodiment, an acid Ac is generated in a specific region of the resist layer 10 while a base Ba is generated in the entirety of the resist layer 10. Accordingly, the acid Ac is present in the region 10a of the resist layer 10 and the base Ba is present in the region 10b although the acid Ac decreases through neutralization of a portion thereof with the base Ba in the resist layer 10 even at room temperature before PEG. A decrease in resolution caused due to temperature increase and diffusion of the acid Ac by PEB can be inhibited in presence of the base Ba in the region 10b.

Furthermore, in the present embodiment, when the flood exposure L2 is sufficiently continued, the base generator PBG is annulled in the region 10b and the concentration of the base Ba generated from the base generator PBG becomes almost constant at a specific peak. In the region 10a, the base Ba generated from the base generator PBG in the region 10a reacts with an acid Ac to decrease the concentration of the acid Ac. In general, an acid Ac and a base Ba each have very a small diffusion coefficient at room temperature. Therefore, the peak concentration of the acid Ac and the peak concentration of the base Ba are almost fixed and each concentration of the acid Ac and the base Ba forms a very steep gradient at a boundary between the region 10a and the region 10b.

Note that polarity conversion of the base resin R hardly occurs in a boundary region between the region 10a and the region 10b. Although the diffusion coefficients of the acid Ac and the base Ba are small at the temperature of PEB, almost 100% polarity conversion of the base resin R occurs in the central part of the region 10a because only an acid is present and a base is hardly present there. Therefore, the diffusion coefficient of the acid becomes extremely large (the diffusion coefficient of an acid in a chemically amplified resist becomes extremely higher in highly polar molecules than in non-polar molecules), and diffusion speed of the acid is suddenly slowed in the boundary region between the region 10a and the region 10b, so that the polarity conversion of the base resin R becomes 0% from almost 100%. Thus, the chemical gradient formed in a reaction after PEB can be increased. LWR is inversely proportional to the chemical gradient, and LWR resulting from photon shot noise is also inversely proportional to the magnitude of the chemical gradient. Therefore, the above process can significantly improve LWR resulting from photon shot noise.

The above relationship is well known and formulated as follows.

$$LWR \propto constant/dm/dx$$

$$\sigma_{LWR} \propto \sigma_m/dm/dx$$

Here, $\sigma$ represents a standard deviation value, m represents a concentration of a chemical substance after a reaction that is standardized with a concentration of the chemical substance before the reaction, x represents a location in a resist layer, and dm/dx represents a chemical gradient. When the number of photons is decreased, dispersion of the reaction increases and $\sigma_m$ accordingly increases. However, the chemical gradient dm/dx can be significantly increased in the present embodiment, and therefore, the standard deviation value of LWR can be reduced even if $\sigma_m$ is large.

As described above, according to the present embodiment, the trade-off relationship among sensitivity, resolution, and line width roughness (LWR) performance can be broken and sensitivity of the resist layer 10 can be increased while pattern resolution can be maintained. Furthermore, photon short noise, which is a recent problem more significant than trade-off, can be significantly reduced. As a result, throughput in exposure can be increased and significant reduction in exposure system cost can be achieved. Furthermore, thanks to a low-power light source being applicable, lifetimes of a light source device and expendable parts in the light exposure device can be elongated and maintenance cost and operating cost can be significantly reduced. As described above, according to the present embodiment, the trade-off relationship among sensitivity, resolution, and line width roughness (LWR) performance can be broken to achieve improvement in sensitivity of the resist and reduction in LWR resulting from photon shot noise.

Note that it is generally known to neutralize an excess acid by adding a large amount of a base in advance to a resist material in order to form an acid having a sharp concentration distribution. According to the above scheme, an acid having a concentration distribution that is sharp to some extent can be formed. However, in a case of formation of a fine pattern having a line width of no greater than several tens nanometers (e.g., 5 nm to 15 nm), an insufficient amount of an acid is generated by simply adding a large amount of a base and it is impossible to generate an acid at an appropriate concentration for forming a fine pattern. As a result, line edge roughness (LER) performance and photon shot noise cannot be improved. By contrast, according to the present embodiment, a base Ba can be generated in the region 10b by the flood exposure L2, thereby enabling to make the concentration distribution of the acid Ac sharp. As a result, LER and photon shot noise can be improved and sensitivity can be increased.

For example, the resist material is ionized by the pattern exposure L1 to generate mainly polymer radicals ($RH^+\cdot$) and electrons ($e^-$). The polymer radical cations ($RH^+\cdot$) separate into radicals $P\cdot$ and cations ($RH(H^+)$) in the polymer (RH).

Thereafter, the electrons ($e^-$) react with the acid generator (PAG) to generate neutral molecules (RI), radicals ($R\cdot$), and anions ($X^-$). Furthermore, the cations ($RH(H^+)$) react with the anions ($X^-$) to generate a polymer (RH) and an acid (HX). Moreover, as a result of reaction between the sensitizer precursor (Pp) and the acid (HX), a sensitizer Ps is generated.

When the flood exposure L2 is performed next, the sensitizer (Ps) is excited. Electron transfer from the sensitizer (Ps) in the excited state to the acid generator (PAG) generates radical cations of the sensitizer Ps. Furthermore, an acid Ac having the same distribution as that of the sensitizer Ps can be efficiently generated in the resist layer 10 by the flood exposure L2. Moreover, a base Ba is generated from the base generator PBG (e.g., of non-ion type or ion type as described above) in the entirety of the resist layer 10 by the flood exposure L2. However, the acid Ac is generated more than the base Ba in the region 10a of the resist layer 10 and accordingly the base Ba is hardly present while the acid Ac is present in the region 10a. By contrast, in the region 10b, the amount of the acid Ac is small and accordingly the base Ba is present after neutralization between the acid Ac and the base Ba.

When the resist layer 10 is then developed, almost the region 10a can be almost entirely removed. The resist layer 10 may be formed into a specific pattern shape via the radicals as described above.

According to the resist pattern formation method of the present embodiment, the concentrations of the acid and the base increase although the ratio between value representing the acid Ac2 and the value representing the base Ba2 in the flood exposure L2 changes to be approximately the same as the ratio between value representing the acid Ac1 and value representing the base Ba1 in the pattern exposure L1. Therefore, production of defects resulting from random noise in the resist layer 10 can be prevented.

The ratio of value representing an acid to value representing a base in pattern exposure serves as an indicator of the width of a region in which an acid remains after neutralization between the acid and the base. In one example, a ratio C1 (=A1/B1) of a value A1 representing the acid Ac1 to a value B1 representing the base Ba1 in the pattern exposure L1 serves as an indicator of the width of a region in which an acid Ac remains after neutralization between the acid Ac1 and the base Ba1 after the pattern exposure L1. For example, the higher the peak concentration of the acid Ac1 relative to the concentration of the base Ba1 is (that is, the larger C1 is), the wider the width of the region in which the acid Ac remains after neutralization is. By contrast, the lower the peak concentration of the acid Ac1 relative to the concentration of the base Ba1 is (that is, the smaller C1 is), the narrower the width of the region in which the acid Ac remains after neutralization is.

Similarly, a ratio C2 (=A2/B2) of a value A2 representing the acid Ac2 to a value B2 representing the base Ba2 in the flood exposure L2 serves as an indicator of the width of a region in which an acid Ac remains after neutralization between the acid Ac2 and the base Ba2 after the flood exposure L2. For example, the higher the peak concentration of the acid Ac2 relative to the concentration of the base Ba2 is (that is, the larger C2 is), the wider the width of the region in which the acid Ac remains after neutralization is. By contrast, the lower the peak concentration of the acid Ac2 relative to the concentration of the base Ba2 is (that is, the smaller C2 is), the narrower the width of the region in which the acid Ac remains after neutralization is.

According to the resist pattern formation method of the present embodiment, although the ratio C2 in the flood exposure L2 is almost equal to the ratio C1 in the pattern exposure L1, the concentrations of the acid and the base increase in the flood exposure L2, with a result that production of defects resulting from random noise in the resist layer 10 can be prevented. Furthermore, according to the resist pattern formation method of the present embodiment, the trade-off relationship among sensitivity, resolution, and roughness performance of the resist layer 10 can be broken.

For example, according to the resist pattern formation method of the present embodiment, sensitivity and roughness performance of the resist layer 10 can be increased without involving a decrease in resolution of the resist layer 10. Specifically, when the amount of the generated base Ba is increased, an increase in amount of the generated acid Ac can increase sensitivity and roughness performance of the resist layer 10 without involving a decrease in resolution of the resist layer 10. In one example, when a ratio between the amount of a generated base Ba to the amount of a generated acid Ac after increases in the acid Ac and the base Ba is set approximately equal to a ratio between the amount of a generated base Ba to the amount of a generated acid Ac before the increases, sensitivity of the resist layer 10 can be increased without involving decreases in resolution and roughness performance of the resist layer 10.

For example, the amount of the generated acid Ac can be increased by increasing the amount of the acid generator PAG relative to the amount of the base resin R added to the resist layer 10 in a resist layer formation step. Alternatively, the amount of the generated acid Ac can be increased by increasing the amount of the sensitizer precursor Pp relative to the amount of the base resin R added to the resist layer 10.

When energy intensity (e.g., dose) of the beams of the pattern exposure L1 is increased in a pattern exposure step, the amount of the generated sensitizer Ps increases. This can increase the amount of the generated acid Ac. Alternatively or additionally, when the temperature of PEB after the pattern exposure L1 is increased, the amount of the generated sensitizer Ps increases. This can increase the amount of the generated acid Ac.

The amount of the generated acid Ac can be increased by increasing irradiation intensity of the beams of the flood exposure L2 in a flood exposure step. Alternatively or additionally, the amount of the generated acid Ac can be increased by increasing an exposure time of the flood exposure L2.

Furthermore, the amount of the generated base Ba can be increased by increasing the amount of the base generator PBG relative to the amount of the base resin R in the resist layer 10.

The amount of the generated base Ba can be increased by increasing irradiation intensity of the beams of the flood exposure L2 in the flood exposure step.

Alternatively or additionally, the amount of the generated base Ba can be increased by increasing the exposure time of the flood exposure L2.

By contrast, the amount of the generated acid Ac can be reduced for example by reducing the amount of the acid generator PAG relative to the amount of the base resin R added to the resist layer 10 in the resist layer formation step. Alternatively or additionally, the amount of the generated acid Ac can be reduced by reducing the amount of the sensitizer precursor Pp relative to the amount of the base resin R added to the resist layer 10.

When energy intensity (e.g., dose) of the beams of the pattern exposure L1 is reduced in the pattern exposure step, which decreases the amount of the generated sensitizer Ps, the amount of the generated acid Ac can be reduced. Alternatively or additionally, when the temperature of PEB after the pattern exposure L1 is reduced, which decreases the amount of the generated acid Ac, the amount of the generated sensitizer Ps can be reduced.

The amount of the generated acid Ac can be reduced by reducing irradiation intensity of the beams of the flood exposure L2 in the flood exposure step. Alternatively or additionally, the amount of the generated acid Ac can be reduced by reducing the exposure time of the flood exposure L2.

Furthermore, the amount of the generated base Ba can be reduced by reducing the content of the base generator PBG relative to the content of the base resin R in the resist layer 10 in the resist layer formation step.

Further, the amount of the generated base Ba can be reduced by reducing irradiation intensity of the beams of the flood exposure L2 in the flood exposure step. Moreover, the amount of the generated base Ba can be reduced by reducing the exposure time of the flood exposure L2.

Note that the amount of the generated acid Ac and the amount of the generated base Ba can be increased for example by increasing the exposure time of the flood exposure L2. Alternatively, the amount of the generated acid Ac and the amount of the generated base Ba can be reduced by reducing the exposure time of the flood exposure L2.

Description will be made next about change in concentration distribution of each component in the resist layer 10 in the resist pattern formation method of the present embodiment with reference to FIGS. 1A to 2E. FIGS. 2A to 2E are schematic diagrams illustrating concentration distributions of the acid Ac, the base Ba, and the sensitizer Ps each in the resist layer 10 in respective steps of the resist pattern formation method according to the present embodiment.

Figure 2A:
FIGS. 2A to 2E are schematic diagrams illustrating concentration distribution changes of components in a resist layer in the resist pattern formation method according to the embodiment.

FIG. 2A is a schematic diagram illustrating a concentration distribution DB1 of the base Ba1 before the pattern exposure L1. In the concentration distribution DB1, the initial concentration of the base Ba1 is substantially level.

Figure 2D:
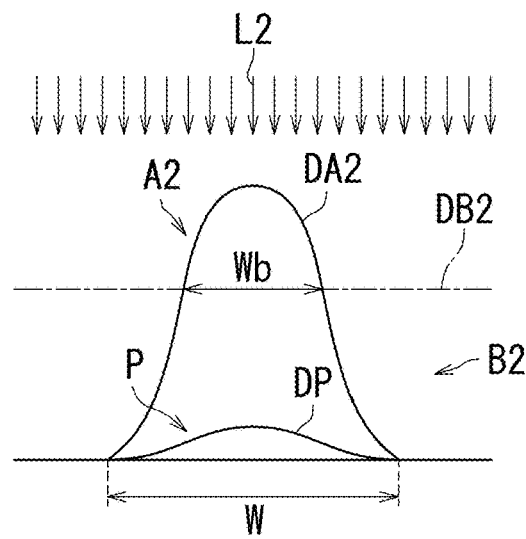
Figure 2B:
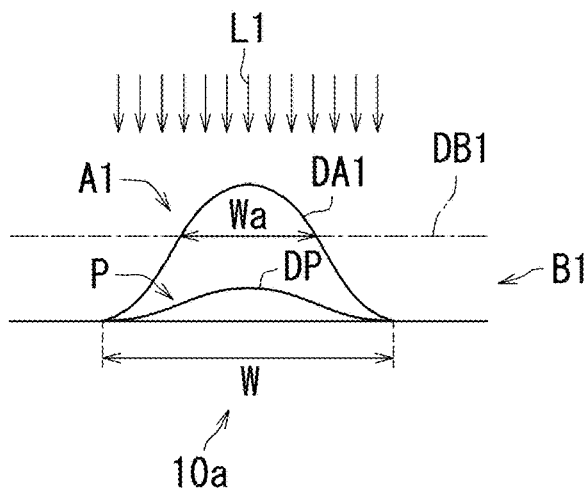

FIG. 2B is a schematic diagram illustrating a concentration distribution DA1 of an acid Ac generated by the pattern exposure L1 and a concentration distribution DP of a sensitizer Ps generated by the pattern exposure L1. FIG. 2B also illustrates the concentration distribution DB1 of the base Ba1 in combination.

As illustrated in FIG. 2B, when the pattern exposure L1 is performed, an acid Ac is generated from the acid generator PAG and a sensitizer Ps is generated from the sensitizer precursor Pp in the region 10a of the resist layer 10. In FIG. 2B, A1 represents a value representing the acid Ac1 in the pattern exposure L1. For example, A1 represents a value representing the acid Ac1 generated by the pattern exposure L1. B1 represents a value representing the base Ba1 in the pattern exposure L1. Furthermore, P represents a value representing the sensitizer Ps generated from the sensitizer precursor Pp in the pattern exposure L1.

Here, an acid Ac is generated and a sensitizer Ps is generated in the region 10a of the resist layer 10. As illustrated in FIG. 2B, the acid Ac is generated and the sensitizer Ps is generated across a width W of the region 10a. The concentration distribution DP of the sensitizer Ps and the concentration distribution DA1 of the acid Ac are formed according to a distribution of exposure energy of the beams of the pattern exposure L1.

In comparison between the concentration of the acid Ac and the concentration of the base Ba1, the concentration of the acid Ac is higher than the concentration of the base Ba1 in a range across a width Wa.

Note that the concentration of the base Ba1 is preferably lower than 0.9 times the peak concentration of the acid Ac1. Typically, the concentration of the base Ba1 is preferably equal to or lower than 0.5 times the peak concentration of the acid Ac1. However, resolution may be increased by approximating a ratio of the peak concentration of the acid Ac1 to the concentration of the base Ba1 to 1.

The value A1 representing the acid Ac in the pattern exposure L1 is higher than the value B1 representing the base Ba1 in the pattern exposure L1. Here, a ratio between the value A1 and the value B1 serves as an indicator of the width Wa of the region in which the concentration of the acid Ac is higher than the concentration of the base Ba1. The magnitude of the ratio C1 (=A1/B1) of the value A1 to the value B1 correlates with the size of the width Wa. The larger the value A1 representing the acid Ac1 relative to the value B1 representing the base Ba1 is (that is, the larger C1 is), the wider the width Wa of the region is. By contrast, the smaller the value A1 representing the acid Ac1 relative to the value B1 representing the base Ba1 is (that is, the smaller C1 is), the narrower the width Wa of the region is.

Figure 2E:
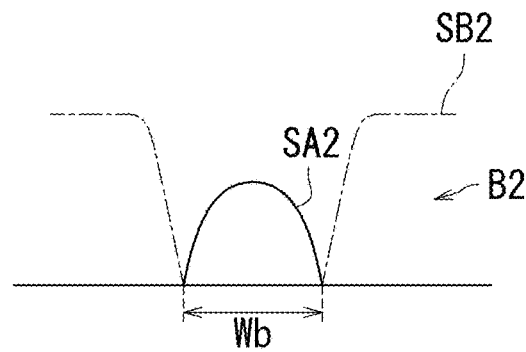
Figure 2C:
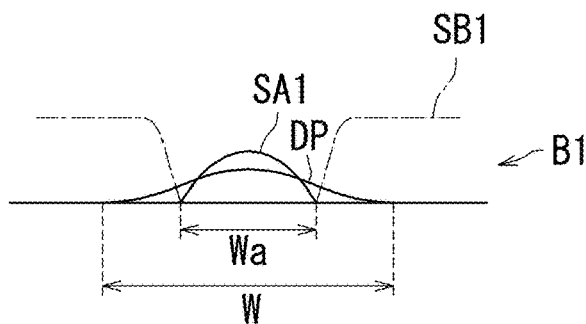

FIG. 2C is a schematic diagram illustrating a concentration distribution SA1 of an acid Ac and a concentration distribution SB1 of a base Ba each after neutralization between the base Ba1 and the acid Ac generated by the pattern exposure L1. The concentration distribution SA1 indicates concentration of an acid Ac remaining after neutralization, and the concentration distribution SB1 indicates a concentration of a base Ba remaining after neutralization. Note that FIG. 2C also illustrates the concentration distribution DP of the sensitizer Ps in combination.

As illustrated in FIG. 2C, the acid Ac generated by the pattern exposure L1 is neutralized with the base Ba1. As described above, the concentration of the acid Ac in FIG. 2B is higher than the concentration of the base Ba1 in the range across the width Wa. Therefore, the width Wa of a region in which an acid Ac remains after neutralization is narrower than the width W of the region 10a. The concentration distribution SA1 of the acid Ac exhibits a peak around the center of the region 10a. By contrast, the concentration distribution SB1 of the base Ba is level at a specific concentration in a range across the region 10b from ends of corresponding regions 10a.

Here, the resist layer 10 contains the base Ba1, and accordingly, the acid Ac and the base Ba1 react to be neutralized with each other. Therefore, the concentration distribution SA1 of the acid Ac is sharp as compared to a case where the base Ba1 is not contained.

Furthermore, an acid Ac generated in the region 10a may function as a catalyst and a sensitizer Ps may be generated from the sensitizer precursor Pp in presence of the acid Ac. In this case, the concentration of the sensitizer precursor Pp in the region 10a is lower than the concentration of the sensitizer precursor Pp in the region 10b. As described above, the concentration distribution SA1 of the acid Ac is sharp as compared to a case where the base Ba1 is not contained. Therefore, the concentration distribution of the sensitizer Ps generated in presence of the acid Ac may be sharp.

FIG. 2D is a schematic diagram illustrating a concentration distribution DA2 of an acid Ac generated by the flood exposure L2 and a concentration distribution DB2 of a base Ba2 generated by the flood exposure L2. Note that FIG. 2D also illustrates the concentration distribution DP of the sensitizer Ps in combination.

As illustrated in FIG. 2D, when the flood exposure L2 is performed, an acid Ac is generated from the acid generator PAG in presence of the sensitizer Ps. Also, a base Ba2 is generated from the base generator PBG by the flood exposure L2. In FIG. 2D, A2 indicates value representing the acid Ac2 in the flood exposure L2. The acid Ac2 is a sum of the acid Ac generated from the acid generator PAG by the pattern exposure L1 and remaining in the resist layer 10 and the acid Ac generated by the flood exposure L2. B2 represents a value representing the base Ba2 in the flood exposure L2. The base Ba2 is a sum of the base Ba remaining in the resist layer 10 after neutralization with the acid Ac in the pattern exposure L1 and the base Ba generated by the flood exposure L2.

In comparison between the peak concentration of the acid Ac2 and the concentration of the base Ba2, the peak concentration of the acid Ac2 is higher than the concentration of the base Ba2 in a range across a width Wb.

The value A2 representing the acid Ac2 in the flood exposure L2 is higher than the value B2 representing the base Ba2 in the flood exposure L2. Here, a ratio between the value A2 and the value B2 serves as an indicator of the width Wb of a region in which the concentration of the acid Ac is higher than the concentration of the base Ba2. For example, the magnitude of the ratio C2 (=A2/B2) of the value A2 to the value B2 correlates with the size of the width Wb. The larger the value A2 representing the acid Ac2 relative to the value B2 representing the base Ba2 is (that is, the larger C2 is), the wider the width Wb of the region is. By contrast, the smaller the value A2 representing the acid Ac2 relative to the value B2 representing the base Ba2 is (that is, the smaller C2 is), the narrower the width Wb of the region is.

Note that the width Wb of the region in which the concentration of the acid Ac2 is high in the flood exposure L2 may be wider or narrower than the width Wa of the region in which the concentration of the acid Ac1 is high in the pattern exposure L1. Alternatively, the width Wb may be equal to the width Wa.

FIG. 2E is a schematic diagram illustrating a concentration distribution SA2 of an acid Ac and a concentration distribution SB2 of a base Ba after neutralization between the acid Ac2 and the base Ba2 in the flood exposure L2. As described above, the concentration of the acid Ac2 is higher than the concentration of the base Ba2 in the range across the width Wb. Therefore, the width Wb of the region in which the acid Ac remains after neutralization is narrower than the width W.

According to the resist pattern formation method of the present embodiment, an acid Ac can be generated at a high concentration in the range across the width Wb of the resist layer 10. This can inhibit decreases in resolution and roughness performance while attaining high sensitivity.

Note that the amount of the acid Ac in the pattern exposure L1 can be measured by a known measuring method. Furthermore, the amount of the base Ba in the pattern exposure L1 is known. Moreover, the amount of the sensitizer Ps generated by the pattern exposure L1 can be measured by product analysis.

Moreover, the sensitizer Ps and the base generator PBG absorb the beams of the flood exposure L2 as described above. Therefore, the absorption spectrum of the sensitizer Ps overlaps with the absorption spectrum of the base generator PBG. Accordingly, the number of photons absorbed in the sensitizer Ps and the base generator PBG in the flood exposure L2 can be obtained based on the Beer-Lambert law and the number of the photons can be measured using a spectrophotometer. Furthermore, quantum yields of the sensitizer Ps and the base generator PBG are determined according to the types of respective compounds. Therefore, the amounts of the acid Ac and the base Ba each generated by flood exposure L2 can be determined according to the number of absorbed photons and the quantum yields.

When intensity of the beams of the pattern exposure L1 is changed, the amount of the sensitizer Ps can be easily changed for adjusting the ratio C1. Furthermore, when the wavelength of the beams of the flood exposure L2 is changed, the number of absorbed photons and the quantum yields can be changed for adjusting the ratio C2. In addition, the concentration of the base generator PBG may be changed for adjusting the ratio C2.

For comparison, description will be made next about a resist pattern formation method of comparative examples in which exposure intensity of the beams of the pattern exposure L1 and the base concentration are changed with reference to FIGS. 3A to 4D. FIGS. 3A to 3D are diagrams explaining change in concentration distribution of each component in a resist layer 10A after the pattern exposure L1 in a resist pattern formation method of Comparative Example 1. In Comparative Example 1, a relatively large amount of an acid Ac is generated from the acid generator PAG by increasing exposure intensity of the beams of the pattern exposure L1.

Figure 3A:
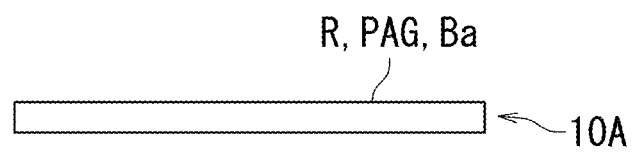
FIG. 3A is a schematic diagram illustrating a resist layer to be subjected to pattern exposure in a resist pattern formation method according to Comparative Example 1.

FIG. 3A is a schematic diagram illustrating the resist layer 10A on which the pattern exposure L1 is to be performed in the resist pattern formation method of Comparative Example 1. As illustrated in FIG. 3A, the resist layer 10A contains a base resin R, an acid generator PAG, and a base Ba. Here, the concentrations of the acid generator PAG and the base Ba in the resist layer 10A are approximately equal to the respective concentrations of the acid generator PAG and the base Ba1 described with reference to FIG. 2A to 2E.

Figure 3B:
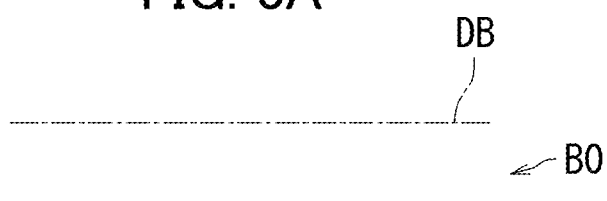
FIGS. 3B to 3D are schematic diagrams illustrating concentration distribution changes of components in a resist layer as a result of pattern exposure in Comparative Example 1.

FIG. 3B is a schematic diagram illustrating a concentration distribution DB of the base Ba before the pattern exposure L1. For example, a value B0 indicates a concentration of the base Ba. The concentration of the base Ba is substantially level at the value B0 in the concentration distribution DB.

Figure 3C:
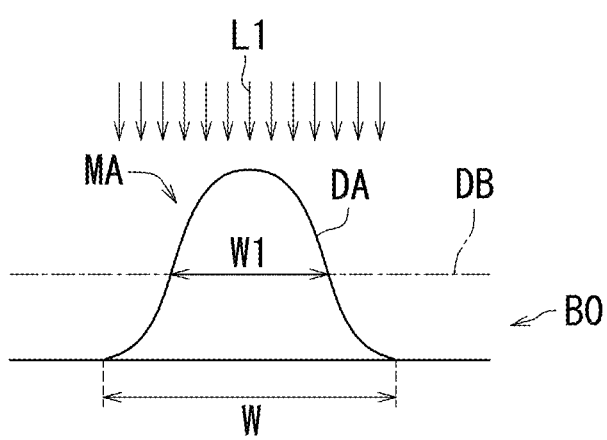

FIG. 3C is a schematic diagram illustrating a concentration distribution DA of an acid Ac generated by the pattern exposure L1. FIG. 3C also illustrates the concentration distribution DB of the base Ba in combination. As illustrated in FIG. 3C, when the pattern exposure L1 is performed, an acid Ac is generated from the acid generator PAG. A width W represents a width of regions 10a of the resist layer 10A.

In FIG. 3C, MA indicates value representing the acid Ac generated from the acid generator PAG in the pattern exposure L1. B0 indicates a value representing the base Ba in the pattern exposure L1.

Here, an acid Ac is generated in each region 10a of the resist layer 10. As illustrated in FIG. 3C, an acid Ac is generated across a width W of the region 10a. The concentration distribution DA of the acid Ac is formed according to exposure energy distribution in the pattern exposure L1.

The peak concentration of the acid Ac in the pattern exposure L1 is quite higher than the concentration of the base Ba. In comparison between the peak concentration of the acid Ac and the concentration of the base Ba, the peak concentration of the acid Ac is higher than the concentration of the base Ba in a range across a width W1. As such, the width W1 in FIG. 3C is wider than the width Wa in FIG. 2B.

Figure 3D:
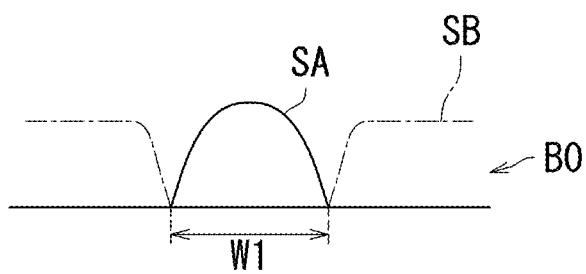

FIG. 3D is a schematic diagram illustrating a concentration distribution SA of an acid Ac and a concentration distribution SB of the base Ba after neutralization between the base Ba and the acid Ac each generated by the pattern exposure L1. As illustrated in FIG. 3D, the acid Ac is neutralized with the base Ba after the pattern exposure L1. As described above, the peak concentration of the acid Ac is higher than the concentration of the base Ba in the range across the width W1. The width W1 of a region in which an acid Ac remains after neutralization is accordingly narrower than the width W of the region 10a.

The acid Ac remaining after neutralization in FIG. 3D is larger in amount than the acid Ac remaining after neutralization in FIG. 2C. This is because a value MA representing the acid Ac in the pattern exposure L1 in FIG. 3C is larger than the value A1 representing the acid Ac in the pattern exposure L1 in FIG. 2B.

However, the width W1 in FIG. 3D is wider than the width Wa in FIG. 2C. This is because the value MA representing the acid Ac in the pattern exposure L1 in FIG. 3B is larger than the value A1 representing the acid Ac in the pattern exposure L1 in FIG. 2B.

According to the resist pattern formation method of Comparative Example 1, sensitivity in a resist reaction is increased by generating a large amount of an acid Ac through an increase in intensity of the beams of the pattern exposure L1. However, the amount of the acid Ac is large relative to the amount of the base Ba, and accordingly, the width W1 of the region in which an acid Ac remains after the pattern exposure L1 becomes wide. This may invite decreases in resolution and line width roughness performance in a resist reaction.

By contrast, it is thought to increase the amount of the base Ba in order to inhibit a decrease in resolution.

FIGS. 4A to 4D are diagrams explaining change in concentration distribution of each component in a resist layer 10B after the pattern exposure L1 in a resist pattern formation method of Comparative Example 2. In Comparative Example 2, the concentration of the base Ba is increased.

Figure 4A:
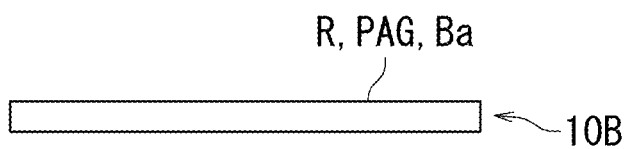
FIG. 4A is a schematic diagram illustrating a resist layer to be subjected to pattern exposure in a resist pattern formation method according to Comparative Example 2.

FIG. 4A is a schematic diagram illustrating the resist layer 10B on which the pattern exposure L1 is to be performed in the resist pattern formation method of Comparative Example 2. As illustrated in FIG. 4A, the resist layer 10B contains a base resin R, an acid generator PAG, and a base Ba. Here, the concentration of the acid generator PAG is approximately equal to the concentration of the acid generator PAG described with reference to FIGS. 2A to 2E while the concentration of the base Ba is higher than the concentration of the base Ba described with reference to FIGS. 2A to 2E.

Figure 4B:
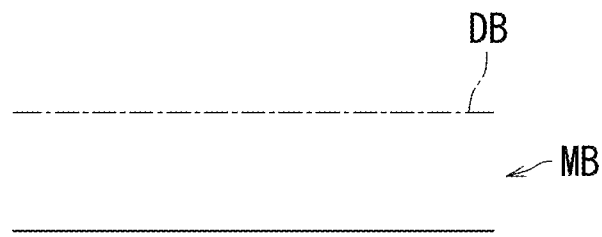
FIGS. 4B to 4D are schematic diagrams illustrating concentration distribution changes of components in a resist layer as a result of pattern exposure in Comparative Example 2.

FIG. 4B is a schematic diagram illustrating a concentration distribution DB of the base Ba before the pattern exposure L1. For example, a value MB indicates a concentration of the base Ba. The concentration of the base Ba is substantially level at the value MB in the concentration distribution DB. However, the concentration of the base Ba is relatively high in the resist layer 10B.

Figure 4C:
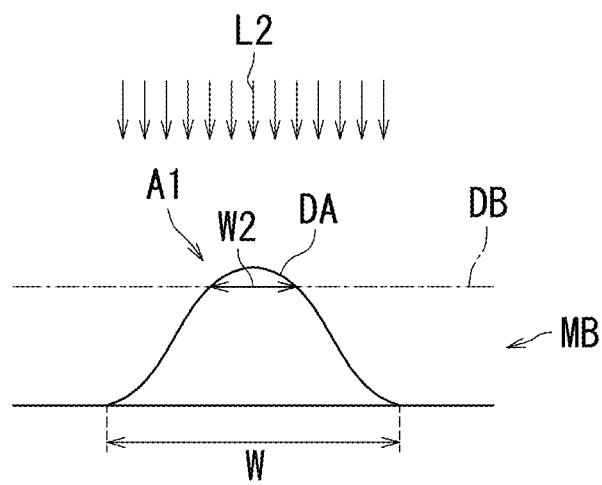

FIG. 4C is a schematic diagram illustrating a concentration distribution DA of an acid Ac generated by the pattern exposure L1. FIG. 4C also illustrates the concentration distribution DB of the base Ba in combination. As illustrated in FIG. 4C, an acid Ac is generated from the acid generator PAG when the pattern exposure L1 is performed. A width W represents a width of regions 10a of the resist layer 10B. In FIG. 4C, A1 indicates a value representing an acid Ac1 generated from the acid generator PAG in the pattern exposure L1. MB indicates a value representing the base Ba in the pattern exposure L1.

As illustrated in FIG. 4C, an acid Ac is generated across a width W of each region 10a. The concentration distribution DA of the acid Ac is formed according to an exposure energy distribution of the beams of the pattern exposure L1.

In comparison between the peak concentration of the acid Ac and the concentration of the base Ba, the peak concentration of the acid Ac is slightly higher than the concentration of the base Ba in a range across a width W2. Note that the width W2 in FIG. 4C is narrower than the width Wa in FIG. 2B.

Figure 4D:
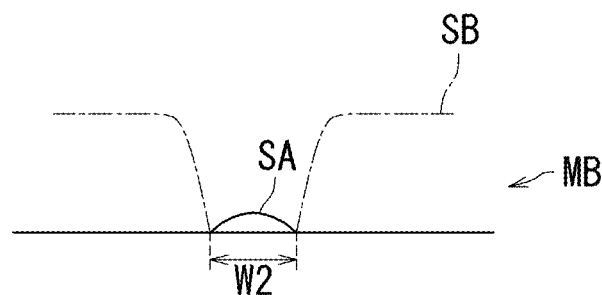

FIG. 4D is a schematic diagram illustrating a concentration distribution SA of an acid Ac and a concentration distribution SB of a base Ba after neutralization between the base Ba and the acid Ac each generated by the pattern exposure L1. As illustrated in FIG. 4C, the acid Ac is neutralized with the base Ba after the pattern exposure L1. As described above, the peak concentration of the acid Ac is higher than the concentration of the base Ba in the range across the width W2. The width W2 of the region in which an acid Ac remains after neutralization is accordingly narrower than the width W of the region 10a.

The width W2 in FIG. 4D is narrower than the width Wa in FIG. 2C. This is because the concentration of the base Ba illustrated in FIG. 4D is higher than the concentration of the base Ba illustrated in FIG. 2C.

However, the acid Ac remaining after neutralization in FIG. 4D is smaller in amount than the acid Ac remaining after neutralization in FIG. 2C. This is because the concentration of the base Ba in FIG. 4C is higher than the concentration of the base Ba in FIG. 2B.

According to the resist pattern formation method of Comparative Example 2, in which the concentration of the base Ba is increased, the width W2 of the region in which the acid Ac remains after the pattern exposure L1 can be narrowed to increase resolution and line width roughness performance in a resist reaction. According to the resist pattern formation method of Comparative Example 2, however, the amount of the remaining acid Ac is small, which may involve a decrease in sensitivity in a resist reaction.

As described above, the resist pattern formation method of Comparative Example 1 increases intensity of the beams of the pattern exposure L1 to increase the amount of a generated acid Ac, thereby increasing sensitivity in a resist reaction. However, the amount of the base Ba is small relative to the amount of the acid Ac, which widens an acid remaining region. This may invite decreases in resolution and line width roughness performance. By contrast, the resist pattern formation method of Comparative Example 2 increases strength of the base Ba to narrow the region in which an acid Ac remains. This can increase resolution and line width roughness performance. However, the amount of the remaining acid Ac is small, which may invite a decrease in sensitivity in a resist reaction.

By contrast, the resist pattern formation method of the present embodiment can narrow the acid remaining region and increase the amount of the remaining acid Ac relative to the concentration of the base Ba by the pattern exposure L1 and the flood exposure L2. Thus, decreases in resolution and line width roughness performance can be inhibited while sensitivity in a resist reaction can be maintained high.

Note that the value A1 representing the acid Ac1 and the value B1 representing the base Ba1 in the pattern exposure L1 may each be expressed in terms of concentration, and the value A2 representing the acid Ac2 and the value B2 representing the base Ba2 in the flood exposure L2 may each be expressed in terms of concentration. For example, the value A1 indicates a peak concentration of an acid Ac generated from the acid generator PAG in the pattern exposure L1. Also, the value B1 indicates an amount of the base Ba contained in advance in the resist layer 10. Furthermore, the value A2 indicates a peak concentration of a sum of an acid Ac remaining after neutralization between the acid Ac1 and the base Ba1 in the pattern exposure L1 and an acid Ac generated from the acid generator PAG by the flood exposure L2. Also, the value B2 indicates a concentration of a base Ba generated from the base generator PBG by the flood exposure L2. The values A1, A2, B1, and B2 may each indicate a concentration of an acid Ac or a concentration of a base Ba as described above.

Alternatively, the value A1 representing the acid Ac1 and the value B1 representing the base Ba1 in the pattern exposure L1 may respectively indicate an amount of the acid Ac1 and the amount of the base Ba1 in a specific region of the resist layer 10, and the value A2 representing the acid Ac2 and the value B2 representing the base Ba2 in the flood exposure L2 may respectively indicate an amount of the acid Ac2 and an amount of the base Ba2 in the specific region of the resist layer 10. For example, the value A1 indicates an amount of an acid generated from the acid generator PAG in an acid remaining region in which an acid remains after neutralization between the acid Ac and the base Ba in the pattern exposure L1. The value B1 indicates an amount of a base Ba in the acid remaining region that is contained in the resist layer 10 in formation of the resist layer 10. Furthermore, the value A2 indicates a sum of the amount of an acid Ac remaining in the acid remaining region after neutralization between the acid Ac and the base Ba in the flood exposure L2 and the amount of an acid Ac generated from the acid generator PAG in the acid remaining region by the flood exposure L2. The value B2 indicates the amount of a base Ba generated from the base generator PBG in the acid remaining region by the flood exposure L2. The values A1, A2, B1, and B2 may each indicate an amount of an acid Ac or an amount of a base Ba in the specific region of the resist layer 10 as described above.

Description will be made next about change in concentration distribution of each components in the resist layer 10 in the resist pattern formation method of the present embodiment with reference to FIGS. 5A to 5E. FIGS. 5A to 5E are schematic diagrams illustrating concentration distributions of the components in the resist layer 10 in the resist pattern formation method of the present embodiment. Here, the values A1, A2, B1, and B2 each represent a concentration of an acid Ac or a concentration of a base Ba.

Figure 5A:
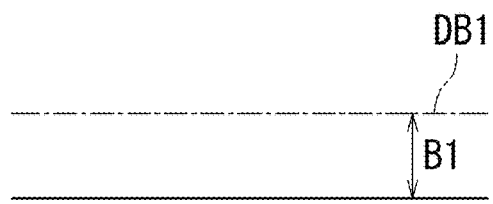
FIGS. 5A to 5E are schematic diagrams illustrating concentration distribution changes of the components in the resist layer in the resist pattern formation method according to the embodiment.

FIG. 5A is a schematic diagram illustrating a concentration distribution DB1 of the base Ba1 before the pattern exposure L1. As illustrated in FIG. 5A, the concentration of the base Ba1 is indicated by the value B1. In the concentration distribution DB1, the value B1 indicating the initial concentration of the base Ba1 is substantially level.

Figure 5B:
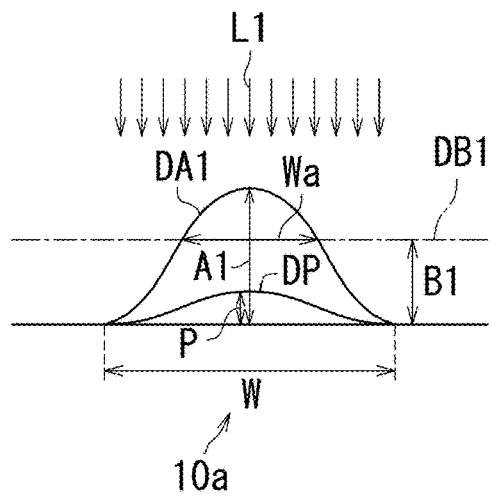

FIG. 5B is a schematic diagram illustrating a concentration distribution DA1 of an acid Ac and a concentration distribution DP of a sensitizer Ps each generated by the pattern exposure L1. FIG. 5B also illustrates the concentration distribution DB1 of the base Ba1 in combination.

As illustrated in FIG. 5B, when the pattern exposure L1 is performed, an acid Ac is generated from the acid generator PAG and a sensitizer Ps is generated from the sensitizer precursor Pp in the region 10a of the resist layer 10. In FIG. 5B, A1 represents a value indicating a peak concentration of the acid Ac1 in the pattern exposure L1. For example, A1 represents a value indicating a peak concentration of the acid Ac1 generated by the pattern exposure L1. B1 indicates a concentration of the base Ba1 in the pattern exposure L1. Also, P represents a value indicating a peak concentration of the sensitizer Ps generated from the sensitizer precursor Pp by the pattern exposure L1.

Here, an acid Ac is generated and a sensitizer Ps is generated in the region 10a of the resist layer 10. As illustrated in FIG. 5B, a sensitizer Ps is generated and an acid Ac is generated across the width W of the region 10a. The concentration distribution DP of the sensitizer Ps and the concentration distribution DA1 of the acid Ac are formed according to an exposure energy distribution of the beams of the pattern exposure L1.

The peak concentration of the acid Ac in the pattern exposure L1 is higher than the concentration of the base Ba1 in the pattern exposure L1. In comparison between the peak concentration of the acid Ac and the concentration of the base Ba1, the peak concentration of the acid Ac is higher than the concentration of the base Ba in the range across the width Wa.

Figure 5C:
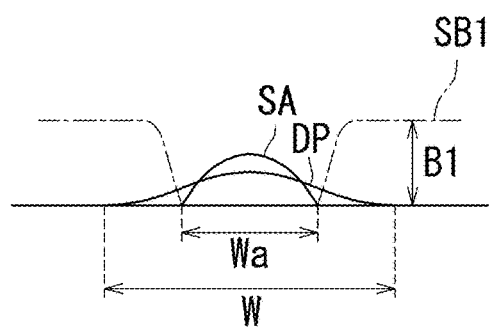

FIG. 5C is a schematic diagram illustrating a concentration distribution SA1 of an acid Ac and a concentration distribution SB1 of a base Ba after neutralization between the acid Ac1 and the base Ba1 in the pattern exposure L1. The concentration distribution SA1 indicates concentration of an acid Ac remaining after neutralization, and the concentration distribution SB1 indicates a concentration of the base Ba remaining after neutralization. Note that FIG. 5C also illustrates the concentration distribution DP of the sensitizer Ps in combination.

As illustrated in FIG. 5C, the acid Ac generated by the pattern exposure L1 is neutralized with the base Ba1. As described above, the concentration of the acid Ac is higher than the concentration of the base Ba1 within the range across the width W2. The width Wa of a region in which the acid Ac remains after neutralization is narrower than the width W of the region 10a. The concentration distribution SA1 of the acid Ac accordingly exhibits a peak around the center of the region 10a. By contrast, the concentration distribution SB1 of the base Ba exhibits a peak in a range across the region 10b from ends of corresponding regions 10a.

Figure 5D:
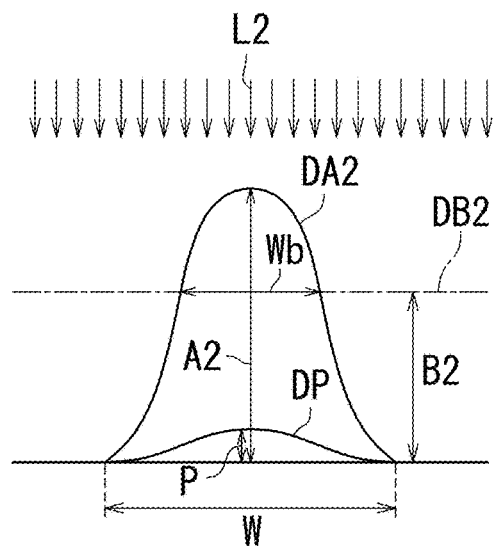

FIG. 5D is a schematic diagram illustrating a concentration distribution DA2 of an acid Ac and a concentration distribution DB2 of a base Ba2 each generated by the flood exposure L2. Note that FIG. 5D also illustrates the concentration distribution DP of the sensitizer Ps in combination.

As illustrated in FIG. 5D, when the flood exposure L2 is performed, an acid Ac is generated from the acid generator PAG in presence of the sensitizer Ps. Furthermore, a base Ba2 is generated from the base generator PBG by the flood exposure L2. In FIG. 5D, A2 indicates a peak concentration of the acid Ac2 in the flood exposure L2. The acid Ac2 is a sum of an acid Ac remaining in the resist layer 10 as a result of neutralization with the base Ba after the base Ba is generated from the base generator PBG by the pattern exposure L1 and an acid Ac generated by the flood exposure L2.

B2 indicates a concentration of the base Ba2 in the flood exposure L2. The base Ba2 is a base Ba generated by the flood exposure L2.

The pack concentration of the acid Ac2 in the flood exposure L2 is higher than the concentration of the base Ba2. In comparison between the peak concentration of the acid Ac2 and the concentration of the base Ba2, the peak concentration of the acid Ac2 is higher than the concentration of the base Ba2 in the range across the width Wb.

Note that the width of a region in which the concentration of the acid Ac2 is high in the flood exposure L2 may be wider or narrower than the width Wa of a region in which the concentration of the acid Ac1 is high in the pattern exposure L1. Alternatively, the width Wb may be equal to the width Wa.

Figure 5E:
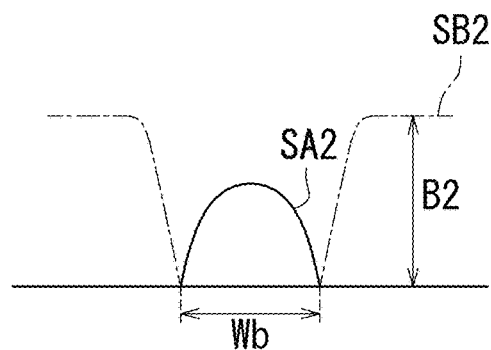

FIG. 5E is a schematic diagram illustrating a concentration distribution SA2 of an acid Ac after neutralization between the acid Ac2 and the base Ba2 in the flood exposure L2 and a concentration distribution SB2 of a base Ba after neutralization therebetween. As described above, the peak concentration of the acid Ac2 is higher than the concentration of the base Ba2 in the range across the width Wb. As such, the width Wb of a region in which the acid Ac remains after neutralization is narrower than the width W.

According to the resist pattern formation method of the present embodiment, an acid Ac can be generated at a high concentration within the range across the width Wb of the resist layer 10. This can inhibit decreases in resolution and roughness performance while attaining high sensitivity.

Note that although the values A1, A2, B1, and B2 each represent a concentration of an Ac or a concentration of a base in the above description with reference to FIGS. 5A to 5E, the present embodiment is not limited to this. The values A1, A2, B1, and B2 may each represent an amount of the acid Ac or an amount of the base Ba in a specific region of the resist layer 10.

Description will be made next about change in a concentration distribution of each component in the resist layer 10 in the resist pattern formation method according to the present embodiment with reference to FIGS. 6A to 6E. FIGS. 6A to 6E are schematic diagrams illustrating concentration distributions of the components in the resist layer 10 in the resist pattern formation method of the present embodiment. Here, the values A1, A2, B1, and B2 each represent an amount of an acid Ac or an amount of a base Ba.

Figure 6A:
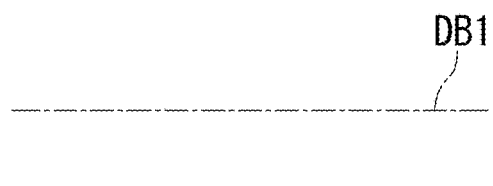
FIGS. 6A to 6E are schematic diagrams illustrating concentration distribution changes of the components in the resist layer in the resist pattern formation method according to the embodiment.

FIG. 6A is a schematic diagram illustrating a concentration distribution DB1 of the base Ba1 before the pattern exposure L1. As illustrated in FIG. 6A, the resist layer 10 contains the base Ba1. In the concentration distribution DB1, the initial concentration of the base Ba1 is substantially level.

Figure 6D:
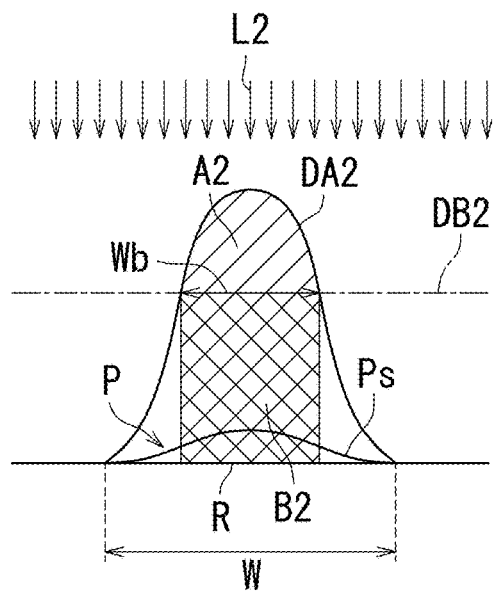
Figure 6B:
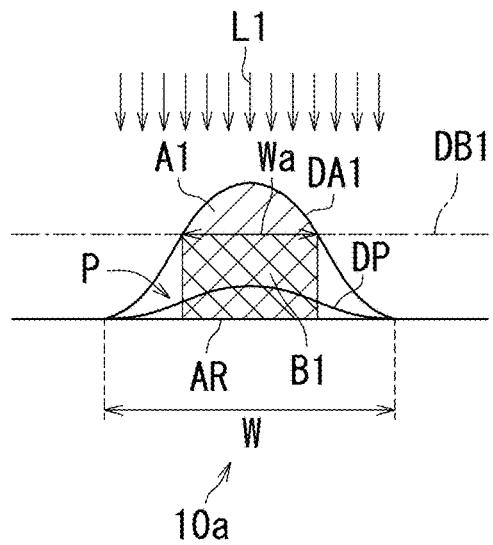

FIG. 6B is a schematic diagram illustrating a concentration distribution DA1 of an acid Ac generated by the pattern exposure L1 and a concentration distribution DP of a sensitizer Ps generated by the pattern exposure L1. FIG. 6B also illustrates the concentration distribution DB1 of the base Ba1 in combination.

As illustrated in FIG. 6B, when the pattern exposure L1 is performed, an acid Ac is generated from the acid generator PAG and a sensitizer Ps is generated from the sensitizer precursor Pp in the region 10a of the resist layer 10. The concentration of the acid Ac1 is higher than the concentration of the base Ba1 in a range across the width Wa. Therefore, an acid Ac remains in a region AR defined by the width Wa after neutralization between the acid Ac1 and the base Ba1 in the pattern exposure L1. In the present description, the region AR in which the acid Ac remains after neutralization may be referred to as an acid remaining region.

In FIG. 6B, A1 indicates an amount of an acid Ac in the region AR out of the acid Ac1 in the pattern exposure L1. For example, A1 indicates an amount of an acid Ac generated in the region AR out of the acid Ac1 generated by the pattern exposure L1. B1 indicates an amount of the base Ba1 in the region AR. Furthermore, P indicates an amount of a sensitizer Ps in the region AR out of the sensitizer Ps generated from the sensitizer precursor Pp by the pattern exposure L1.

Here, an acid Ac is generated and a sensitizer Ps is generated in the region 10a of the resist layer 10. As illustrated in FIG. 6B, the sensitizer Ps is generated and the acid Ac is generated across the width W of the region 10a. The concentration distribution DP of the sensitizer Ps and the concentration distribution DA1 of the acid Ac are formed according to an exposure energy distribution of the beams of the pattern exposure L1.

The amount of the acid Ac in the region AR in the pattern exposure L1 is larger than the amount of the base Ba1 in the region AR in the pattern exposure L1. Therefore, in comparison between the value A1 indicating the amount of the acid Ac and the amount of the base Ba1, the amount of the acid Ac is larger than the amount of the base Ba in the range across the width Wa.

Figure 6E:
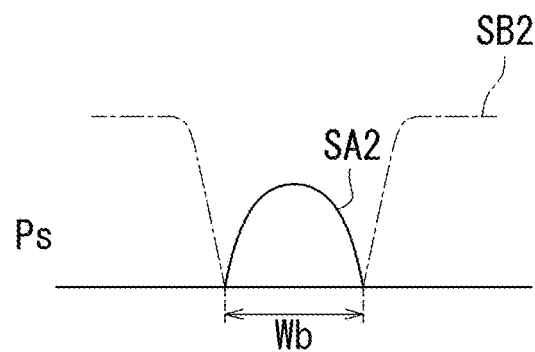
Figure 6C:
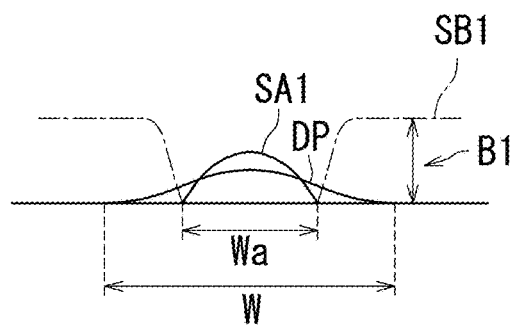

FIG. 6C is a schematic diagram illustrating a concentration distribution SA1 of an acid Ac and a concentration distribution SB1 of a base Ba after neutralization between the acid Ac generated by the pattern exposure L1 and the base Ba1. The concentration distribution SA1 indicates concentration of the acid Ac remaining after neutralization, and the concentration distribution SB1 indicates a concentration of the base Ba remaining after neutralization. Note that FIG. 6C also illustrates the concentration distribution DP of the sensitizer Ps in combination.

As illustrated in FIG. 6C, the acid Ac generated by the pattern exposure L1 is neutralized with the base Ba1. As described above, the value A1 representing the acid Ac in the concentration distribution DA1 is larger in the range across the width Wa than the value B1 representing the base Ba1 in the concentration distribution DB1. The width Wa of the region in which an acid Ac remains after neutralization is narrower than the width W of the region 10a. The concentration distribution SA1 of the acid Ac exhibits a peak at around the center of the region 10a. By contrast, the concentration distribution SB1 of the base Ba exhibits a peak in a range across the region 10b from ends of corresponding regions 10a.

FIG. 6D is a schematic diagram illustrating a concentration distribution DA2 of an acid Ac and a concentration distribution DB2 of a base Ba2 each generated by the flood exposure L2. Note that FIG. 6D also illustrates the concentration distribution DP of the sensitizer Ps in combination.

As illustrated in FIG. 6D, when the flood exposure L2 is performed, an acid Ac is generated from the acid generator PAG in presence of the sensitizer Ps. Also, a base Ba2 is generated from the base generator PBG by the flood exposure L2. In FIG. 6D, A2 indicates an amount of an acid Ac in the region AR out of the acid Ac2 in the flood exposure L2. The acid Ac2 is a sum of an acid Ac remaining in the resist layer 10 as a result of neutralization with the base Ba after generation from the acid generator PAG by the pattern exposure L1 and the acid Ac generated from the acid generator PAG by the flood exposure L2.

B2 indicates an amount of a base Ba in the region AR out of the base Ba2 in the flood exposure L2. The base Ba2 is a sum of a base Ba remaining in the resist layer 10 as a result of neutralization with the acid Ac in the pattern exposure L1 and a base Ba generated from the base generator PBG by the flood exposure L2.

The amount of the acid Ac in the region AR in the flood exposure L2 is larger than the amount of the base Ba2 in the region AR in the flood exposure L2. As such, the value A2 is larger than the value B2.

FIG. 6E is a schematic diagram illustrating a concentration distribution SA2 of an acid Ac and a concentration distribution SB2 of a base Ba after neutralization between the acid Ac2 and the base Ba2 in the flood exposure L2. As described above, the amount of the acid Ac2 in the region AR is larger than the amount of the base Ba2 in the region AR. However, the width Wb of the region in which the acid Ac remains after neutralization is narrower than the width W in the concentration distribution SA2.

According to the resist pattern formation method of the present embodiment, an acid Ac can be generated at a high concentration within the range across the width Wb of the resist layer 10. This can inhibit decreases in resolution and roughness performance while attaining high sensitivity.

Typically, lines and spaces are alternately formed at a specific pitch in a repeated manner in a semiconductor substrate. The lines or the spaces correspond to high-dose regions in the pattern exposure L1, and the others of the lines and the spaces correspond to low-dose regions in the pattern exposure L1.

Figure 7A:
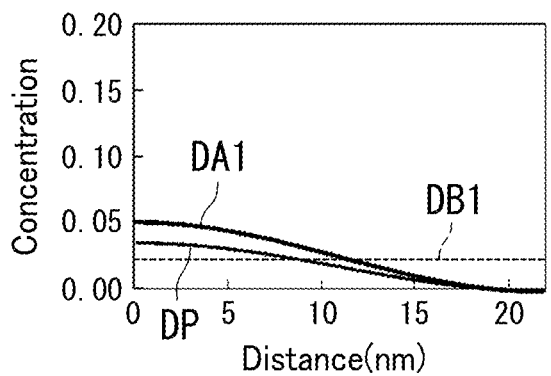
FIG. 7A is a schematic diagram illustrating a concentration distribution of an acid, a concentration distribution of a sensitizer, and a concentration distribution of a base each in the resist layer in pattern exposure.
Figure 7B:
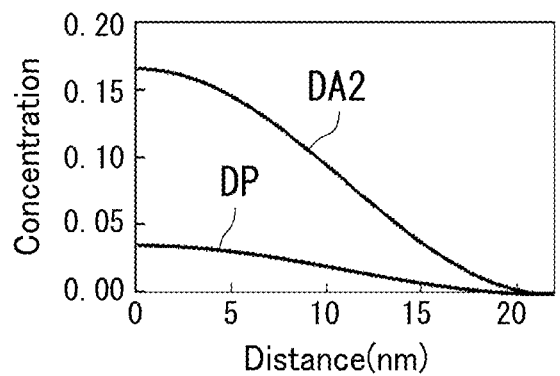
FIG. 7B is a schematic diagram illustrating a concentration distribution of an acid and a concentration distribution of a sensitizer each in the resist layer in flood exposure.
Figure 7C:
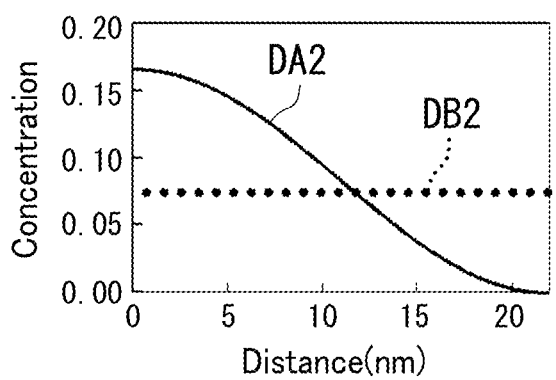
FIG. 7C is a schematic diagram illustrating the concentration distribution of the acid and a concentration distribution of a base each in the resist layer in the flood exposure.
Figure 7D:
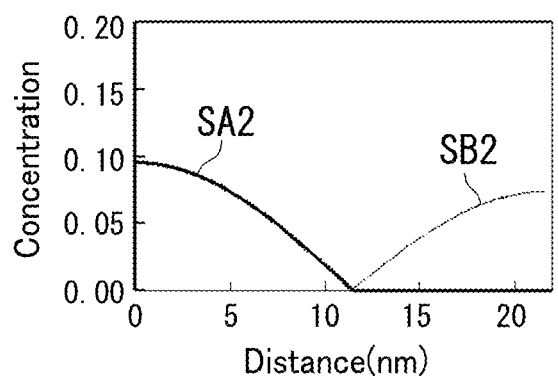
FIGS. 7D and E are schematic diagrams illustrating a concentration distribution of an acid and a concentration distribution of a base each remaining after neutralization between the acid and the base in the resist layer in the flood exposure.
Figure 7E:
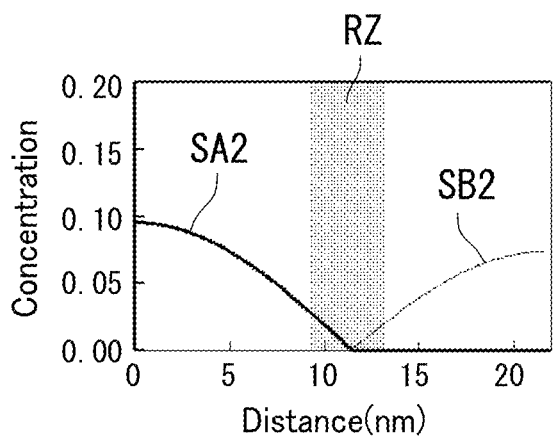
FIG. 7F is a schematic diagram illustrating concentration distributions of protective groups of a base resin after heat treatment.
Figure 7F:
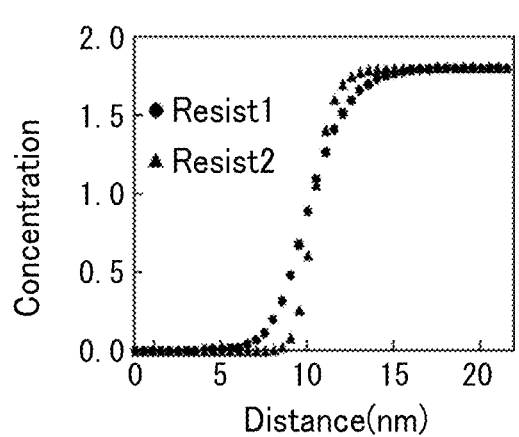

Next, the resist pattern formation method according to the present embodiment will be described with reference to FIGS. 1A to 1E and FIGS. 7A to 7F. FIG. 7A is a schematic diagram illustrating a concentration distribution DA1 of an acid Ac, a concentration distribution DP of a sensitizer Ps, and a concentration distribution DB1 of a base Ba each in the resist layer 10 in the pattern exposure L1. FIG. 7B is a schematic diagram illustrating a concentration distribution DA2 of an acid Ac and a concentration distribution DP of a sensitizer Ps each in the resist layer 10 in the flood exposure L2. FIG. 7C is a schematic diagram illustrating a concentration distribution DA2 of an acid Ac and a concentration distribution DB2 of a base Ba each in the resist layer 10 in the flood exposure L2. FIGS. 7D and 7E are schematic diagrams each illustrating a concentration distribution SA2 of an acid Ac and a concentration distribution SB2 of a base Ba each remaining as a result of neutralization between the acid Ac and the base Ba in the resist layer 10 in the flood exposure L2. FIG. 7F is a schematic diagram illustrating concentration distributions of protecting groups after heat treatment. Typically, the resist pattern formation method of the present embodiment is implemented in an ambient environment stabilized in a clean atmosphere.

First as illustrated in FIG. 1A, a resist layer 10 is formed on a substrate S. For example, the resist layer 10 is formed in a manner in which a resist material dissolved in a solution is applied onto a prepared substrate S (e.g., a wafer) and then prebaked. Typically, a target for photolithography (e.g., a semiconductor layer or an insulating layer) has been formed on the surface of the substrate S.

The resist layer 10 contains a base resin R, a sensitizer precursor Pp, an acid generator PAG, a base Ba, and a base generator PBG. Note that the resist layer 10 may be formed directly on the substrate S or on an undercoat layer formed on the substrate S.

For example, the base resin R is a phenolic resin. Dis-disdissolution characteristics of the phenolic resin are highly activated by a polarity conversion reaction through an acid catalyst reaction. A reaction that generates a sensitizer Ps from the sensitizer precursor Pp is a low-active acid catalyst reaction.

Next, the pattern exposure L1 is performed on the resist layer 10 as illustrated in FIG. 1B. The beams of the pattern exposure L1 are radiated on the regions 10a of the resist layer 10 at a high dose while being radiated on the regions 10b of the resist layer 10 at a low dose. In FIG. 1B, arrows indicating the beams of the pattern exposure L1 are schematically drawn over each region 10a that are to be irradiated at a high dose. Note that the left side on the horizontal axis in each of FIGS. 7A to 7F indicates the center of the region 10a and corresponds to a region irradiated at a high dose with the beams of the pattern exposure L1. On the other hand, the right side on the horizontal axis indicates the center of each region 10b and corresponds to a region irradiated at a low dose with the beams of the pattern exposure L1.

The pattern exposure L1 supplies energy to the regions 10a and 10b of the resist layer 10. In a case where fine patterning is necessary in the pattern exposure L1 for attaining a high resolution, an energy intensity distribution is formed into a shape similar to an initial acid distribution or an initial sensitizer distribution in FIG. 7A. The energy supplied to the resist layer 10 excites or ionizes the composition of the resist layer 10 to create an active state, thereby generating a sensitizer Ps from the sensitizer precursor Pp in the resist layer 10.

FIG. 7A illustrates a concentration distribution DP of a sensitizer Ps and a concentration distribution DA1 of an acid Ac each generated at a location between the center of the region 10a and the center of the region 10b in FIGS. 1B to 1E by the pattern exposure L1. The horizontal axis in FIG. 7A indicates distance from the center of the region 10a in FIGS. 1B to 1E. Here, a distance between the center of the region 10a and the center of the region 10b is approximately 22 nm. Furthermore, a sensitizer Ps is generated and an acid Ac is generated from the acid generator PAG by the pattern exposure L1 herein. For example, the sensitizer Ps and the acid Ac are generated in the respective distributions as illustrated in FIG. 7A in a region between the center of the region 10a and the center of the region 10b. Except for the level of each concentration, the concentration distribution DA1 of the acid Ac is almost the same as the concentration distribution DP of the sensitizer Ps. Note that the resist layer 10 before the pattern exposure L1 contains a base Ba (initial base Ba1) as illustrated in FIG. 7A. In this case, the concentration distribution DB1 of the base Ba1 is at a specific value regardless of the location.

Note that the resist layer 10 may be left to stand at room temperature after the pattern exposure L1 so as not to cause acid diffusion. Alternatively, the resist layer 10 may be subjected to PEB at a temperature lower than the glass transition temperature (Tg) of the base resin.

Thereafter, the flood exposure L2 is performed on the resist layer 10 as illustrated in FIG. 1C. The flood exposure L2 supplies energy to the entirety of the resist layer 10 in which the sensitizer Ps has been generated. When energy is supplied, an acid Ac is generated from the acid generator PAG as illustrated in FIG. 7B.

FIG. 7B illustrates a concentration distribution DA2 of an acid Ac generated from the acid generator PAG in the resist layer 10. When energy is supplied to the resist layer 10 by the flood exposure L2, an acid Ac is generated from the acid generator PAG as illustrated in FIG. 7B. As will be described later, when energy is supplied by the flood exposure L2, a base Ba is generated from the base generator PBG and the generated base Ba is consumed as a result of neutralization with the acid Ac generated from the acid generator PAG. The concentration distribution DA2 in FIG. 7B indicates concentration of the acid Ac generated from the acid generator PAG in a state in which the base Ba does not participate.

Furthermore, a base Ba is generated from the base generator PBG in the entirety of the resist layer 10 by the flood exposure L2 as illustrated in FIG. 1C. FIG. 7C illustrates a concentration distribution DB2 of the base Ba generated from base generator PBG in the resist layer 10. Once the base Ba is generated from the base generator PBG by the flood exposure L2, the concentration distribution DB2 of the base Ba is level at a specific value regardless of the location as illustrated in FIG. 7C. Note that the resist layer 10 contains a base (initial base) before the pattern exposure L1 as described above, and therefore, the concentration distribution DB2 of the base Ba indicates a sum of the initial base Ba1 and the base Ba generated from the base generator PBG by the flood exposure L2. Note that the ratio (C2) of the value A2 representing the acid Ac to the value B2 representing the base Ba in the flood exposure L2 herein is nearly equal to the ratio (C1) of the value A1 representing the acid Ac to the value B1 representing the base Ba in the pattern exposure L1.

Note that FIG. 7C also illustrates the concentration distribution DA2 of the acid Ac in combination. When energy is supplied to the resist layer 10 by the flood exposure L2, a base Ba is generated from the base generator PBG in the resist layer 10 as illustrated in FIG. 7C. The concentration distribution DB2 in FIG. 7C indicates concentration of the base Ba generated from the base generator PBG in a state in which the acid Ac does not participate.

As described above, when energy is supplied by the flood exposure L2, an acid Ac is generated from the acid generator PAG in the resist layer 10 and a base Ba is generated from the base generator PBG in the resist layer 10. Furthermore, the acid Ac generated from the acid generator PAG is neutralized with the base Ba generated from the base generator PBG with a result that the acid generator PAG and the base generator PBG are consumed.

FIG. 7D illustrates a concentration distribution SA2 of an acid Ac and a concentration distribution SB2 of a base Ba each in the resist layer 10 after the flood exposure and before the heat treatment. As described above, the acid Ac and the base Ba each generated in the resist layer 10 are neutralized with each other to be consumed. Therefore, of the acid Ac generated as illustrated in FIG. 7B, only a component of which amount is obtained by subtracting an amount corresponding to the amount of the base Ba illustrated in FIG. 7C remains in the resist layer 10. Accordingly, the acid Ac is present in the vicinity of the center of the region 10a. It should be noted that the amount of the acid Ac remaining in the resist layer 10 after the flood exposure L2 is that obtained by subtracting a specific value from the amount of the acid Ac generated from the acid generator PAG.

The generated base Ba is neutralized with the generated acid Ac to be annulled around the center of the region 10a of the resist layer 10. Accordingly, the amount of the base Ba present in the resist layer 10 is almost zero in the vicinity of the center of the region 10a while being a specific value at almost all part of the region 10b in the concentration distribution SB2.

Thereafter, heat treatment is performed on the resist layer 10 as illustrated in FIG. 1D. The heat treatment is performed by heating the resist layer 10 and may be called post exposure bake (PEB). The heat treatment may be pulse heat treatment, for example. The heat treatment causes an acid diffusion reaction. In addition, translation treatment for reversal between positive and negative may be performed on the resist layer 10 after the flood exposure L2 or the heat treatment.

The heat treatment (PEB) re-bonds the acid Ac and the base Ba. FIG. 7E illustrates a re-bonding reaction zone RZ in which the acid Ac and the base Ba are re-bonded in the heat treatment (PEB). The re-bonding reaction zone RZ is located in the vicinity of a point where the value of the concentration of the acid Ac in the concentration distribution SA2 becomes zero and a point where the value of the concentration of the base Ba of the concentration distribution SB2 becomes zero. Through re-bonding between the acid Ac and the base Ba, the acid Ac and the base Ba are neutralized to be consumed. The acid Ac reacts with the base resin R in the re-bonding reaction zone RZ at a temperature of the heat treatment (PEB) to change solubility of the resist layer 10 in a developer.

FIG. 7F is a schematic diagram illustrating concentration distributions of protecting groups of the base resin R after the heat treatment. The protecting group of the base resin R is detached in presence of the acid Ac. Accordingly, the concentration of the protecting group of the base resin R typically decreases as the concentration of the acid Ac is increased. Therefore, where the concentration of the acid Ac is relatively high, the concentration of the protecting group of the base resin R becomes low. By contrast, where the concentration of the acid Ac is relatively low, the concentration of the protecting group of the base resin R remains high. As such, the concentration of the protecting group of the base resin R has a negative correlation with the concentration of the acid Ac. The gradient (chemical gradient) of the concentration of the protecting group also depends on for example the diffusion coefficient of an acid in the resist layer 10, change in the diffusion coefficient of the acid by a deprotection reaction, and a reaction cross section of the acid. Therefore, the gradient depends strongly on the type of the base resin R. A base resin R, which is often used recently, is set to have a narrow re-bonding reaction zone RZ and a large chemical gradient, and the concentration of the protecting group of the base resin R typically decreases as the concentration of the acid Ac is increased.

The concentration of the protecting group of the base resin R changes greatly in the re-bonding reaction zone RZ. Note that FIG. 7F indicates a resist 1 having a dull concentration gradient in the re-bonding reaction zone RZ and a resist 2 having a sharp concertation gradient in the re-bonding reaction zone RZ for reference. Although the concentration of the protecting group at which the solubility changes differs according to the type of the base resin R, it is typical that the concentration of the protecting group is set at approximately the center of the re-bonding zone where the concentration gradient of the protecting group is steepest. It is therefore important to control the concentration distribution SA2 of the acid Ac before heating illustrated in FIG. 7E.

Thereafter, the resist layer 10 is developed as illustrated in FIG. 1E. Through development, at least part of the region indicated by the concentration distribution SA2 of the acid Ac in FIGS. 7D and 7E, that is, at least part of the region 10a is dissolved in a developer to be removed. More strictly, a region having a concentration lower than the concentration of the protecting group where dissolving starts in FIG. 7F is dissolved in the developer to be removed.

In the present embodiment, a latent image can be formed in a region indicated by the concentration distribution SA2 of the acid Ac in FIGS. 7D and 7E, that is, almost all parts of the region 10a in a manner in which the resist layer 10 is irradiated with EUV beams as the beams of the pattern exposure L1 and then irradiated with UV beams as the beams of the flood exposure L2. In this case, a time of irradiation with the EUV beams can be shortened with a result that high throughput can be yielded even using a low-power light source.

Note that FIGS. 7A to 7F illustrate an aspect in which the ratio (C2) of the value A2 representing the acid Ac2 to the value B2 representing the base Ba2 in the flood exposure L2 does not change relative to the ratio (C1) of the value A1 representing the acid Ac1 to the value B1 representing the base Ba1 in the pattern exposure L1. The following further describes an aspect in which the ratio of the value representing the acid Ac to the value representing the base Ba does not change with reference to FIGS. 8A and 8B.

Figure 8A:
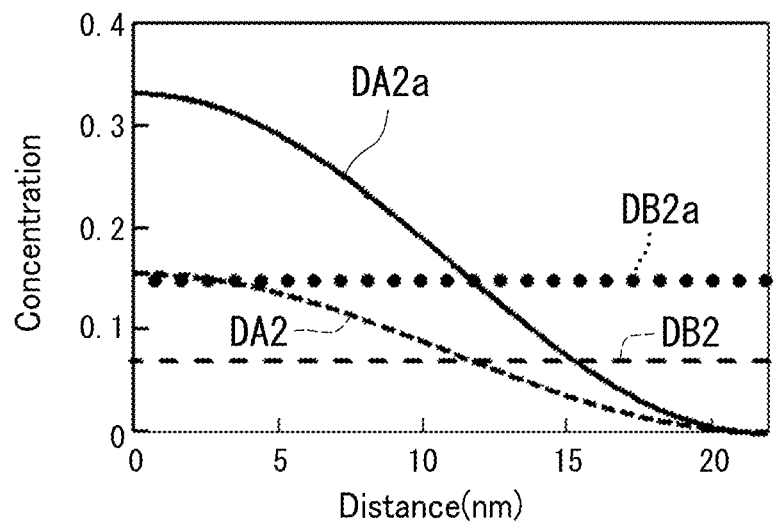
FIG. 8A is a schematic diagram illustrating amounts of an acid and a base where a ratio of value representing the acid to value representing the base does not change with elapse of an exposure time of the flood exposure.

FIG. 8A is a schematic diagram illustrating a concentration distribution DA2a of an acid Ac and a concentration distribution DB2a of a base Ba where the exposure time of the flood exposure L2 is increased. Note that FIG. 8A also illustrates in combination the concentration distribution DA2 of the acid Ac and the concentration distribution DB2 of the base Ba before the exposure time of the flood exposure L2 is increased.

As illustrated in FIG. 8A, when the amount of the generated acid Ac is increased, the peak value of the acid Ac in the concentration distribution DA2a increases to be higher than the peak value of the acid Ac in the concentration distribution DA2. Note that the foot portion of the concentration distribution DA2a does not so change relative to the foot portion of the concentration distribution DA2 regardless of the amount of the generated acid Ac being increased.

Furthermore, when the amount of the generated base Ba is increased, the value of the base Ba in the concentration distribution DB2a increases to be larger than the value of the base Ba in the concentration distribution DB2. Note that each of the value of the base Ba in the concentration distribution DB2a and the value of the base Ba in the concentration distribution DB2 is almost level regardless of the location in the resist layer 10.

An increase in the exposure time of the flood exposure L2 increases the amount of the generated acid Ac while increasing the amount of the generated base Ba. Note that a ratio of the amount of the acid Ac to the amount of the base Ba does not change herein even when the exposure time of the flood exposure L2 is increased. For example, an increase in the exposure time of the flood exposure L2 approximately doubles the amount of the acid Ac and approximately doubles the amount of the base Ba.

Figure 8B:
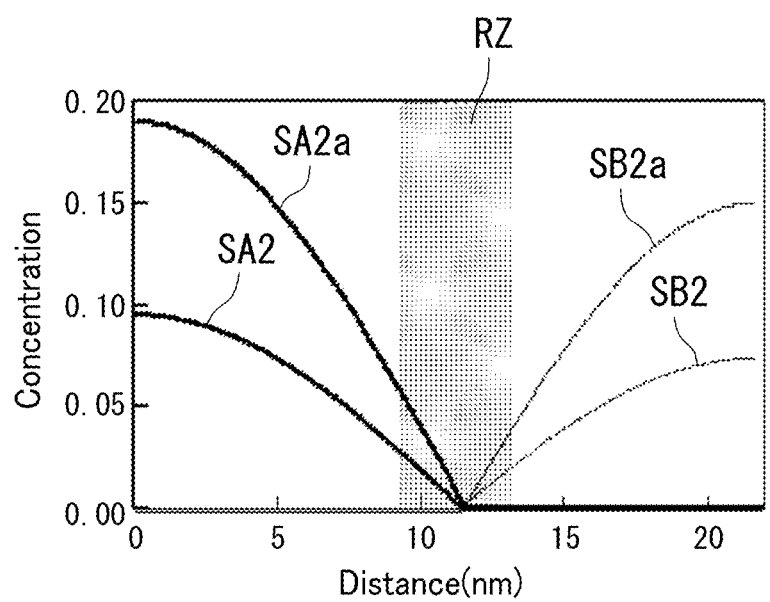
FIG. 8B is a schematic diagram illustrating the concentration distribution changes of the acid and the base in FIG. 8A in association with an increase in the exposure time of the flood exposure.

FIG. 8B is a schematic diagram illustrating a concentration distribution SA2a of an acid Ac and a concentration distribution SB2a of a base Ba where the exposure time of the flood exposure L2 is increased. Not that FIG. 8B illustrates in combination the concentration distribution SA2 of the acid Ac and the concentration distribution SB2 of the base Ba before the exposure time of the flood exposure L2 is increased.

Even when the exposure time of the flood exposure L2 is increased, the ratio of the amount of the acid Ac to the amount of the base Ba hardly changes. Therefore, even when the amounts of the acid Ac and the base Ba are increased by increasing the exposure time of the flood exposure L2, a point where the value of the concentration distribution SA2a of the acid Ac becomes zero is almost the same as a point where the value of the concentration distribution SA2 of the acid Ac before the exposure time is increased becomes zero. Also, a point where the value of the concentration distribution SB2a of the base Ba becomes zero is almost the same as a point where the value of the concentration distribution SB2 of the base Ba before the exposure time is increased becomes zero. Therefore, the line width of a developed pattern does not vary regardless of an increase in the exposure time of the flood exposure L2.

In the above description with reference to FIGS. 8A and 8B, the amount of the acid Ac and the amount of the base Ba increase at the same rate with an increase in the exposure time of the flood exposure L2. In this case, the amount of the acid Ac and the amount of the base Ba decrease at the same rate with a decrease in the exposure time of the flood exposure L2. The ratio of the amount of the acid Ac to the amount of the base Ba does not change according to the exposure time of the flood exposure L2 in the above description with reference to FIGS. 8A and 8B, which should not be taken to limit the present invention. The ratio of the amount of the acid Ac to the amount of the base Ba may change according to the exposure time of the flood exposure.

Description will be made next about an aspect in which the ratio of the amount of the acid Ac to the amount of the base Ba changes according to the exposure time of flood exposure with reference to FIGS. 9A and 9B. Note that the amount of the acid Ac and the amount of the base Ba increase as the exposure time of the flood exposure L2 is increased and a rate of change in amount of the base Ba is higher than a rate of change in amount of the acid Ac.

Figure 9A:
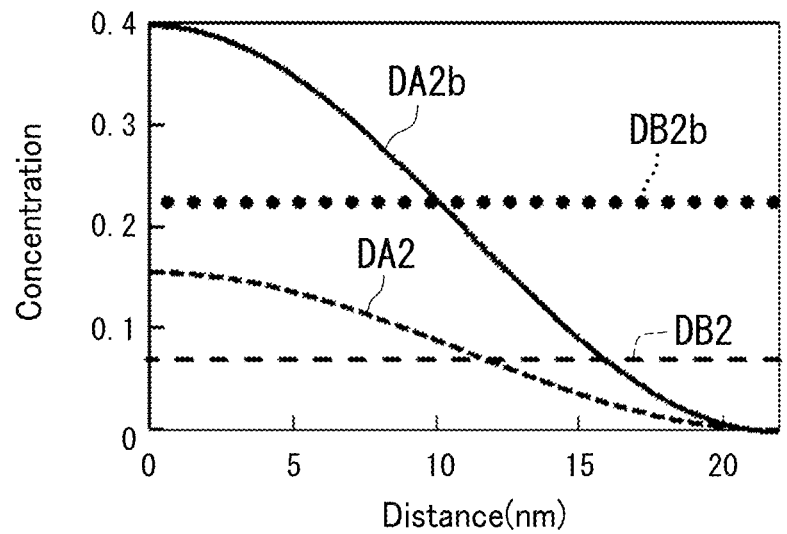
FIG. 9A is a schematic diagram illustrating amounts of an acid and a base where a ratio of value representing the acid to value representing the base does not change with elapse of an exposure time of the flood exposure.

FIG. 9A is a schematic diagram illustrating a concentration distribution DA2b of an acid Ac and a concentration distribution DB2b of a base Ba where the exposure time of the flood exposure L2 is increased. Note that FIG. 9A also illustrates in combination the concentration distribution DA2 of the acid Ac and the concentration distribution DB2 of the base Ba before the exposure time of the flood exposure L2 is increased.

As illustrated in FIG. 9A, an increase in the exposure time of the flood exposure L2 increases the amount of the acid Ac while increasing the amount of the base Ba. The ratio of the amount of the acid Ac to the amount of the base Ba herein changes according to the exposure time of flood exposure. For example, when the exposure time of the flood exposure L2 is increased, the amount of the acid Ac increases approximately 2.5 times and the amount of the base Ba increases approximately 3 times.

Figure 9B:
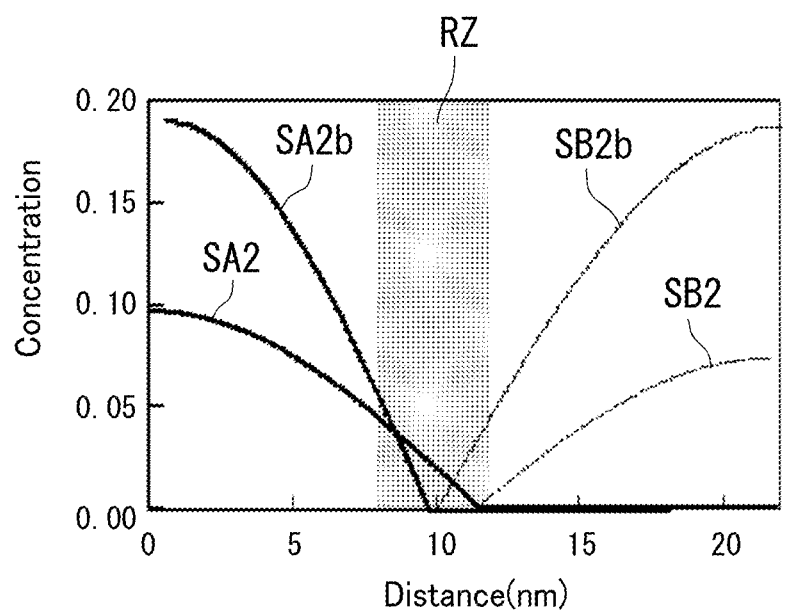
FIG. 9B is a schematic diagram illustrating the concentration distribution changes of the acid and the base in FIG. 9A in association with an increase in the exposure time of the flood exposure.

FIG. 9B is a schematic diagram illustrating a concentration distribution SA2b of an acid Ac and a concentration distribution SB2b of a base Ba where the exposure time of the flood exposure L2 is increased. Note that FIG. 9B also illustrates in combination the concentration distribution SA2 of the acid Ac and the concentration distribution SB2 of the base Ba before the exposure time of the flood exposure L2 is increased.

As illustrated in FIG. 9B, the amounts of the acid Ac and the base Ba are increased by increasing the exposure time of the flood exposure L2. In this case, a rate of an increase in amount of the base Ba is higher than a rate of an increase in amount of the acid Ac. Therefore, a point where the value of the concentration distribution SA2b of the acid Ac becomes zero is closer to the center of the region 10a than a point where the value of the concentration distribution SA2 of the acid Ac before an increase in the exposure time becomes zero. Furthermore, a point where the value of the concentration distribution SB2b of the base Ba becomes zero is closer to the center of the region 10a than a point where the value of the concentration distribution SB2 of the base Ba before the increase in the exposure time becomes zero. Therefore, the line width of a developed pattern becomes narrow as a result of an increase in the exposure time of the flood exposure L2.

Note that the amount of the base Ba increases at a higher rate than the amount of the acid Ac as the exposure time of the flood exposure L2 is increased in the above description with reference to FIGS. 9A and 9B. In this case, the amount of the base Ba decreases at a higher rate than the amount of the acid Ac as the exposure time of the flood exposure L2 is shortened. Note that the amount of the base Ba changes at a higher rate than the amount of the acid Ac according to change in the exposure time of the flood exposure L2 in the above description with reference to FIGS. 9A and 9B, which should not be taken to limit the present invention. The amount of the acid Ac may change at a higher rate than the amount of the base Ba according to change in the exposure time of the flood exposure L2.

As has been described with reference to FIGS. 8A to 9B, the amount of the acid Ac and the amount of the base Ba change in the same direction as each other. Therefore, the concentration distributions SA2a and SA2b of the acid Ac present in the resist layer 10 after the change do not differ so much from the concentration distribution SA2 of the acid Ac before the change.

The present inventor extensively studied to find that when the ratio of the value representing the acid Ac2 to the value representing the base Ba2 in the flood exposure L2 is set to approximately the same as the ratio of the value representing the acid Ac1 to the value representing the base Ba1 in the pattern exposure L1, production of defects resulting from random noise in the resist layer 10 can be prevented. Specifically, the present inventor conducted the study in view of sensitivity, resolution, and roughness performance of resist layers to find that production of defects resulting from random noise can be prevented. Note that typical random noise is photon shot noise.

Sensitivity can be approximately expressed by a difference between the amount of an acid and the amount of a base. For example, when the amount of the acid is increased while the amount of the base is not changed, sensitivity increases. By contrast, when the amount of the base is increased while the amount of the acid is not changed, sensitivity decreases. Furthermore, when the amount of the acid and the amount of the base change at a similar rate, sensitivity hardly changes.

Resolution can be approximately expressed by a ratio between the amount of an acid and the amount of a base. For example, when the amount of the acid is increased while the amount of the base is not changed, resolution decreases. Also, when the amount of the base is increased while the amount of the acid is not changed, resolution increases. By contrast, when the amount of the acid and the amount of the base change at the same rate, resolution hardly changes.

Roughness performance can be expressed in terms of a difference between the amount of an acid and the amount of a base. Roughness performance increases more as the difference between the amount of the acid and the amount of the base is increased. By contrast, roughness performance decreases more as the difference between the amount of the acid and the amount of the base is decreased. Note that the number of defects resulting from roughness performance increases as a distance between adjacent patterns is reduced. For example, even when center distances between adjacent contact holes are equal to each other, contact holes having a larger diameter are more significantly affected by roughness performance.

As described above, resolution can be expressed by the ratio between the amount of an acid and the amount of a base. In this connection, the ratio of the amount of an acid to the amount of a base each generated in the flood exposure L2 is preferably equal to the ratio of the amount of an acid to the amount of a base in the pattern exposure L1. For example, the ratio $C2$ (=A2/B2) of the value (A2) representing the amount of an acid Ac to the value (B2) representing the amount of a base Ba2 each generated in the flood exposure L2 satisfies a relationship $0.9 \times C1 < C2 < 10 \times C1$ relative to the ratio $C1$ (=A1/B1) of the value (A1) representing the amount of an acid to the value (B1) representing the amount of a base in the pattern exposure L1. Also, the relationship between the ratio C1 and the ratio C2 may satisfy $1 \times C1 < C2 < 8 \times C1$ or satisfy $2 \times C1 < C2 < 5 \times C1$. Furthermore, it is further preferable to satisfy a relationship $A1-B1 < A2-B2$.

Furthermore, change in type of the energy source in the flood exposure L2 can increase or decrease the amount of change of a base Ba relative to the amount of change of an acid Ac.

Figure 10A:
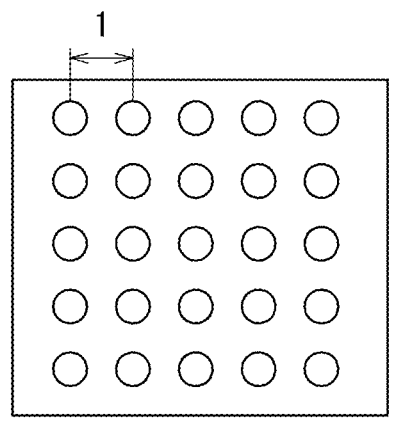
FIG. 10A is a schematic diagram illustrating a resist layer in which contact holes are formed.

Here, random noise will be described with reference to FIGS. 10A to 10C. FIG. 10A is a schematic diagram illustrating contact holes in a resist layer that each are a target. Here, contact holes in 5 lines and 5 rows are formed in a positive resist layer.

It is known that defects are caused due to random noise when the size of contact holes to be formed is small. When the exposure dose of irradiation on a resist layer is small, solubility of the resist layer is insufficiently changed due to random noise, thereby disabling formation of contact holes with a desired size. A contact hole formed to have an insufficient size is also called a missing contact hole.

It is also known that defects are produced due to random noise when the size of contact holes to be formed is large. Where the size of the contact holes is large, a distance between adjacent contact holes is short. In this connection, when the exposure dose of irradiation on the resist layer is slightly large due to random noise, solubility may change even in a region between adjacent contact holes to lead to communication between the adjacent contact holes. Contact holes that are adjacent contact holes communicating with each other are also called kissing contact holes.

Figure 10B:
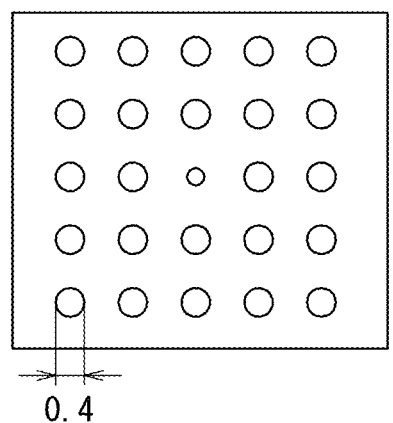
FIG. 10B is a schematic diagram illustrating an example of a defect caused when contact holes have a short contact hole diameter.

FIG. 10B is a schematic diagram illustrating an example of a defect caused where the diameter of contact holes is small relative to the distance between adjacent contact holes. When the diameter of the contact holes is small relative to the distance between adjacent contact holes, contact holes each having a desired size may not be formed to produce a defect.

Figure 10C:
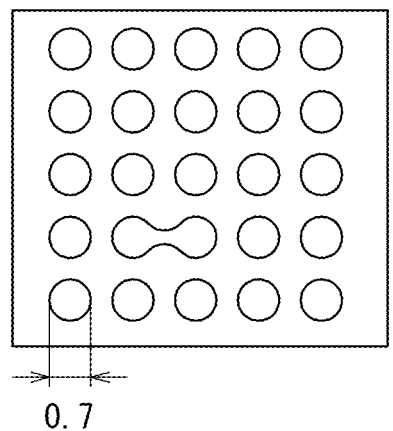
FIG. 10C is a schematic diagram illustrating an example of a defect caused when contact holes have a long contact hole diameter.

FIG. 10C is a schematic diagram illustrating an example of a defect caused where the diameter of contact holes is large relative to the distance between adjacent contact holes. For example, when the diameter of the contact holes is large relative to the distance between adjacent contact holes, some of the contact holes may communicate with an adjacent contact hole to produce a defect.

When exposure dose varies due to random noise, a defect is produced. It is thought that a typical method for preventing production of such defects is to increase sensitivity. However, an increase in amount of a generated acid for sensitivity increase decreases resolution although sensitivity can be increased. For the above reason, formation of kissing contact holes cannot be prevented.

Furthermore, it is thought that another typical method for preventing production of such defects is to increase resolution. However, an increase in amount of a generated base for resolution increase decreases sensitivity although resolution can be increased. For the above reason, formation of missing contact holes cannot be prevented.

By contrast, the resist layer 10 contains not only the acid generator PAG but also the base generator PBG in the resist pattern formation method of the present embodiment, and therefore, the amount of an acid Ac generated from the acid generator PAG and the amount of a base Ba generated from the base generator PBG can be changed in the same direction as each other. Furthermore, an acid Ac is generated from the acid generator PAG through sensitization by a sensitizer Ps generated from the sensitizer precursor Pp contained in the resist layer 10. Thus, an acid Ac can be generated selectively in a region subjected to the pattern exposure L1.

From the above description with reference to FIG. 7A to 10C, it is understood that the present embodiment have the following advantages (1) to (4).

(1) Even when the pattern exposure L1 is performed in the same manner, resolution can remain unchanged and can be still more increased by increasing the amounts of an acid Ac and a base Ba each generated in the flood exposure L2.

(2) Because no base Ba is present in a portion where an acid Ac is present before PEB, almost all the acid Ac participates in a solubility change reaction of a resist such as a deprotection reaction in the re-bonding reaction zone RZ in which roughness performance is caused in PEB. Therefore, the acid Ac can participate in a reaction at edges of a pattern where a problem of roughness performance is posed in a chemically amplified resist unlike other resists. Increases in amount of a generated acid Ac and amount of a generated base Ba can reduce roughness resulting from photon shot noise (see FIGS. 7E, 7F, 8B, and 9B).

(3) A large amount of an acid Ac can be generated without sacrificing resolution (at the same degree or a high degree of resolution). Therefore, formation of missing contact holes resulting from typical random noise can be prevented. Furthermore, sufficient resolution can be ensured even when a large amount of an acid Ac is generated, and accordingly, an appropriate distance between edges can be ensured. Consequently, production of typical defects resulting from random noise, such as formation of kissing contact holes and microbridge can be prevented.

(4) Both of the problems of random noise and trade-off among resolution, sensitivity, and roughness performance can be solved.

Figure 11A:
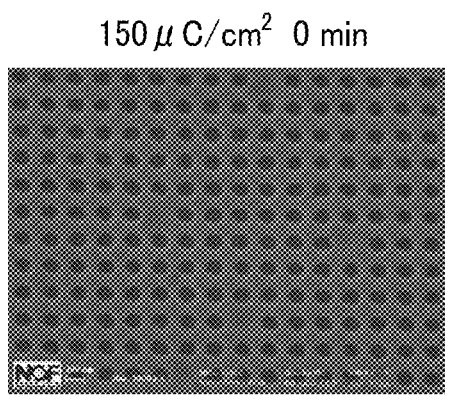
FIGS. 11A and 11B are diagrams each illustrating a resist layer developed after EB pattern exposure without UV flood exposure performed.
Figure 11B:
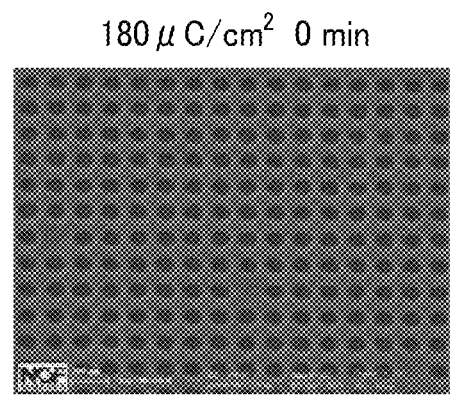
Figure 11C:
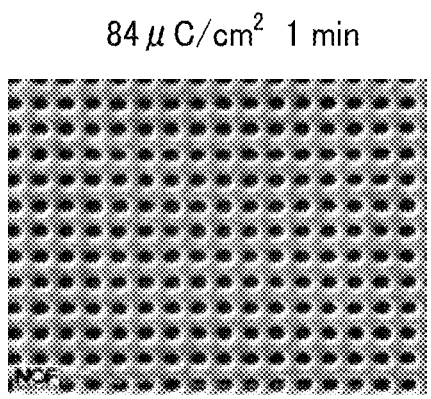
FIGS. 11C to 11E are diagrams illustrating resist layers developed after 1-minute UV flood exposure after EB pattern exposure is performed with different doses.
Figure 11D:
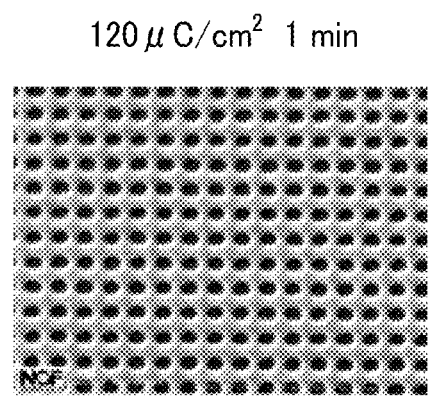
Figure 11E:
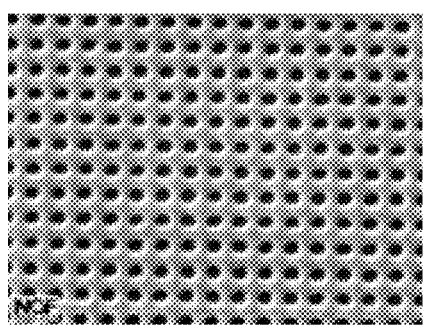

Description will be made herein with reference to FIGS. 11A to 11E about resist layers among which differences are made in dose in EB pattern exposure or in performance or no-performance of UV flood exposure. FIGS. 11A and 11B are illustrations of resist layers developed after EB pattern exposure without UV flood exposure performed. FIGS. 11C to 11E are illustrations of resist layers developed after 1-minute UV flood exposure is performed after EB pattern exposure at different doses.

A resist material was prepared by adding 5 parts by mass of diphenyliodonium perfluorobutanesulfonate (DPI-PFBS) as the acid generator PAG, 5 parts by mass of a dimethoxybenzhydrol derivative (DOBzMM) as the sensitizer precursor Pp, and 1 part by mass of dicyclohexylammonium 2-(3-benzoylphenyl)propionate as the base generator PBG to 100 parts by mass of methyl methacrylate-based polymer (also referred to below as "MMA") dissolved in cyclohexanone. Note that the DOBzMM was selected as the sensitizer precursor Pp and dcyclohexylammonium 2-(3-benzoylphenyl)propionate was selected as the base generator PBG so that the sensitizer precursor Pp and the base generator PBG have relatively close absorption wavelength spectra to each other.

The prepared resist material was spin-coated onto silicon substrates, which had been subject to pretreatment with hexamethyldisilazane (HMDS) in advance, at 1,000 rpm for 120 seconds using a spin coater (product of Mikasa Co., Ltd.). After the spin coating, heat treatment at 100° C. was performed for 1 minute to form resist layers. The resist layers after the spin coating each had a thickness of approximately 50 nm as measured using an atomic force microscope (AFM, "NANONAVI II/SPA-300HV, product of Hitachi High-Tech Science Corporation).

The resist layers were irradiated with electron beams at an irradiation current of 12.5 pA and an accelerating voltage of 30 keV using a patterning apparatus, JSM-6500F produced by JEOL Ltd. (beam blanker to fitting: raster scan system) as a pattern exposure machine.

In a case of flood exposure being performed, the flood exposure was performed after the resist layers were held in the air for 1 minute as an interval after the pattern exposure. A light emitting diode (LED) light source (LC-L5, LED, product of Hamamatsu Photonics K.K., 365 nm) was used as a flood exposure machine. The resist layers were irradiated with ultraviolet using the light source at 1.3 W/hour in the air. After the flood exposure, heat treatment at 100° C. was performed for 60 seconds, and then, the resist layers were developed for 1 minute at 24° C. with a tetramethylammonium hydroxide (TMAH) developer at a concentration of 2.38%.

In a case of the flood exposure being not performed, the heat treatment at 100° C. was performed for 60 seconds, and then, the resist layers were developed for 1 minute at 24° C. with the tetramethylammonium hydroxide (TMAH) developer at a concentration of 2.38%.

FIG. 11A illustrates a resist layer developed without the UV flood exposure performed after the EB pattern exposure with a dose of 150 µC/cm$^2$. The EB pattern exposure generates an acid in the resist layer, thereby forming contact holes. The diameter of the contact holes (critical dimension: CD) in this case was 82.25 nm. As illustrated in FIG. 11A, missing contact holes were present when the dose of the EB pattern exposure was 150 µC/cm$^2$.

Note that although not specifically illustrated, missing contact holes were present even in a case where the dose of the EB pattern exposure was 120 µC/cm$^2$. However, when the dose of the EB pattern exposure was increased from 120 µC/cm$^2$ to 150 µC/cm$^2$, the number of missing contact holes was reduced.

FIG. 11B illustrates a resist layer developed without the UV flood exposure performed after the EB pattern exposure with a dose of 180 µC/cm$^2$. The EB pattern exposure generated an acid in the resist layer, thereby forming contact holes. The CD of the contact holes in this case was 93.47 nm. As illustrated in FIG. 11B, missing contact holes were also present even when the dose of the EB pattern exposure was 180 µC/cm$^2$.

Note that as understood from comparison between FIG. 11A and FIG. 11B, an increase in dose of the EB pattern exposure reduced the number of missing contact holes. Furthermore, an increase in dose of the EB pattern exposure also increased the critical dimension. This is presumed to be because an increase in dose of the EB pattern exposure increases the amount of a generated acid while allowing the amount of the base to be unchanged, which increases a ratio of the amount of a generated acid to the amount of the base.

FIG. 11C illustrates a resist layer developed after the UV flood exposure was performed for 1 minute after the EB pattern exposure at a dose of 84 µC/cm$^2$. The CD of contact holes in this case was 81.53 nm.

FIG. 11D illustrates a resist layer developed after the UV flood exposure was performed for 1 minute after the EB pattern exposure at a dose of 120 µC/cm$^2$. The CD of contact holes in this case was 84.53 nm.

FIG. 11E illustrates a resist layer developed after the UV flood exposure was performed for 1 minute after the EB pattern exposure at a dose of 144 µC/cm$^2$. The CD of contact holes in this case was 75.37 nm.

As can be understood from comparison between FIG. 11C and FIG. 11D, when the dose of the EB pattern exposure was increased from 84 µC/cm$^2$ to 120 µC/cm$^2$, the CD of the contact holes almost remained the same although it was slightly increased.

This is presumed to be because the ratio of the amount of a generated acid to the amount of a generated base hardly changed as a result of an acid being generated and a base being also generated by the UV flood exposure.

Furthermore, as can be understood from comparison between FIG. 11D and FIG. 11E, when the dose of the EB pattern exposure was increased from 120 µC/cm$^2$ to 144 µC/cm$^2$, the CD of the contact holes decreased as the dose of the EB pattern exposure was increased. It is presumed that the CD of the contact holes was decreased because complicated reactions were caused when the dose of EB pattern exposure was 144 µC/cm$^2$, such as generation of a base from the base generator by the EB pattern exposure, generation of a base from the base generator by the flood exposure, and generation of a large amount of a sensitizer in a region subjected to the EB pattern exposure due to the amount of the generated acid exceeding the amount of the base component, and generation of a base from the base generator through excitation of the sensitizer by the flood exposure.

As described above, formation of contact holes having a small diameter may involve formation of missing contact holes. Formation of missing contact holes is caused due to insufficient exposure dose. Formation of missing contact holes can be prevented by increasing sensitivity of the resist layer 10.

As also described above, formation of contact holes having a large diameter may involve formation of kissing contact holes. Formation of kissing contact holes is caused due to decreased resolution. As such, formation of kissing contact holes can be prevented by increasing resolution of the resist layer 10.

As such, when sensitivity and resolution of the resist layer 10 are increased, a range of the effective diameter of contact holes can be increased. As such, production of defects in the resist layer 10 can be prevented even when photon noise shot is generated to some extent in exposure.

The pattern exposure L1 in the resist pattern formation method of the present embodiment is preferably performed using the extreme ultraviolet (EUV). The wavelength of the ArF excimer laser is 193 nm, whereas the wavelength of the extreme ultraviolet is 13.5 nm, and the photon energy of the extreme ultraviolet is as high as 14 times the photon energy of the ArF excimer laser. As such, the number of photons in the extreme ultraviolet is 1/14 of that of the ArF excimer laser even at the same dose. Accordingly, photon shot noise tends to be produced in the pattern exposure L1 using the extreme ultraviolet. For the above reason, the present process is favorably applied to lithography using the extreme ultraviolet.

Note that a base Ba is generated from the base generator PBG by the flood exposure L2 in the above description with reference to FIGS. 1A to 1E, which should not be taken to limit the present invention. Generation of a base Ba from the base generator PBG may be done not only by the flood exposure L2 but also by the pattern exposure L1.

Furthermore, the pattern exposure L1 and the flood exposure L2 each are performed one time in the above description with reference to FIG. 1A to 1E, which should not be taken to limit the present invention. The pattern exposure L1 and the flood exposure L2 may each be performed multiple times. For example, the flood exposure L2 may be performed multiple times.

Next, a resist pattern formation method according to the present embodiment will be described with reference to FIGS. 1A to 1E and FIGS. 12A to 12D. This resist pattern formation method of the present embodiment is similar to the resist pattern formation method described above with reference to FIGS. 1A to 1E and 7A to 7F in all aspects other than that a sensitizer Ps is generated from the sensitizer precursor Pp in working with an acid Ac remaining after neutralization between the acid Ac and the base Ba after the pattern exposure L1. As such, overlapping description may be appropriately omitted for avoiding redundancy.

Figure 12A:
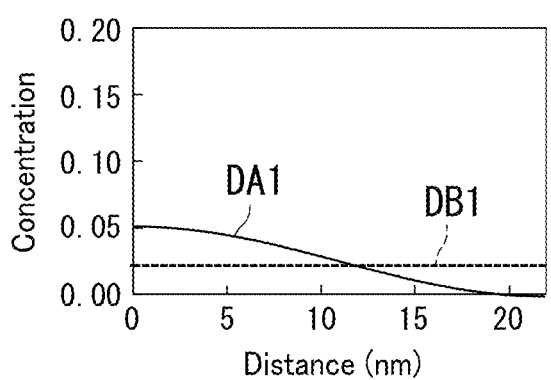
FIG. 12A is a schematic diagram illustrating a concentration distribution of an acid and a concentration distribution of a base in a resist layer in the pattern exposure.

FIG. 12A is a schematic diagram illustrating a concentration distribution DA1 of an acid Ac1 and a concentration distribution DB1 of a base Ba1 in a resist layer 10 in the pattern exposure L1. As illustrated in FIG. 12A, an acid Ac is generated from the acid generator PAG by the pattern exposure L1. Note that the pattern exposure L1 herein is performed at room temperature and no sensitizer Ps is generated from the sensitizer precursor Pp by the pattern exposure L1 only.

Figure 12B:
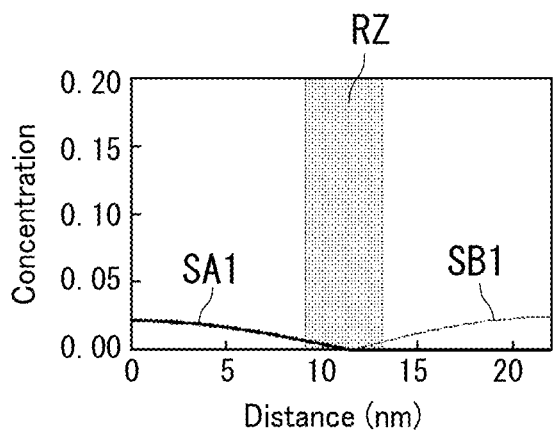
FIG. 12B is a schematic diagram illustrating a concentration distribution of an acid and a concentration distribution of a base each remaining after neutralization between an acid and a base in the resist layer in the pattern exposure.

FIG. 12B is a schematic diagram illustrating a concentration distribution SA1 of an acid Ac and a concentration distribution SB1 of a base Ba each remaining after neutralization between the acid Ac1 and the base Ba1 in the resist layer 10 in the pattern exposure L1. The acid Ac and the base Ba generated in the resist layer 10 are neutralized with each other to be consumed. Therefore, only a component remains in the resist layer 10. The component herein is a difference obtained by subtracting a portion corresponding to the amount of the base Ba indicated in FIG. 12A from the generated acid Ac indicated in FIG. 12A. Accordingly, the acid Ac is present in the vicinity of the center of the region 10a. Note that FIG. 12B indicates a re-bonding reaction zone RZ in which the acid Ac and the base Ba are re-bonded to each other in the heat treatment (PEB).

Figure 12C:
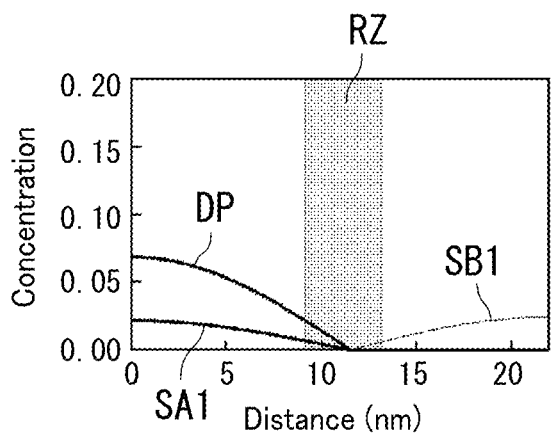
FIG. 12C is a schematic diagram illustrating a concentration distribution of a sensitizer generated in presence of an acid by heating the resist layer after the pattern exposure.

FIG. 12C is a schematic diagram illustrating a concentration distribution DP of a sensitizer Ps generated in working with the acid Ac1 by heating the resist layer 10 after the pattern exposure L1. As illustrated in FIG. 12C, a sensitizer Ps is generated in working with the acid Ac1 by heating the resist layer 10. Specifically, the concentration distribution DP of the sensitizer Ps corresponds to the concentration distribution SA1 of the acid Ac1. The resist layer 10 is preferably heated at a temperature of equal to or higher than a glass transition temperature Tg of the base resin R of the resist layer 10 and a temperature at which polarity conversion efficiency of the base resin R is low.

Figure 12D:
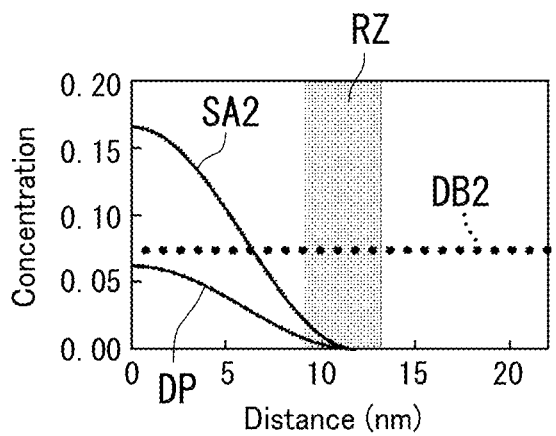
FIG. 12D is a schematic diagram illustrating a concentration distribution of an acid and a concentration distribution of a base in the resist layer in the flood exposure.

FIG. 12D is a schematic diagram illustrating a concentration distribution DA2 of an acid Ac2 and a concentration distribution DB2 of a base Ba2 each in the resist layer 10 in the flood exposure L2. As illustrated in FIG. 12D, when the flood exposure L2 is performed on the resist layer 10, energy is supplied to the entirety of the resist layer 10 in which the sensitizer Ps has been generated. When energy is supplied, an acid Ac is generated from the acid generator PAG in presence of the sensitizer Ps.

Furthermore, a base Ba is generated from the base generator PBG in the entirety of the resist layer 10 by the flood exposure L2. When a base Ba is generated from the base generator PBG by the flood exposure L2, the concentration distribution DB2 of the base Ba is level at a specific value regardless of the location as illustrated in FIG. 12D.

Figure 12E:
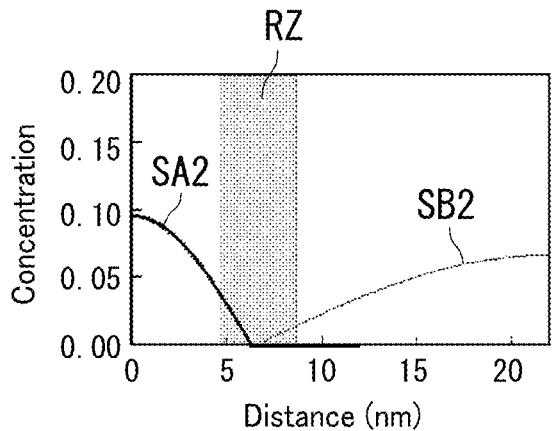
FIG. 12E is a schematic diagram illustrating a concentration distribution of an acid and a concentration distribution of a base each remaining after neutralization between an acid and a base in the resist layer in the flood exposure.

FIG. 12E is a schematic diagram illustrating a concentration distribution SA2 of an acid Ac and a concentration distribution SB2 of a base Ba each remaining after neutralization between the acid Ac2 and the base Ba2 in the resist layer 10 in the flood exposure L2. FIG. 12E indicates the re-bonding reaction zone RZ in which the acid Ac and the base Ba are re-bonded to each other in the heat treatment (PEB). The acid Ac and the base Ba generated in the resist layer 10 are neutralized with each other to be consumed. Therefore, only a component remains in the resist layer 10. The component herein is a difference obtained by subtracting a portion corresponding to the amount of the base Ba indicated in FIG. 12D from the generated acid Ac indicated in FIG. 12D. Accordingly, the acid Ac is present in the vicinity of the center of the region 10a.

A point where the value of the concentration distribution SA2 of the acid Ac after the flood exposure L2 becomes zero is closer to the center of the region 10a than a point where the value of the concentration distribution SA1 of the acid Ac before the flood exposure L2 becomes zero. Also, a point where the value of the concentration distribution SB2 of the base Ba after the flood exposure L2 becomes zero is closer to the center of the region 10a than a point where the value of the concentration distribution SB1 of the base Ba before the flood exposure L2 becomes zero. Therefore, the line width of a developed pattern is reduced by the flood exposure L2.

Note that although the resist layer 10 contains the base generator PBG and a base Ba is generated from the base generator PBG by the flood exposure L2 in the above description, the resist layer 10 may not contain the base generator PBG.

The following describes a resist pattern formation method with reference to FIGS. 13A to 13D. This resist pattern formation method is similar to the resist pattern formation method described with reference to FIGS. 12A to 12E in all aspects other than that the resist layer 10 contains no base generator PBG and the concentration of the base Ba1 is relatively high. As such, overlapping description may be appropriately omitted for avoiding redundancy.

Figure 13A:
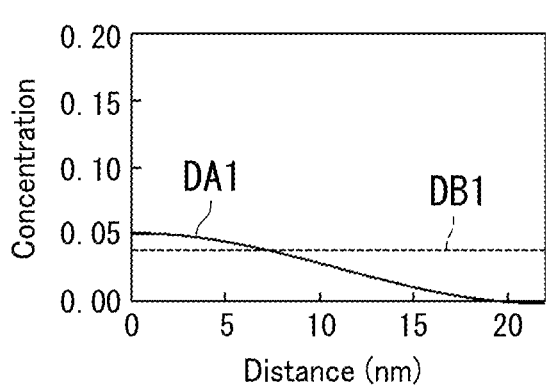
FIG. 13A is a schematic diagram illustrating a concentration distribution of an acid and a concentration distribution of a base in a resist layer in the pattern exposure.

FIG. 13A is a schematic diagram illustrating a concentration distribution DA1 of an acid Ac1 and a concentration distribution DB1 of a base Ba1 each in the resist layer 10 in the pattern exposure L1. As illustrated in FIG. 13A, an acid Ac is generated from the acid generator PAG by the pattern exposure L1. No sensitizer Ps is generated from the sensitizer precursor Pp by the pattern exposure L1 only. Here, the concentration of the base Ba1 is relatively high.

Figure 13B:
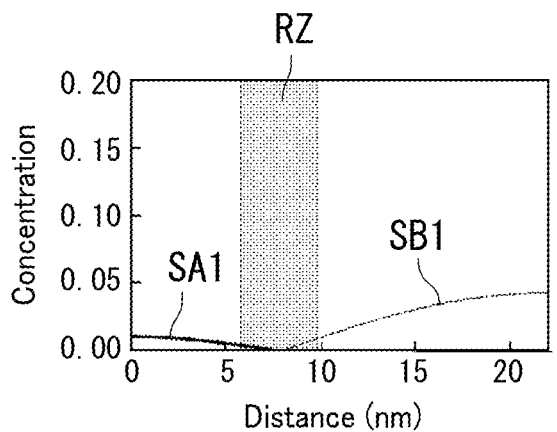
FIG. 13B is a schematic diagram illustrating a concentration distribution of an acid and a concentration distribution of a base each remaining after neutralization between an acid and a base in the resist layer in the pattern exposure.

FIG. 13B is a schematic diagram illustrating a concentration distribution SA1 of an acid Ac and a concentration distribution SB1 of a base Ba each remaining after neutralization between the acid Ac1 and the base Ba1 in the resist layer 10 in the pattern exposure L1. The acid Ac and the base Ba generated in the resist layer 10 are neutralized with each other to be consumed. Therefore, only a component remains in the resist layer 10. The component herein is a difference obtained by subtracting a portion corresponding to the amount of the base Ba indicated in FIG. 13A from the generated acid Ac indicated in FIG. 13A. Accordingly, the acid Ac is present in the vicinity of the center of the region 10a.

A point in FIG. 13B where the value of the concentration distribution SA1 of the acid Ac after the pattern exposure L1 becomes zero is closer to the center of the region 10a than a point in FIG. 12B where the value of the concentration distribution SA1 of the acid Ac after the pattern exposure L1 becomes zero. Also, a point in FIG. 13B where the value of the concentration distribution SB1 of the base Ba after the pattern exposure L1 becomes zero is closer to the center of the region 10a than a point in FIG. 12B where the value of the concentration distribution SB1 of the base Ba after the pattern exposure L1 becomes zero. FIG. 13B indicates the re-bonding reaction zone RZ in which the acid Ac and the base Ba are re-bonded to each other in the heat treatment (PEB).

Figure 13C:
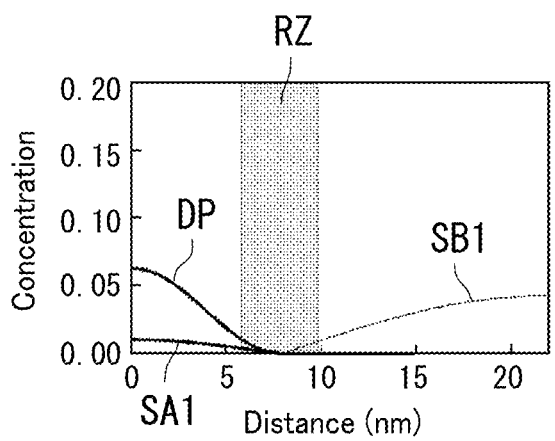
FIG. 13C is a schematic diagram illustrating a concentration distribution of a sensitizer generated in working with an acid by heating the resist layer after the pattern exposure.

FIG. 13C is a schematic diagram illustrating a concentration distribution DP of a sensitizer Ps generated in working with the acid Ac1 by heating the resist layer 10 after the pattern exposure L1. As illustrated in FIG. 13C, a sensitizer Ps is generated in working with the acid Ac by heating the resist layer 10. Specifically, the concentration distribution DP of the sensitizer Ps corresponds to the concentration distribution SA1 of the acid Ac1.

Figure 13D:
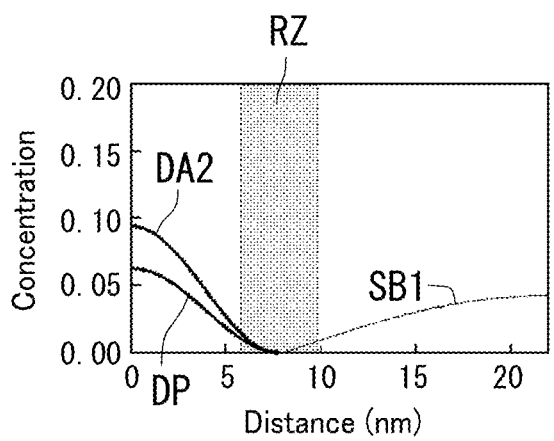
FIG. 13D is a schematic diagram illustrating a concentration distribution of an acid and a concentration distribution of a base in the resist layer in the flood exposure.

FIG. 13D is a schematic diagram illustrating a concentration distribution DA2 of an acid Ac2 and a concentration distribution SB1 of a base Ba each in the resist layer 10 in the flood exposure L2. As illustrated in FIG. 13D, when the flood exposure L2 is performed on the resist layer 10, energy is supplied to the entirety of the resist layer 10 in which the sensitizer Ps has been generated. When energy is supplied, an acid Ac is generated from the acid generator PAG in presence of the sensitizer Ps.

However, the resist layer 10 contains no base generator PBG herein, and accordingly, no base Ba is generated from the base generator PBG by the flood exposure L2. Therefore, the concentration distribution of the base Ba remains as the concentration distribution SB1.

Figure 13E:
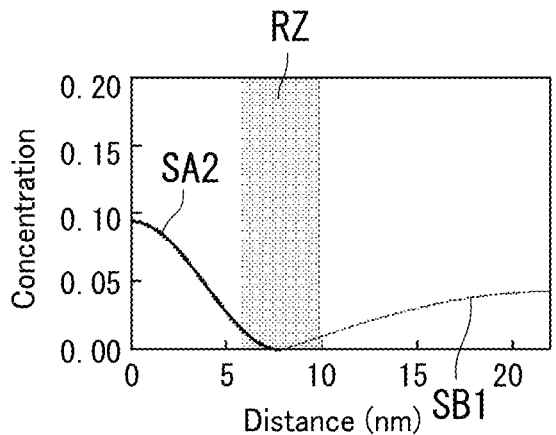
FIG. 13E is a schematic diagram illustrating a concentration distribution of an acid and a concentration distribution of a base after the flood exposure.

FIG. 13E is a schematic diagram illustrating a concentration distribution SA2 of an acid Ac and a concentration distribution SB1 of a base Ba after the flood exposure L2. Here, the concentration distribution SB1 of the base Ba is relatively high. This can inhibit diffusion of the acid Ac.

Note that a sensitizer Ps is generated in working with the acid Ac by heating after the pattern exposure L1 in the description with reference to FIGS. 12A to 13E, which should not be taken to limit the present embodiment. The sensitizer Ps may be generated by the pattern exposure L1 and also generated in working with the acid Ac by heating after the pattern exposure L1.

Next, a resist pattern formation method according to the present embodiment will be described with reference to FIGS. 14A to 14C. This resist pattern formation method of the present embodiment is similar to the resist pattern formation method described with reference to FIGS. 12A to 12E in all aspects other than that a sensitizer Ps is generated by the pattern exposure L1 and also generated in working with the acid Ac by heating after the pattern exposure L1. As such, overlapping description may be appropriately omitted for avoiding redundancy.

Figure 14A:
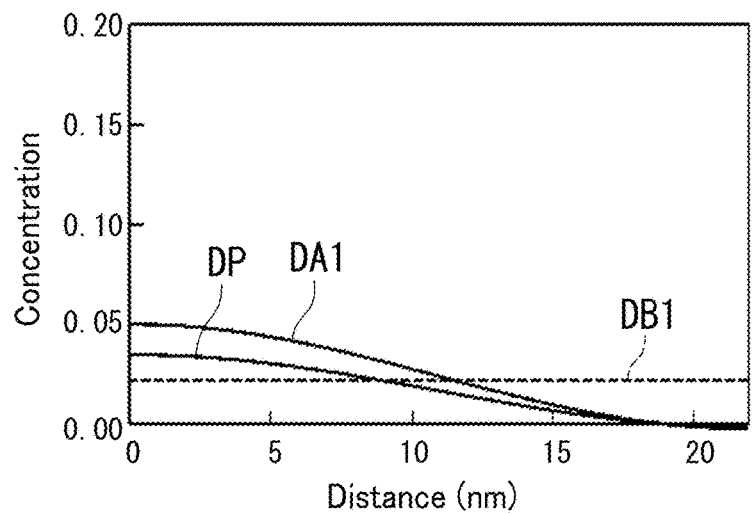
FIG. 14A is a schematic diagram illustrating a concentration distribution of an acid, a concentration distribution of a base, and a concentration distribution of a sensitizer each in a resist layer in the pattern exposer.

FIG. 14A is a schematic diagram illustrating a concentration distribution DA1 of an acid Ac1, a concentration distribution DP of a sensitizer Ps, and a concentration distribution DB1 of a base Ba1 each in the resist layer 10 in the pattern exposure L1. As illustrated in FIG. 14A, an acid Ac is generated from the acid generator PAG by the pattern exposure L1. Note that a sensitizer Ps is generated from the sensitizer precursor Pp by the pattern exposure L1 herein.

Figure 14B:
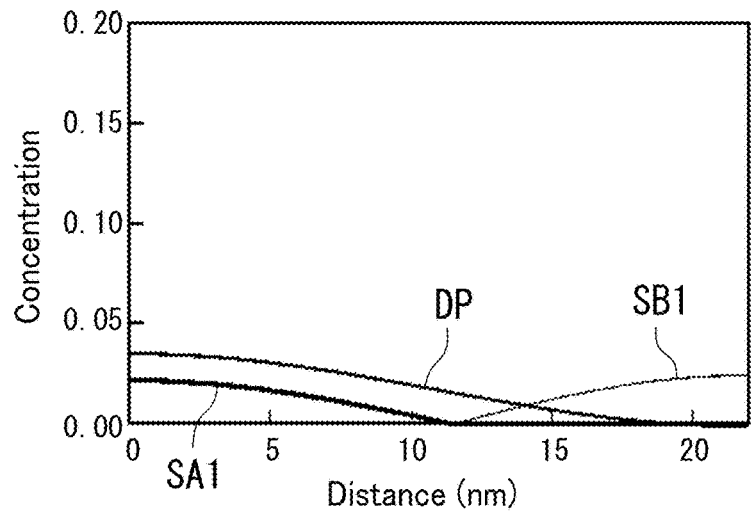
FIG. 14B is a schematic diagram of a concentration distribution of an acid and a concentration distribution of a base each remaining after neutralization between an acid and a base in the resist layer in the pattern exposure.

FIG. 14B is a schematic diagram illustrating a concentration distribution SA1 of an acid Ac and a concentration distribution SB1 of a base Ba each remaining after neutralization between the acid Ac1 and the base Ba1 in the resist layer 10 in the pattern exposure L1. The acid Ac and the base Ba generated in the resist layer 10 are neutralized with each other to be consumed. Therefore, only a component remains in the resist layer 10. The component herein is a difference obtained by subtracting a portion corresponding to the amount of the base Ba indicated in FIG. 14A from the generated acid Ac indicated in FIG. 14A. Accordingly, the acid Ac is present in the vicinity of the center of the region 10a.

Figure 14C:
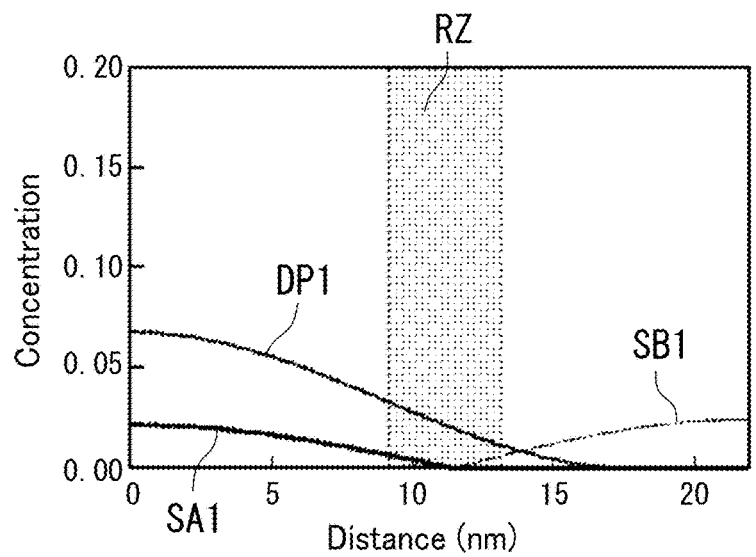
FIG. 14C is a schematic diagram illustrating a concentration distribution of a sensitizer generated in working with an acid by heating the resist layer after the pattern exposure.

FIG. 14C is a schematic diagram illustrating a concentration distribution DP1 of a sensitizer Ps generated in working with the acid Ac1 by heating the resist layer 10 after the pattern exposure L1. As illustrated in FIG. 14C, a sensitizer Ps is generated in working with the acid Ac by heating the resist layer 10. Specifically, the concentration distribution DP1 of the sensitizer Ps corresponds to a sum of the concentration distribution DP in FIG. 14A and the concentration distribution DP in FIG. 12C. Note that description about processes of the flood exposure L2 and thereafter is similar to those described above, and therefore is omitted. The sensitizer Ps is gendered by each of two steps in the resist pattern formation method described with reference to FIGS. 14A to 14C. This can achieve efficient generation of an acid Ac in presence of a high-concentration sensitizer Ps.

Note that the acid Ac and the base Ba react to be neutralized with each in the above description, which should not be taken to limit the present embodiment. A weak acid may be generated by reaction between the acid Ac and the base Ba. Furthermore, the generated weak acid preferably reacts with the sensitizer precursor Pp to generate a sensitizer Ps.

Next, a resist pattern formation method according to the present embodiment will be described with reference to FIGS. 15A to 17. This resist pattern formation method of the present embodiment is similar to the resist pattern formation method described with reference to FIGS. 1A to 1E in all aspects other than that the resist layer 10 further contains a weak base Ba in advance and that an acid Ac generated from the acid generator PAG reacts with the base Ba to generate a weak acid WA in the pattern exposure L1 to allow the weak acid WAc to react with the sensitizer precursor Pp, thereby generating a sensitizer Ps. As such, overlapping description may be appropriately omitted for avoiding redundancy.

Figure 15A:
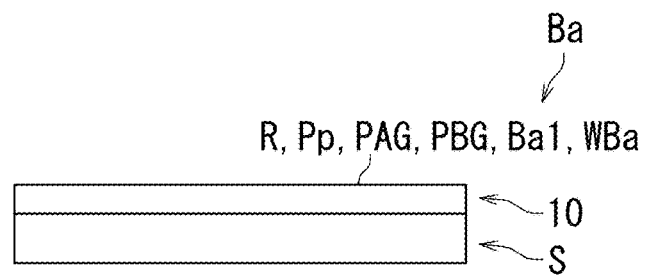
FIGS. 15A to 15E are schematic diagrams illustrating respective steps of a resist pattern formation method according to the embodiment.

First as illustrated in FIG. 15A, a resist layer 10 is formed on a substrate S. The resist layer 10 contains a base resin R, a sensitizer precursor Pp, an acid generator PAG, a base generator PBG, and a base Ba. Here, the base Ba includes a weak base WBa and a base Ba1 corresponding to a strong base.

The sensitizer precursor Pp generates a sensitizer. For example, the sensitizer precursor Pp may include at least one selected from the group consisting of 1,1-diphenyl-3-(2-naphthyl)propargyl alcohol, 1,1-diphenyl-3-phenylpropargyl alcohol, 1,1-diphenyl-3-parachlorophenylpropargyl alcohol, 1,1-diphenyl-3-paramethylphenylpropargyl alcohol, 1,1-diphenyl-3-paramethoxyphenylpropargyl alcohol, 1-phenyl-1-parachlorophenyl-3-phenylpropargyl alcohol, 1-phenyl-1-paramethylphenyl-3-phenylpropargyl alcohol, 1-phenyl-1-paramethoxyphenyl-3-phenylpropargyl alcohol, 1,1-diphenyl-3-[4-(trifluoromethyl)phenyl]propargyl alcohol, and derivatives of these. The following shows the structural formula of 1,1-diphenyl-3-(2-naphthyl)propargyl alcohol.

[Chemical formula 1]

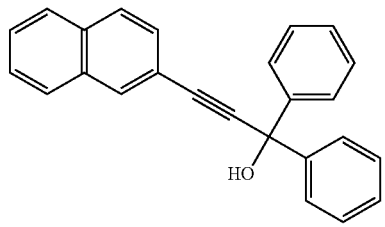

For example, a derivative of 1,1-diphenyl-3-(2-naphthyl) propargyl alcohol may be a compound in which a phenyl group and a naphthyl group of the 1,1-diphenyl-3-(2-naphthyl)propargyl alcohol are each replaced by any of various aromatic molecules such as another parachlorophenyl group, a paramethoxyphenyl group, or a (trifluoromethyl)phenyl group.

The weak base WBa exhibits weaker basicity than the base Ba1. In presence of the weak base WBa, outward diffusion of a weak acid WAc, which is generated by neutralization between the acid Ac and the base Ba, from the edges of the region 10a by the pattern exposure L1 can be inhibited.

Furthermore, the weak base WBa further generates a weak acid WAc1 in reaction with the acid Ac. This can prevent a situation in which a reaction following thermal diffusion of the acid Ac is caused to decrease resolution in a resist reaction.

The weak base WBa may include a photodecomposable base. The photodecomposable base may also be called a photodecompoable quencher (PDQ). For example, the base preferably includes at least one selected from the group consisting of sulfonium acetate, iodonium acetate, sulfonium salicylate, iodonium salicylate, o-nitrobenzylcyclohexyl carbamate, and o-nitrobenzyl-n-octyl carbamate.

Figure 15B:
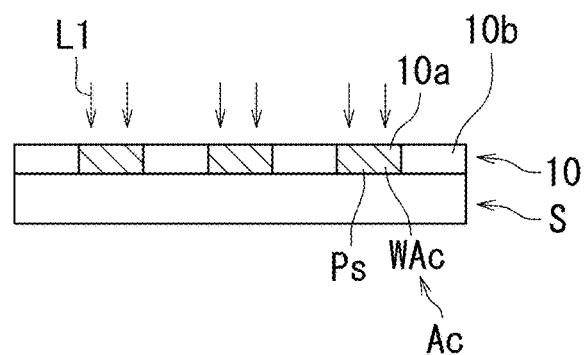

Next, the pattern exposure L1 is performed on the resist layer 10 as illustrated in FIG. 15B. The pattern exposure L1 supplies energy to each region 10a of the resist layer 10. In a case where a pattern in the pattern exposure L1 is fine in order to attain high resolution, an energy intensity distribution may be approximated with a sine wave. The composition in the resist layer 10 is excited or ionized by the energy supplied to the region 10a to create an active state, thereby finally generating a sensitizer Ps from the sensitizer precursor Pp in the resist layer 10.

Specifically, when the pattern exposure L1 is performed on the resist layer 10, the following reaction proceeds in the resist layer 10. As indicated in chemical equation (1) in FIG. 16, an acid Ac is first generated from the acid generator PAG. The concentration distribution of the acid Ac corresponds to an intensity distribution of the beams of the pattern exposure L1.

The acid Ac generated in the region 10a reacts with the sensitizer precursor Pp to generate a sensitizer Ps as indicated in chemical equation (2) in FIG. 16. Note that the concentration distribution of the sensitizer Ps generated due to presence of the acid Ac is also sharp.

Furthermore, the acid Ac reacts with the base Ba1 to generate a neutralized product Ne and a weak acid WAc as indicate in chemical equation (3a) in FIG. 16. The resist layer 10 contains the base Ba1 as described above, and accordingly, the acid Ac reacts with the base Ba1 to be neutralized, with a result that the concentration distribution of the acid Ac becomes sharp. For example, an acetic acid, a propionic acid, a cyclohexylcarboxylic acid, or a salicylic acid is generated as the weak acid WAc. Note that the weak acid WAc preferably has a relatively small diffusion coefficient.

Furthermore, the weak acid WAc reacts with the sensitizer precursor Pp to generate a sensitizer Ps as indicated in chemical equation (3b) in FIG. 16. Note that although not indicated in FIG. 16, the acid Ac may react with the weak base WBa to be neutralized therewith.

Thus, generation of a weak acid WAc (compound HZ) is done by a neutralization reaction between the acid Ac (compound HX) and the base Ba (compound AZ) besides acid generation from the acid generator PAG (AX). The weak acid WAc (compound HZ) causes an acid catalyst reaction of the sensitizer precursor Pp to generate a sensitizer Ps from the sensitizer precursor Pp. Unlike the acid Ac (compound HX), however, the weak acid WAc (compound HZ) does not cause a chemically amplified resist reaction such as polarity conversion of the base resin R.

Figure 15C:
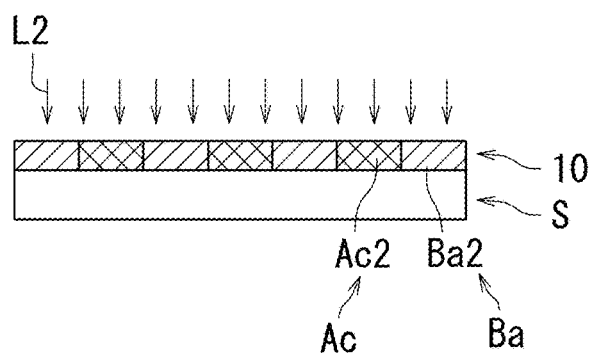
Figure 15D:
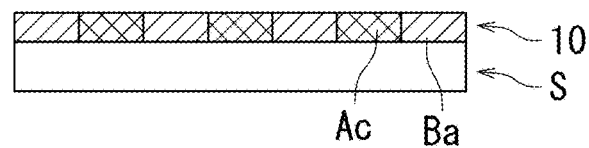
Figure 15E:
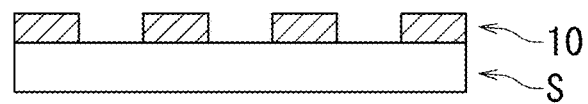

Thereafter, the flood exposure L2 is performed on the resist layer 10 as illustrated in FIG. 15C. The flood exposure L2 supplies energy to the entirety of the resist layer 10 in which the sensitizer Ps has been generated. For example, a time of flood exposure L2 is preferably within 1 minute, and more preferably within 30 seconds.

When the flood exposure L2 is performed, the sensitizer Ps transitions to an excited state. As indicated in FIG. 17, the acid generator PAG generates an acid Ac in presence of the sensitizer Ps in the excited state.

In this manner, an acid Ac is generated from the acid generator PAG in the region 10a when energy is supplied in the flood exposure L2. Note that even when the region 10b in which no sensitizer Ps has been generated is irradiated with the beams of the flood exposure L2, the acid generator PAG and the sensitizer precursor Pp in the region 10b do not substantially react. As described above, the concentration distribution of the sensitizer Ps generated by the pattern exposure L1 is sharp, and accordingly, the concentration distribution of the acid Ac generated from the acid generator PAG in presence of the sensitizer Ps can be sharp.

For example, the sensitizer Ps transitions to an excited state by the flood exposure L2. An acid Ac is generated from the acid generator PAG in the region 10a in presence of the sensitizer Ps. In generation of an acid Ac from the acid generator PAG in presence of the sensitizer Ps, electrons of the sensitizer Ps in the excited state move to the acid generator PAG. As a result, the acid generator PAG decomposes through a dissociative electron addition reaction, thereby newly generating an acid Ac and a sensitizer Ps that is in a state before the excited state. Note that description with reference to FIG. 15D and thereafter is similar to that with reference to FIG. 1D and thereafter, and therefore is omitted.

Change in the components in the resist layer 10 in the present embodiment will be described next with reference to FIGS. 15A to 18B. FIG. 18A is a schematic diagram illustrating a concentration distribution DA1 of an acid Ac and a concentration distribution DB1 of a base Ba each in the resist layer 10 in the pattern exposure L1. FIG. 18A also illustrates in combination a concentration distribution DP of a sensitizer Ps and a concentration distribution DWB of a weak base WBa in the resist layer 10 each in the pattern exposure L1.

As illustrated in FIG. 18A, an acid (strong acid) Ac is generated from the acid generator PAG and a sensitizer Ps is generated from the sensitizer precursor Pp by the pattern exposure L1. Note that the acid Ac reacts with the base Ba to generate a weak acid WAc.

The resist layer 10 before the pattern exposure L1 contains a base Ba1 and a weak base WBa each as the base Ba. In this case, the concentration distribution DB1 of the base Ba1 and the concentration distribution DWB of the weak base WBa each are level at a specific value regardless of the location. Here, the concentration of the weak base WBa is higher than the concentration of the base Ba1.

FIG. 18B is a schematic diagram illustrating a concentration distribution SA1 of a weak acid WAc and a concentration distribution SB1 of a base Ba each remaining after neutralization between the acid Ac1 and the base Ba1 in the resist layer 10 in the pattern exposure L1. FIG. 18B also illustrates in combination a concentration distribution DP of a sensitizer Ps and a concentration distribution SWB of a weak base WBa each remaining after neutralization.

The acid Ac and the base Ba1 generated in the resist layer 10 are neutralized with each other to be consumed. At this time, a weak acid WAc is generated. Furthermore, the acid Ac reacts with the sensitizer precursor Pp to generate a sensitizer Ps. Moreover, the weak acid WAc reacts with the sensitizer precursor Pp to generate a sensitizer Ps. In this connection, only a component remains in the resist layer 10.

The component herein is a difference obtained by subtracting a portion corresponding to the amount of the base Ba1 indicated in FIG. 18A from the generated acid Ac indicated in FIG. 18A. Accordingly, the acid Ac is present in the vicinity of the center of the region 10a.

Furthermore, the weak base WBa reacts with the acid Ac to be consumed. Moreover, where the weak base WBa is a photodecomposable base, the weak base WBa is consumed by the pattern exposure L1. Note that processes of the flood exposure L2 and thereafter are similar to those described above. Therefore, description of the processes of the flood exposure L2 and thereafter is omitted. In the present embodiment, a sensitizer Ps is generated through reaction between the sensitizer precursor Pp and not only the acid Ac but also a weak acid WAc generated by a reaction between the acid Ac and the base Ba. This can achieve generation of a sensitizer Ps at a high concentration with a result of efficient generation of an acid Ac.

Note that the base Ba includes not only the base Ba1 but also the weak base WBa in the present embodiment, which can suppress extension of polarity conversion of the base resin R by the acid Ac. In this connection, the resist layer 10 may contain no base generator PBG in the resist pattern formation method described with reference to FIGS. 15A to 18B.

Next, a resist pattern formation method according to the present embodiment will be described with reference to FIGS. 19A to 19F. This resist pattern formation method of the present embodiment is similar to the resist pattern formation method described with reference to FIGS. 1A to 1E in all aspects other than that the flood exposure L2 is performed twice. Therefore, overlapping description may be appropriately omitted for avoiding redundancy.

FIGS. 19A to 19F are schematic diagrams illustrating respective steps of the resist pattern formation method according to the present embodiment.

Figure 19A:
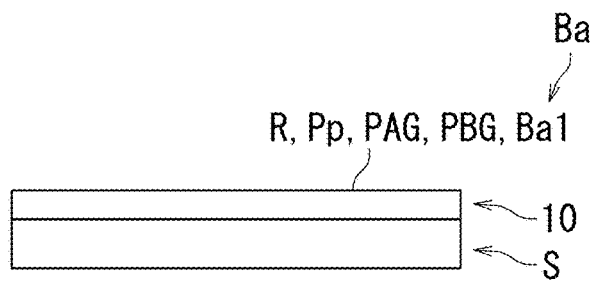
FIGS. 19A to 19F are schematic diagrams illustrating respective steps of a resist pattern formation method according to the embodiment.

First, a resist layer 10 is formed on a substrate S as illustrated in FIG. 19A. The resist layer 10 contains a base resin R, a sensitizer precursor Pp, an acid generator PAG, and a base generator PBG.

Figure 19B:
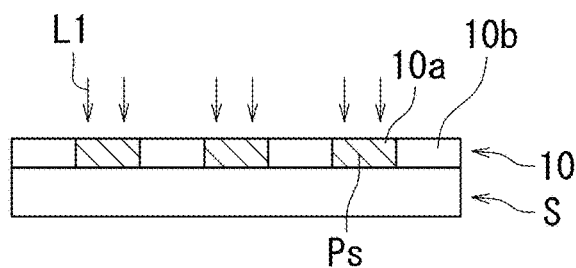

Next, the pattern exposure L1 is performed on the resist layer 10 as illustrated in FIG. 19B. The beams of the pattern exposure L1 are radiated on each of regions 10a of the resist layer 10 while not being radiated on each of regions 10b of the resist layer 10. As a result of the region 10a of the resist layer 10 being irradiated with the beams of the pattern exposure L1, a sensitizer Ps is generated from the sensitizer precursor Pp in the region 10a.

Figure 19C:
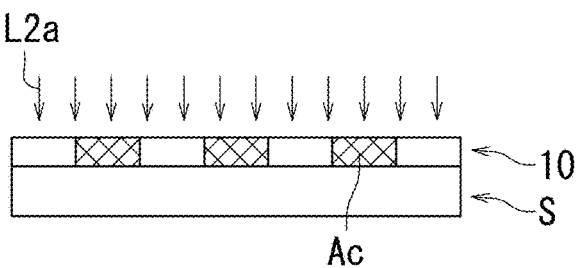

Thereafter, first flood exposure L2a is performed on the resist layer 10 as illustrated in FIG. 19C. As a result of the entirety of the resist layer 10 being irradiated with beams of the first flood exposure L2a, an acid Ac is generated from the acid generator PAG in presence of the sensitizer Ps. Note that once an acid Ac is generated until the acid generator PAG runs out, an acid Ac is no longer generated any more thereafter. The peak concentration of the acid is accordingly level across the region 10a. Finally, the concentration distribution of the acid Ac exhibits a significantly sharp change at a boundary between the region 10a and the region 10b.

Figure 19D:
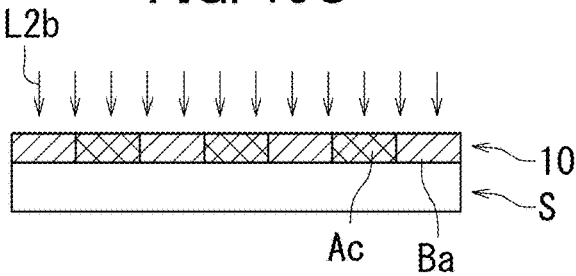

Thereafter, second flood exposure L2b is performed on the resist layer 10 as illustrated in FIG. 19D. As a result of the entirety of the resist layer 10 being irradiated with beams of the second flood exposure L2b, a base Ba is generated from the base generator PBG.

Figure 19E:
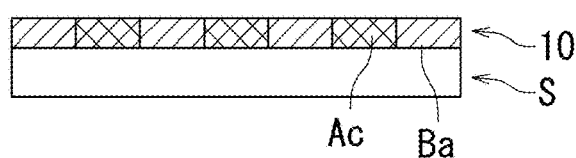

Thereafter, heat treatment is performed on the resist layer 10 as illustrated in FIG. 19E. The heat treatment may be pulse heat treatment, for example. The heat treatment causes an acid diffusion reaction. For example, the heat treatment is performed at a temperature of 100° C. or higher and 110° C. or lower. In addition, translation treatment for reversal between positive and negative may be performed on the resist layer 10 after the second flood exposure L2b or the heat treatment.

Figure 19F:
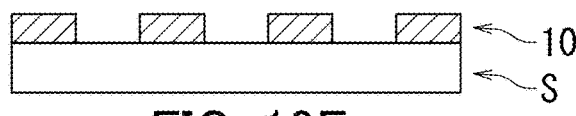

Thereafter, the resist layer 10 is developed as illustrated in FIG. 19F. Through development, the region 10a in which the acid Ac has been generated is removed. In the manner described above, the resist layer 10 having a pattern shape corresponding to the pattern in the pattern exposure L1 can be formed.

Note that a base Ba is generated from the base generator PBG by the second flood exposure L2b in the above description with reference to FIGS. 19A to 19F, which should not be taken to limit the present invention. A base Ba may be generated from the base generator PBG not only by the second flood exposure L2b but also by either or both the pattern exposure L1 and the first flood exposure L2a. Furthermore, the first flood exposure L2a and the second flood exposure L2b are performed as flood exposure in the above description with reference to FIGS. 19A to 19F, which should not be taken to limit the present invention. The second flood exposure L2b may be followed by third flood exposure by which an acid Ac is generated from the acid generator PAG in presence of the sensitizer Ps.

Note that a sensitizer Ps may be generated directly from the sensitizer precursor Pp by the pattern exposure L1 as described above. For example, sensitizers Ps having different absorption wavelengths or absorption coefficients may be generated in a manner in which structure conversion of the sensitizer precursor Pp is caused through excitation or ionization of the sensitizer precursor Pp by the pattern exposure L1. The structure conversion is change in conjugation length, decomposition, or cis-trans isomerization, for example. Alternatively, a sensitizer Ps may be generated by a reaction between the sensitizer precursor Pp and electrons generated through ionization of an inclusion of the resist layer 10 by the pattern exposure L1.

Alternatively, a sensitizer Ps may be generated through a reaction between the sensitizer precursor Pp and an acid Ac generated from the acid generator PAG by the pattern exposure L1.

As described above, the sensitizer precursor Pp may react with an acid Ac generated from the acid generator PAG by the pattern exposure L1 to generate a sensitizer Ps. In this case, it is possible that after a process 1 advances in which a sensitizer Ps is generated by the pattern exposure L1 through a reaction between the sensitizer precursor Pp and the acid Ac, a process 2 advances in which the sensitizer Ps in an excited state is reacted with the acid generator PAG by the flood exposure L2.

In the process 1, a sensitizer Ps is generated by the pattern exposure L1 through a reaction between the sensitizer precursor Pp and an acid Ac. Typically, when the sensitizer precursor Pp is present in the vicinity of an acid Ac as a result of diffusion of the acid Ac in the resist layer, the acid Ac reacts with the sensitizer precursor Pp to generate a sensitizer Ps from the acid Ac and the sensitizer precursor Pp. The process 1 advances through diffusion of the acid Ac in this manner. The diffusion length significantly changes depending on for example a base concentration, the size of acid molecules, the temperature, and the glass transition temperature Tg of a resist. Typically, the higher the temperature is, the longer the diffusion length of the acid Ac is. For example, the diffusion length of the acid Ac is relatively long at a temperature higher than the glass transition temperature Tg of the base resin. The process 1 is a reaction followed by thermal diffusion of the acid Ac as described above, and may involve a reaction between the acid Ac and the sensitizer precursor Pp even in a region away from a region in which the acid Ac has been generated.

Furthermore, the process 2 typically involves generation of an acid Ac by a reaction of the excited sensitizer Ps with the acid generator PAG. As above, the process 2 is a photochemical reaction that causes for example electron transfer or energy transfer, and accordingly involves a three-dimensional high-isotropic reaction in a relatively short distance from the excited sensitizer Ps.

Roughness performance and photon shot noise in the process 1 and the process 2 will be studied herein. In particular, in a case where a reaction is allowed to proceed with a small amount of photons performance, roughness performance resulting from photon shot noise may be clearly perceivable. In order to inhibit roughness performance resulting from photon shot noise, the reaction distance is preferably short in both the process 1 and the process 2. Note that in comparison between the process 1 and the process 2, dispersion in reaction length is likely to be caused in the process 1 following thermal diffusion. In particular, when the concentration of the acid Ac is relatively low, roughness performance is likely to be caused that results from photon shot noise following diffusion in the reaction in the process 1. Therefore, as long as the reaction that generates a sensitizer Ps from the acid Ac and the sensitizer precursor Pp advances efficiently in the process 1, the temperature is preferably set relatively low to make the diffusion length of the acid Ac relatively short so that the roughness performance resulting from photon shot noise can be inhibited. Preferably, the pattern exposure L1 is performed in consideration of for example temperature dependency of diffusion of the acid Ac and temperature dependency of the reaction that generates a sensitizer Ps from the acid Ac and the sensitizer precursor Pp.

Preferably, the concentration of the acid generator PAG is set high in the process 2 in a manner to select an acid generator PAG and a sensitizer Ps that is to be excited three-dimensionally and highly isotropically so that an acid Ac is efficiently generated in association with electron transfer or energy transfer to the acid generator PAG from the sensitizer Ps in an excited state. Furthermore, setting a ratio in the process 2 larger than that in the process 1 is effective in reducing roughness performance resulting from photon shot noise. As such, it is preferable in the pattern exposure L1 and the flood exposure L2 to shorten the diffusion length of the acid Ac in the reaction between the acid Ac and the sensitizer precursor Pp and shorten the reaction length of electron transfer or energy transfer from the excited sensitizer Ps to the acid generator PAG. Furthermore, a degree of contribution of the reaction that generates an acid Ac through three-dimensional high-isotropic electron transfer or energy transfer is preferably made higher than that of contribution to a reaction caused along random diffusion paths of the acid Ac and the like. Through any of the above manners, roughness performance resulting from photon shot noise in a resist pattern can be reduced.

Note that in generation of a sensitizer Ps through reaction of the sensitizer precursor Pp with an acid Ac generated from the acid generator PAG by the pattern exposure L1, it is preferable that the sensitizer precursor Pp not only serves as a reactant for generating the sensitizer Ps but also has a function to amplify the reaction that generates an acid Ac from the acid generator PAG. In this case, the sensitizer precursor Pp contributes to improvement in sensitivity and contrast. Examples of the sensitizer precursor Pp such as above include acetals, ketals, and hemiacetals (semiketals). A more specific example of the sensitizer precursor Pp is dimethoxy bis(4-methoxyphenyl)methane (DOBzMM) that is a dimethoxybenzhydrol derivative. The aromatic moiety of DOBzMM has a benzene ring structure. Note that the sensitizer precursor Pp is for example an acetal, a ketal, or a hemiacetal (semiketal) that has a structure of a polycyclic aromatic hydrocarbon such as naphthalene or anthracene, or an aromatic molecule including a hetero atom, such as thioxanthone. Note that in the pattern exposure L1, the sensitizer precursor Pp preferably has either or both a function to amplify the reaction that generates a sensitizer Ps from the sensitizer precursor Pp and a function to amplify the reaction that generates an acid Ac from the acid generator PAG.

Note that the diffusion coefficient of the acid Ac and the diffusion coefficient of the base component Bo are almost equal to each other in the above description and the description does not mention diffusion of either the acid Ac or the base component Bo in the region 10a irradiated with the beams of the pattern exposure L1, which should not be taken to limit the present invention. The diffusion coefficient of the acid Ac may be larger than the diffusion coefficient of the base component Bo. Alternatively, the diffusion coefficient of the acid Ac may be smaller than the diffusion coefficient of the base component Bo.

Note that in the above description, a sensitizer Ps is generated through the reaction between the sensitizer precursor Pp and an acid Ac generated from the acid generator PAG by the pattern exposure L1 and the resist layer 10 before the pattern exposure L1 contains the base component Bo, which should not be taken to limit the present invention. It is possible that a sensitizer Ps is generated from the sensitizer precursor Pp in the resist layer 10 via radicals generated by the pattern exposure L1 and the resist layer 10 before the pattern exposure L1 contains a radical scavenging component Rk.

The following describes a resist pattern formation method according to the present embodiment with reference to FIGS. 20A to 20E. This resist pattern formation method of the present embodiment is similar to the resist pattern formation method described with reference to FIGS. 1A to 1E in all aspects other than that the resist layer 10 before the pattern exposure L1 contains a radical scavenging component Rk. Therefore, overlapping description may be appropriately omitted for avoiding redundancy. Note that in the present embodiment, the sensitizer precursor Pp in the resist layer 10 is of alcohol type and a sensitizer Ps is generated from the sensitizer precursor Pp via radicals generated by the pattern exposure L1.

FIGS. 20A to 20E are schematic diagrams illustrating respective steps of the resist pattern formation method according to the present embodiment.

Figure 20A:
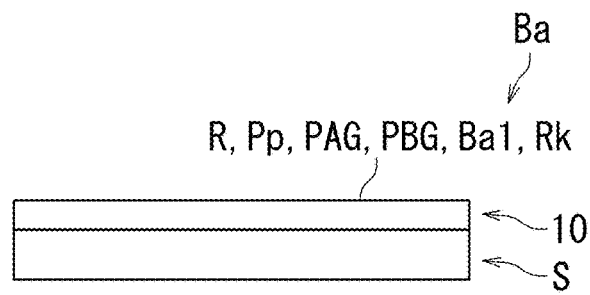
FIGS. 20A to 20E are schematic diagrams illustrating respective steps of a resist pattern formation method according to the embodiment.

First, a resist layer 10 is formed on a substrate S as illustrated in FIG. 20A. The resist layer 10 contains a base resin R, a sensitizer precursor Pp, an acid generator PAG, a base generator PBG, and a radical scavenging component Rk.

For example, a radical inhibiter or a radical scavenger such as hindered phenol is used as the radical scavenging component Rk. Note that the radical scavenging component Rk may be mixed with the base resin R. Alternatively, the radical scavenging component Rk may be bonded to another component in the resist layer 10. For example, the radical scavenging component Rk is bonded to the base resin R. Where a polyhydroxystyrene resin (PHS resin) is used as the base resin R, the PHS resin can function as a radical scavenger.

Figure 20B:
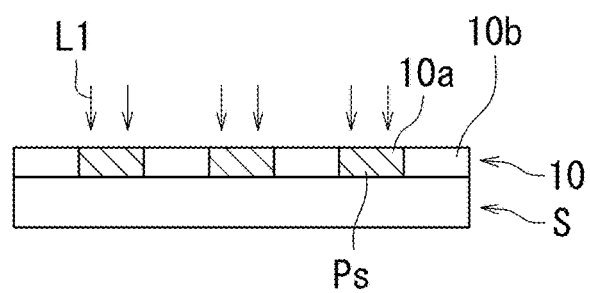

Next, the pattern exposure L1 is performed on the resist layer 10 as illustrated in FIG. 20B. The beams of the pattern exposure L1 are radiated on each of regions 10a of the resist layer 10 while not being radiated on each of regions 10b of the resist layer 10.

Before the pattern exposure L1 is performed, the concentrations of the acid generator PAG, the sensitizer precursor Pp, and the radical scavenging component Rk each are level regardless of the location in the resist layer 10. Note that the concentration of the radical scavenging component Rk is relatively low as compared to those of the acid generator PAG and the sensitizer precursor Pp.

Once the pattern exposure L1 starts, radicals are generated in the region 10a and a sensitizer Ps is generated from the sensitizer precursor Pp via the radicals. Here, the resist layer 10 contains the radical scavenging component Rk and a portion of the generated radicals is accordingly scavenged by the radical scavenging component Rk. This makes the concentration distribution of the sensitizer Ps sharper than that in a case where the resist layer 10 contains no radical scavenging component Rk.

Figure 20C:
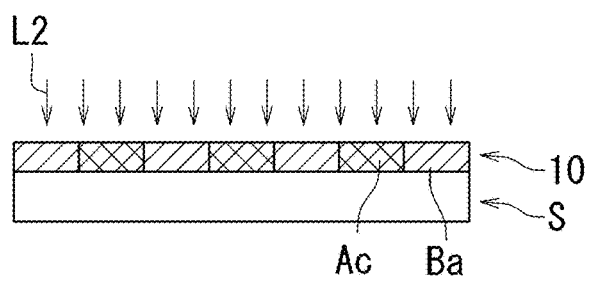

Next, the flood exposure L2 is performed on the resist layer 10 as illustrated in FIG. 20C. Since the concentration distribution of the sensitizer Ps generated by the pattern exposure L1 is sharp, the concentration distribution of an acid Ac generated from the acid generator PAG in presence of the sensitizer Ps can be made sharp.

Figure 20D:
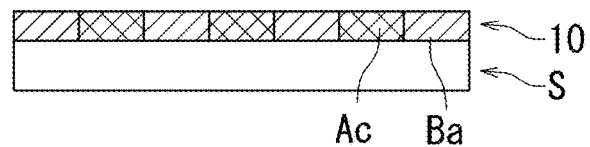

Thereafter, heat treatment is performed on the resist layer 10 as illustrated in FIG. 20D. The heat treatment may be pulse heat treatment, for example. The heat treatment causes an acid diffusion reaction. For example, the heat treatment is performed at a temperature of 100° C. or higher and 110° C. or lower. In addition, translation treatment for reversal between positive and negative may be performed on the resist layer 10 after the flood exposure L2 or the heat treatment.

Figure 20E:
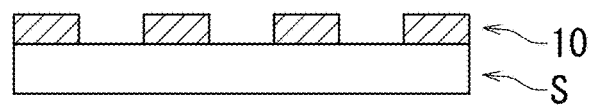

Thereafter, the resist layer 10 is developed as illustrated in FIG. 20E. As a result of a small amount of the radical scavenging component Rk being added to the resist layer 10 in advance as described above, contrast and resolution can be improved and generation of a small amount of an acid in association with radiation of stray light or out-of-band light on the region 10b can be inhibited. Thus, resist performance can be improved.

Note that the resist material contains the radical scavenging component Rk in the above description with reference to FIGS. 20A to 20E, which should not be taken to limit the present invention. The resist material may contain both the base component Bo and the radical scavenging component Rk.

Furthermore, although the resist layer 10 may contain a radical generating component besides the acid generator PAG as described above, the acid generator PAG and the radical generating component may be the same component. In this case, an acid generator PAG and a sensitizer Ps are generated by the flood exposure L2. The above reaction includes a reaction in association with radical generation.

Therefore, the resist layer 10 preferably contains the radical scavenging component Rk as described above. Furthermore, the resist layer 10 may contain a radical inhibitor generator that generates a radical scavenging component by exposure (e.g., flood exposure).

Furthermore, the resist layer 10 is exposed while in direct contact with the air in the above description with reference to FIGS. 1A to 20E, which should not be taken to limit the present invention. A top coat layer may be provided on the surface of the resist layer 10. Alternatively or additionally, an underlying layer may be provided between the resist layer 10 and the substrate S.

The following describes a resist pattern formation method according to the present embodiment with reference to FIGS. 21A to 21E. This resist pattern formation method of the present embodiment is similar to the resist pattern formation method described with reference to FIGS. 1A to 1E in all aspects other than that a top coat layer T is additionally formed on the surface of the resist layer 10. Therefore, overlapping description may be appropriately omitted for avoiding redundancy.

Figure 21A:
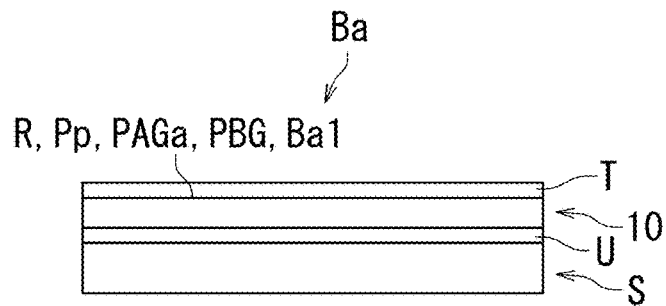
FIGS. 21A to 21E are schematic diagrams illustrating respective steps of a resist pattern formation method according to the embodiment.

First, an underlying layer U is formed on a substrate S as illustrated in FIG. 21A. The underlying layer is formed from a commercially available inorganic or organic material, for example.

Next, a resist layer 10 is formed on the underlying layer U. The resist layer 10 contains a base resin R, a sensitizer precursor Pp, an acid generator PAG, and a base generator PBG.

Next, a top coat layer T is formed on the surface of the resist layer 10. The top coat layer T blocks invasion of either or both a basic substance and oxygen upon the resist layer 10. Preferably, the top coat layer T transmits the beams of the pattern exposure L1 and the beams of the flood exposure L2 and blocks beams of out-of-band light as far as possible.

In a case where the sensitizer precursor Pp is of for example acetal type, the top coat layer T preferably does not allow a basic compound to permeate therethrough in order to inhibit acid deactivation. Furthermore, in a case where the sensitizer precursor Pp is of for example alcohol type, the top coat layer T is formed from a crosslinked polymer film that does not transmits oxygen or a macromolecule film containing a substance reactive with oxygen, such as hydroquinone or 3,5-dibutyl-4-hydoxyltoluene. The thickness of the top coat layer T is determined according to a beam source of the pattern exposure L1. In a case where for example EUV is used as the beam source, the thickness of the top coat layer T is preferably at least 20 nm and no greater than 50 nm because of large energy loss of the EUV on the top coat layer T. Alternatively, in a case where EB are used as the beam source, the thickness of the top coat layer is preferably no greater than 50 nm although it depends on the energy of the EB. Furthermore, in a case where ArF or KrF is used as the beam source, the top coat layer T is preferably transparent to the beams and may have a thickness of at least 20 nm and no greater than 200 nm.

Figure 21B:
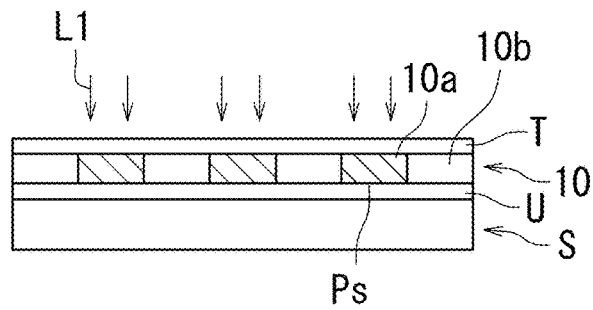

Next, the pattern exposure L1 is performed on the resist layer 10 through the top coat layer T as illustrated in FIG. 21B. The pattern exposure L1 generates a sensitizer Ps in regions 10a as described above.

Figure 21C:
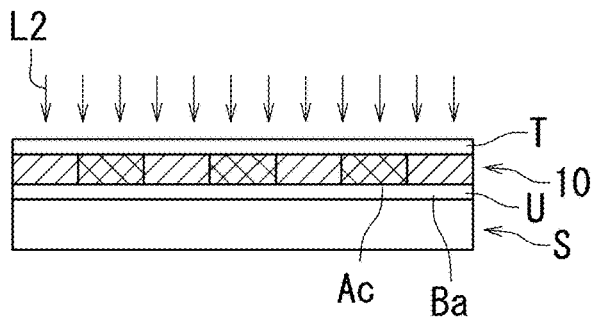

Next, the flood exposure L2 is performed on the resist layer 10 through the top coat layer T as illustrated in FIG. 21C. The flood exposure L2 generates an acid Ac in each region 10a and generates a base Ba in regions 10b as described above.

Figure 21D:
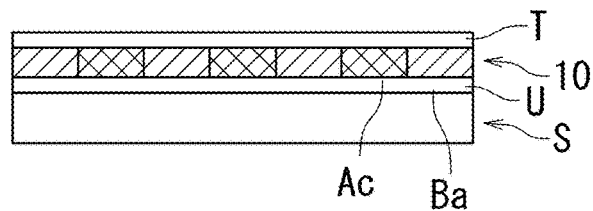

Thereafter, heat treatment is performed on the resist layer 10 as illustrated in FIG. 21D. The heat treatment may be pulse heat treatment, for example. The heat treatment causes an acid diffusion reaction. For example, the heat treatment is performed at a temperature of 100° C. or higher and 110° C. or lower. In addition, translation treatment for reversal between positive and negative may be performed on the resist layer 10 after the flood exposure L2 or the heat treatment.

Figure 21E:
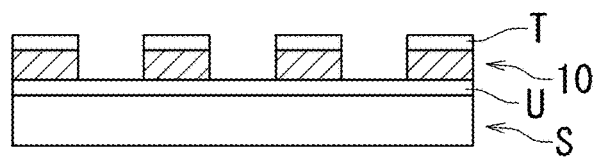

Subsequently, the resist layer 10 is developed as illustrated in FIG. 21E. Through development, the region 10a in which an acid Ac has been generated (region in which a latent image has been formed) is resolved in a developer to be removed. In this manner, the resist layer 10 having a pattern shape corresponding to the pattern in the pattern exposure L1 can be formed. Note that the top coat layer T on the resist layer 10 may be removed as necessary after the pattern exposure L1 or the flood exposure L2. As a result of the top coat layer T being provided, unintentional invasion of either or both a basic substance and a radical scavenging component upon the resist layer 10 can be inhibited during the pattern exposure L1 or the flood exposure L2, thereby achieving further improvement in resist performance of the resist layer 10.

Note that the top coat layer T is provide on the resist layer 10 and the underlying layer U is provided below the resist layer 10 in the description with reference to FISG. 21A t 21E, which should not be taken to limit the present invention. The underlying layer U may be arranged below the resist layer 10 without the top coat layer T being provided. Alternatively, the top coat layer T may be provided on the resist layer 10 without the underlying layer U being provided.

Furthermore, the underlying layer U preferably functions as an anti-reflection film against the beams of the flood exposure L2. An optimal thickness of the underlying layer U is determined according to the wavelength of the beams of the flood exposure L2.

The pattern exposure and the flood exposure in the above-described resist pattern formation methods are favorably performed using a resist latent image forming apparatus. The following describes a resist latent image forming apparatus 200 favorably used in the resist pattern formation methods of the present embodiment with reference to FIG. 22.

The resist latent image forming apparatus 200 includes a pattern exposure machine 210 and a flood exposure machine 220. The pattern exposure machine 210 performs pattern exposure on a resist layer 10 formed on a substrate S. As described above, the resist layer 10 contains a base resin, a sensitizer precursor, an acid generator, and a base generator. Note that the resist layer 10 may be formed directly on the substrate S or on the substrate S with another layer therebetween. The pattern exposure L1 by the pattern exposure machine 210 generates a sensitizer from the sensitizer precursor in the resist layer 10. Thereafter, the flood exposure machine 220 performs the flood exposure L2 on the resist layer 10 to form a pattern latent image. The flood exposure L2 by the flood exposure machine 220 generates an acid from the acid generator in presence of the sensitizer and generates a base from the base generator.

The pattern exposure machine 210 includes a chamber 212 and a pattern light source 214. The chamber 212 is capable of accommodating the resist layer 10 formed on the substrate S. Preferably, the atmosphere inside the chamber 212 is an inert gas atmosphere, an active gas atmosphere, or a vacuum atmosphere. The active gas atmosphere includes hydrogen gas under controlled partial pressure, for example.

Preferably, the chamber 212 is capable of controlling the temperature of the accommodated substrate S in a rage from ~10° C. to 100° C.

The pattern light source 214 irradiates the resist layer 10 in the chamber 212 with beams in the form of a pattern. The beams of the pattern light source 214 are electromagnetic waves such as visible light, UV, deep ultraviolet (DUV), or EUV. Alternatively, the beams of the pattern light source 214 may be electron beams or ion beams. For example, the pattern light source 214 includes an ion beam irradiation section, an electron beam irradiation section, or an electromagnetic wave irradiation section.

In a case where an EUV light source is used as the light source of the pattern exposure L1, EUV preferably has a wavelength of 1 nm or longer and 13.5 nm or shorter, and further preferably 6 nm or longer and 13.5 nm or shorter. Alternatively, in a case where electron beams are used as the beams of the pattern exposure L1, the electron beams preferably has an acceleration energy of at least 10 keV and no greater than 300 keV, and further preferably at least 40 keV and no greater than 130 keV.

Here, after the pattern exposure machine 210 performs the pattern exposure on the resist layer 10 formed on the substrate S, the substrate S is conveyed from the pattern exposure machine 210 to the flood exposure machine 220. During conveyance of the substrate S from the pattern exposure machine 210 to the flood exposure machine 220, the atmosphere inside the resist latent image forming apparatus 200 is preferably an inert gas atmosphere, an active gas atmosphere, or a vacuum atmosphere. In order to inhibit occurrence of acid deactivation during the time from the pattern exposure to PEB, it is preferable that the atmosphere in the resist latent image forming apparatus 200 is strictly controlled for example using a basic compound eliminating filter. This can inhibit decay of activation of the resist layer 10 that has been caused by the pattern exposure machine 210. Preferably, the chamber 222 is capable of controlling the temperature of the substrate S accommodated therein in a range from ~10° C. to 100° C.

The flood exposure machine 220 includes a chamber 222 and a flood light source 224. The chamber 222 is capable of accommodating the resist layer 10 formed on the substrate S. Preferably, the atmosphere inside the chamber 222 is an inert gas atmosphere, an active gas atmosphere, or a vacuum atmosphere.

The flood light source 224 irradiates the resist layer 10 in the chamber 222 with beams to form a pattern latent image. The beams of the flood exposure L2 are for example electromagnetic waves such as visible light or UV. The beams of the flood exposure L2 are reflected by mirrors to be introduced into the chamber 222 in FIG. 22. For example, the flood light source 224 includes an ion beam irradiation section, an electron beam irradiation section, or an electromagnetic wave irradiation section.

The flood exposure machine 220 may further includes a mechanism for forming beams into the shape of an area. For example, the flood exposure machine 220 includes a projection lens system and a blocking mask. However, the flood exposure machine 220 may include only the blocking mask while including no projection lens system. Provision of only the blocking mask out of the blocking mask and the projection lens system can simplify the configuration of the flood exposure machine 220, which is favorable.

As described above, after the pattern light source 214 irradiates a region in an area of the resist layer 10 with the beam in the form of a pattern, the flood light source 224 irradiates the entirety of the area with the beams to form a specific pattern latent image in the resist layer 10. The pattern light source 214 is a pattern irradiation source that radiates beams in the form of a pattern, whereas the flood light source 224 is an area irradiation source.

After the pattern latent image is formed in the resist layer 10, the resist layer 10 may be developed in a non-illustrated development machine. Through development, the resist layer 10 having the specific pattern emerges.

Note that it is preferable that an example of the resist latent image forming apparatus 200 further includes a coating and developing machine (not illustrated herein) in addition to the pattern exposure machine 210 including the pattern light source 214 and the flood exposure machine 220 including the flood light source 224. In a case where the resist latent image forming apparatus 200 includes a coating and developing machine, the resist latent image forming apparatus 200 performs pattern formation on the resist layer 10 in the following manner. First, the coating and developing machine forms an underlying layer on the substrate S by spin coating and bakes the underlying layer.

Next, the coating and developing machine coats the resist layer 10 on the underlying layer, and prebakes the resist layer 10. Note that another layer may be additionally formed on the resist layer 10 by spin coating and prebaked as necessary.

Subsequently, the pattern light source 214 of the pattern exposure machine 210 irradiates the resist layer 10 with the beams. Thereafter, the flood light source 224 of the flood exposure machine 220 irradiates the resist layer 10 with the beams. Through the above, a pattern latent image is formed in the resist layer 10.

Next, the coating and developing machine performs postbaking. The coating and developing machine then develops the resist layer 10. Through the above processes, a resist layer 10 having a specific pattern shape is formed. Next, the coating and developing machine rinses the resist layer 10 with pure water and then performs post baking (drying). In a manner described above, a pattern can be formed in the resist layer 10.

Note that conveyance of the substrate S among the coating and developing machine, a site where the resist layer 10 is activated, and a site where a pattern latent image is formed in the resist layer 10 is preferably performed in a specific inert gas atmosphere, a specific active gas atmosphere, or a specific vacuum atmosphere. A stage having a temperature adjusting function is favorably used as a conveyance member.

Furthermore, the coating and developing machine may be disposed inside the chamber 212 of the pattern exposure machine 210 or disposed inside the chamber 222 of the flood exposure machine 220. Alternatively, the coating and developing machine may be disposed inside a chamber shared by the pattern exposure machine 210 and the flood exposure machine 220.

Figure 22:
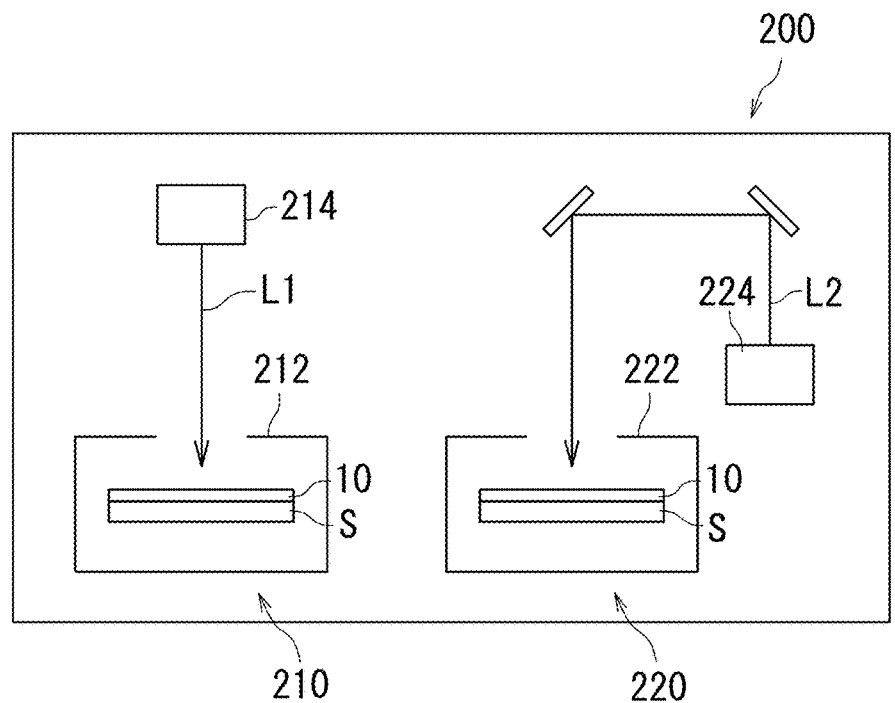
FIG. 22 is a schematic diagram illustrating a resist latent image forming apparatus favorably used in the embodiment.

The beams emitted from the pattern light source 24 is radiated in the chamber 212 whereas the beams emitted from the flood light source 224 different from the pattern light source 214 is radiated in the chamber 222 in the above description with reference to FIG. 22, which should not be taken to limit the present invention.

Moreover, the substrate S is once taken out of the chamber 212 after activation of the resist layer 10 formed on the substrate S, and then conveyed to the chamber 222 in the above description with FIG. 22, which should not be taken to limit the present invention. The substrate S may be conveyed from the chamber 212 to the chamber 222 through a communication path through which the chamber 212 and the chamber 222 communicates with each other.

Further, the pattern exposure machine 210 and the flood exposure machine 220 respectively include the chamber 212 and the chamber 222 in the above description with reference to FIG. 22, which should not be taken to limit the present invention. The pattern exposure machine 210 and the flood exposure machine 220 may share a single chamber.

Furthermore, the resist latent image forming apparatus 200 described with reference to FIG. 22 includes a single flood exposure machine 220 in the description with reference to FIG. 22, which should not be taken to limit the present invention. The resist latent image forming apparatus 200 may include a plurality of flood exposure machines that emit beams having different wavelengths. Alternatively, the single flood exposure machine may emit different beams.

Figure 23:
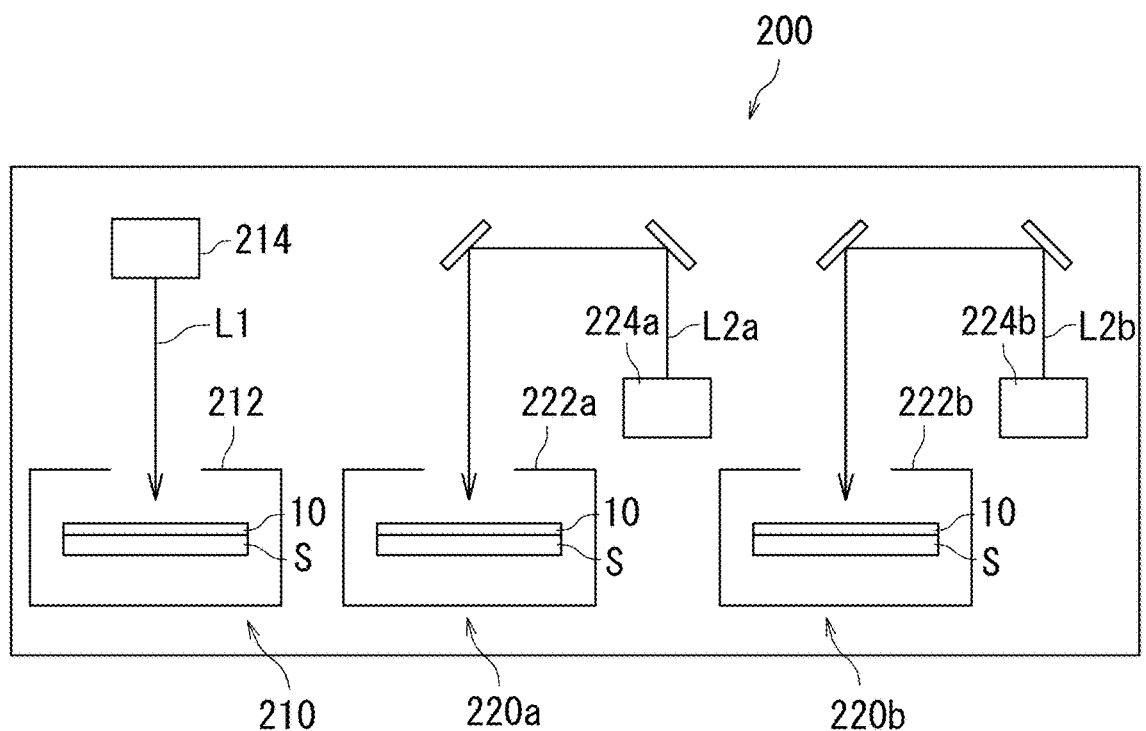
FIG. 23 is a schematic diagram illustrating a resist latent image forming apparatus favorably used in the embodiment.

The following describe a resist latent image forming apparatus 200 with reference to FIG. 23. This resist latent image forming apparatus 200 has a configuration similar to that of the resist latent image forming apparatus 200 described above with reference to FIG. 22 in all aspects other than inclusion of two flood exposure machines. Therefore, overlapping description may be appropriately omitted for avoiding redundancy.

The resist latent image forming apparatus 200 includes a pattern exposure machine 210, a first flood exposure machine 220a, and a second flood exposure machine 220b. After the pattern exposure machine 210 performs the pattern exposure L1 on a resist layer 10 formed on a substrate S, the first flood exposure machine 220a performs first flood exposure L2a on the resist layer 10, and the second flood exposure machine 220b performs second flood exposure L2b on the resist layer 10, thereby forming a pattern latent image.

The pattern exposure machine 210 includes a chamber 212 and a pattern light source 214. The pattern light source 214 irradiates the resist layer 10 in the chamber 212 with beams in the form of a pattern. The beams of the pattern light source 214 are electromagnetic waves such as visible light, UV, DUV, or EUV. Alternatively, the beams of the pattern light source 214 may be electron beams or ion beams.

The first flood exposure machine 220a includes a chamber 222a and a first flood light source 224a. The chamber 222a is capable of accommodating the resist layer 10 formed on the substrate S. Preferably, the atmosphere inside the chamber 222a is an inert gas atmosphere, an active gas atmosphere, or a vacuum atmosphere.

After the pattern exposure machine 210 performs the pattern exposure on the resist layer 10 formed on the substrate S, the substrate S is conveyed from the pattern exposure machine 210 to the first flood exposure machine 220a. During conveyance of the substrate S from the pattern exposure machine 210 to the first flood exposure machine 220a, the atmosphere inside the resist latent image forming apparatus 200 is preferably an inert gas atmosphere, an active gas atmosphere, or a vacuum atmosphere.

The first flood light source 224a irradiates the resist layer 10 in the chamber 222a with beams of the first flood exposure L2a. The beams emitted from the first flood light source 224a radiate the entirety of an area in the resist layer 10. The beams of the first flood exposure L2a are electromagnetic waves such as visible light or UV, for example. The beams of the first flood exposure L2a are reflected by mirrors to be introduced into the chamber 222a in FIG. 23.

After the first flood exposure machine 220a performs the first flood exposure L2a on the resist layer 10 formed on the substrate S, the substrate S is conveyed from the first flood exposure machine 220a to the second flood exposure machine 220b. During conveyance of the substrate S from the first flood exposure machine 220a to the second flood exposure machine 220b, the atmosphere inside the resist latent image forming apparatus 200 is preferably an inert gas atmosphere, an active gas atmosphere, or a vacuum atmosphere.

The second flood exposure machine 220b includes a chamber 222b and a second flood light source 224b. The chamber 222b is capable of accommodating the resist layer 10 formed on the substrate S. Preferably, the atmosphere inside the chamber 222b is an inert gas atmosphere, an active gas atmosphere, or a vacuum atmosphere.

The second flood light source 224b irradiates the resist layer 10 in the chamber 222b with beams of the second flood exposure L2b to form a pattern latent image. The beams emitted from the second flood light source 224b radiate the entirety of an area in the resist layer 10. The beams of the second flood exposure L2b are electromagnetic waves such as visible light or UV, for example. The beams of the second flood exposure L2b are also reflected by mirrors to be introduced into the chamber 222 in FIG. 23.

Note that the wavelength of the beams emitted by the second flood light source 224b are preferably longer than the wavelength of the beams emitted by the first flood light source 224a. However, the wavelength of the beams emitted by the second flood light source 224b may be shorter than the wavelength of the beams emitted by the first flood light source 224a.

After the pattern latent image is formed in the resist layer 10, the resist layer 10 may be developed in a non-illustrated developing machine. Through development, the resist layer 10 having the specific pattern emerges.

Note that the first flood exposure machine 220a and the second flood exposure machine 220b that differ from each other perform different types of flood exposure in the above description with reference to FIG. 23, which should not be taken to limit the present invention. Both the first flood exposure L2a and the second flood exposure L2b may be performed by a single flood light source of a flood exposure machine.

Figure 24:
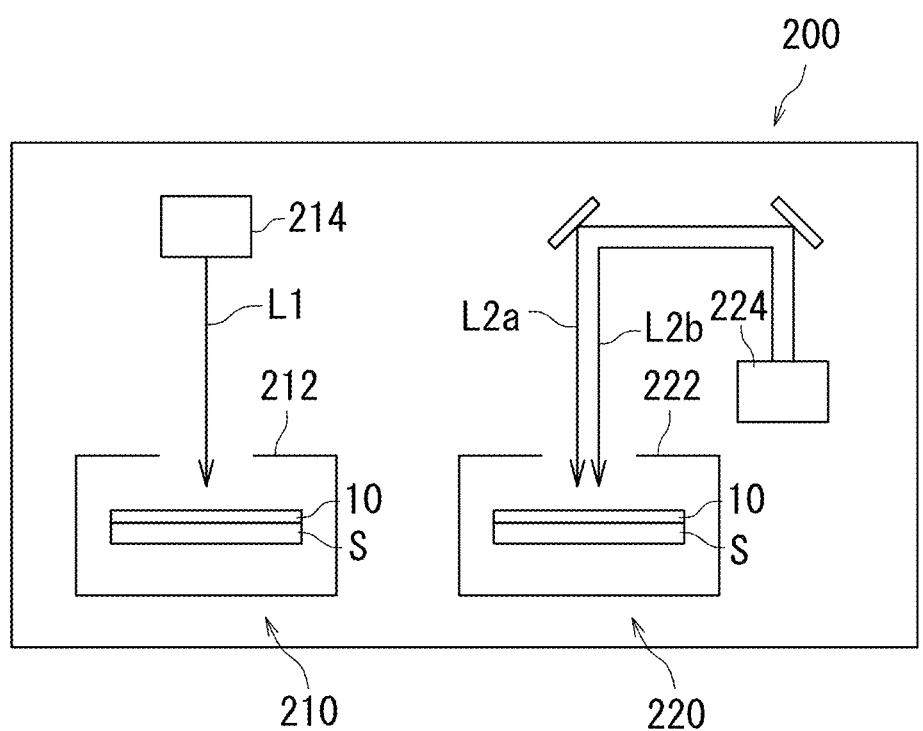
FIG. 24 is a schematic diagram illustrating a resist latent image forming apparatus favorably used in the embodiment.

The following describes a resist latent image forming apparatus 200 with reference to FIG. 24. This resist latent image forming apparatus 200 has a configuration similar to that of the resist latent image forming apparatus 200 described with reference to FIG. 23 in all aspects other than that a single flood light source 224 in a flood exposure machine 220 performs both the first flood exposure L2a and the second flood exposure L2b. Therefore, overlapping description may be appropriately omitted for avoiding redundancy.

The flood exposure machine 220 includes a chamber 222 and a flood light source 224. The chamber 222 is capable of accommodating a resist layer 10 formed on a substrate S. Preferably, the atmosphere inside the chamber 222 is an inert gas atmosphere, an active gas atmosphere, or a vacuum atmosphere.

The flood light source 224 irradiates the resist layer 10 in the chamber 222 with beams of the flood exposure L2 to form a pattern latent image. The beams of the flood exposure L2 are electromagnetic waves such as visible light or UV, for example.

Here, the flood exposure machine 220 performs the first flood exposure L2a and the second flood exposure L2b. The flood light source 224 irradiates the resist layer 10 in the chamber 222 with beams of the first flood exposure L2a. The beams emitted from the flood light source 224 radiate the entirety of an area in the resist layer 10.

Thereafter, the flood light source 224 irradiates the resist layer 10 in the chamber 222 with beams of the second flood exposure L2b. Also in this case, the beams emitted from the flood light source 224 radiate the entirety of the area in the resist layer 10. Note that the wavelength of the beams of the second flood exposure L2b is typically different from the wavelength of the beams of the first flood exposure L2a. As described above, both the first flood exposure L2a and the second flood exposure L2b may be performed by the single flood light source 224 in the flood exposure machine 220.

Furthermore, the flood exposure is performed after the pattern exposure in the above description, which should not be taken to limit the present invention. Preliminary flood exposure may be performed prior to the pattern exposure. Alternatively, generation of a sensitizer Ps from the sensitizer precursor Pp may not be completed only by the pattern exposure, and flood exposure for generating a sensitizer Ps from the sensitizer precursor Pp may be performed after the pattern exposure.

Note that a positive resist layer is described in the above description, which should not be taken to limit the present invention. The resist layer may be of negative type.

According to the present embodiment, trade-off among sensitivity, resolution, and line width roughness (LWR) performance of a resist can be broken with a result that both high resolution and high sensitivity can be attained while influence on roughness performance resulting from photon shot noise can be reduced.

Note that as aspects in which a sensitizer Ps is directly generated from the sensitizer precursor Pp in a pattern exposure step, the above description describes: an aspect in which a sensitizer Ps is generated by decomposing or isomerizing the sensitizer precursor Pp through direct ionization or excitation of the sensitizer precursor Pp by the pattern exposure L1; and an aspect in which a sensitizer Ps is generated through a reaction of electrons generated in the resist layer 10 by the pattern exposure L1 with the sensitizer precursor Pp, which should not be taken to limit the present invention. Furthermore, as an aspect in which a sensitizer Ps is indirectly generated from the sensitizer precursor Pp in the pattern exposure step, the above description describes an aspect in which either or both an acid Ac and radicals are generated from the acid generator PAG by the pattern exposure L1 and either or both the acid Ac and the radicals react(s) with the sensitizer precursor Pp to generate a sensitizer Ps, which should not be taken to limit the present invention.

Even in a flood exposure step, it is possible that a sensitizer Ps excited by the flood exposure L2 reacts with the acid generator PAG to generate either or both an acid Ac and radicals and either or both the acid Ac and the radicals react(s) with the sensitizer precursor Pp to generate a sensitizer Ps. In a case for example where the first flood exposure L2a and the second flood exposure L2b are performed as the flood exposure L2, it is possible that a sensitizer Ps excited by the first flood exposure L2a reacts with the acid generator PAG to generate either or both an acid Ac and radicals and either or both the acid Ac and the radicals react(s) with the sensitizer precursor Pp to generate a sensitizer Ps.

In order to increase sensitivity of the resist layer through removal of trade-off among sensitivity, resolution, and line width roughness (LWR) performance and form a resist pattern that can inhibit occurrence of roughness performance resulting from photon shot noise, it is preferable in the present embodiment that a sensitizer Ps is efficiently generated in a narrow area by the pattern exposure L1 and an acid Ac is efficiently generated using the sensitizer Ps in the narrow area by the flood exposure L2 with roughness performance of distribution reduced. In order to achieve the above, care is preferably taken in at least any of (1) to (5) below.

(1) In order to generate a sensitizer Ps having a concentration distribution approximately the same as the intensity distribution of the beams of the pattern exposure L1, the sensitizer Ps is preferably generated in a manner in which the sensitizer precursor Pp is directly ionized by the pattern exposure L1 or the sensitizer precursor Pp is excited to be decomposed and/or isomerized by the pattern exposure L1. Preferably, a sensitizer Ps is generated by direct ionization or excitation of the sensitizer precursor Pp in a manner as described above.

(2) In a case where a sensitizer Ps is directly generated through a reaction between the sensitizer precursor Pp and thermalized electrons generated in the resist layer 10 by the pattern exposure L1, the concentration distribution of an ionized product generated by irradiation of the beams of the pattern exposure L1 is approximately the same as the intensity distribution of the beams of the pattern exposure L1. However, the thermal diffusion distance of the electrons generated from the ionized product is several nanometers and the reaction distance of a reaction between the thermalized electrons and the sensitizer precursor Pp is usually several nanometers although a frequency of the reaction therebetween depends on the concentration of the sensitizer precursor Pp. As such, the concentration distribution of the sensitizer Ps generated in presence of the ionized product is slightly wide as compared to the intensity distribution of the beams of the pattern exposure L1.

(3) Either or both an acid Ac and radicals is/are generated by the pattern exposure L1 and react(s) with the sensitizer precursor Pp, thereby generating a sensitizer Ps. In this case, either or both the acid Ac and the radicals is/are generated at a location several nanometers apart from the ion product generated by irradiation with the beams of the pattern exposure L1. The reaction distance of a reaction between the sensitizer precursor Pp and either or both the acid Ac and the radicals depends on the concentration of the sensitizer precursor Pp. However, the reaction distance is several nanometers. As such, the concentration distribution of the sensitizer Ps is slightly wider than the intensity distribution of the beams of the pattern exposure L1.

(4) In the flood exposure step, a sensitizer Ps excited by the flood exposure L2 reacts with the acid generator PAG to generate either or both an acid and radicals while either or both the acid Ac and the radicals react(s) with the sensitizer precursor Pp to generate a sensitizer Ps. The reaction between the acid generator PAG and the excited sensitizer Ps by which either or the acid Ac and the radicals is/are generated is electron transfer or energy transfer from the excited sensitizer Ps to the acid generator PAG, and starts as a nearly isotropic reaction with high distance dependency in a three-dimensional space. Therefore, either or both the acid Ac and the radicals is/are generated into a spherical shape with the excited sensitizer Ps as a center. By contrast, the reaction that generates a sensitizer Ps through the reaction between the sensitizer precursor Pp and either or both the generated acid Ac and the generated radicals is caused by thermal diffusion or collision of either or both the acid Ac and the radicals. The sensitizer Ps is accordingly generated along random diffusion paths of either or both the acid and the radicals.

(5) It is preferable to set the concentration of the acid generator PAG high in a manner to select a three-dimensional high-isotropic sensitizer Ps and an acid generator PAG so that an acid generating reaction is efficiently caused through electron transfer or energy transfer to the acid generator PAG from the sensitizer Ps in an excited state. Furthermore, it is effective for reducing roughness performance and roughness performance resulting from photon shot noise to increase a rate of the acid generating reaction through three-dimensional high-isotropic electron or energy transfer to the reaction of either or both the acid Ac and the radicals along random diffusion paths.

Note that a chemically amplified positive resist layer is described in the above description, which should not be taken to limit the present invention. For example, a chemically amplified negative resist may be formed through a translation process accompanying negative tone development (NTD) on a conventional chemically amplified positive resist.

Furthermore, a chemically amplified resist layer is described in the above description, which should not be taken to limit the present invention. A non-chemically amplified resist may be used. Note that the resist layer 10 in an embodiment may be a non-chemically amplified resist, and the resist layer 10 may be a nano particle resist containing a metal oxide as the base resin R. The metal of the metal oxide is Hf or Zr, for example. Also in this case, a sensitizer Ps is generated from the sensitizer precursor Pp by the pattern exposure L1 and a reaction of the nano particles of the metal oxide starts from the sensitizer Ps excited in the flood exposure L2 to sensitize the resist. Needless to say, however, the present invention is no way limited to the above aspect. Note that a nano particle resist of a metal oxide containing the acid generator PAG is preferable because it uses the base generator PBG singly or in combination with a photoreaction inhibitor generator.

An embodiment of the present invention has been described so far with reference to the drawings. However, the present invention is not limited to the above embodiment and can be practiced in various ways as an embodiment within the scope without departing from the essence of the present disclosure. Furthermore, appropriate combination of elements of configuration disclosed in the above embodiment can form various inventions. For example, some of all the elements of configuration indicated in the embodiment may be omitted. The drawings schematically illustrate elements of configuration in order to facilitate understanding, and the number of elements of configuration illustrated in the drawings and the like may differ from actual ones thereof in order to facilitate preparation of the drawings. In addition, each element of configuration indicated in the above embodiment is one example and is not intended as specific limitations. Any alterations thereof are possible in various ways to the extent that there is not substantial deviation from the effects of the present invention.

INDUSTRIAL APPLICABILITY

The resist pattern formation method of the present invention is favorably used in formation of a resist pattern on a substrate. According to the resist pattern formation method of the present invention, decreases in sensitivity, resolution, and line width roughness performance can be inhibited.

The invention claimed is:

1. A resist pattern formation method comprising:
   forming a resist layer on a substrate, the resist layer containing a base resin, a sensitizer precursor, an acid generator, and a base;
   allowing a portion of an acid to be neutralized with the base through pattern exposure on the resist layer, the acid being generated from the acid generator by the pattern exposure;
   generating, after the pattern exposure, a sensitizer from the sensitizer precursor by performing heating of the resist layer in presence of the acid generated by the pattern exposure in the resist layer;
   generating, after the heating of the resist layer, an acid from the acid generator by performing flood exposure on the resist layer in which the sensitizer has been generated;
   performing heat treatment on the resist layer after the flood exposure; and
   developing the resist layer after the heat treatment, wherein
   in the heating of the resist layer, the resist layer is heated such that a size of a region of the resist layer in which the sensitizer is to be generated after the heating of the resist layer is equal to or smaller than a size of a region of the resist layer in which the acid has been generated by the pattern exposure.

2. The resist pattern formation method according to claim 1, wherein
   in the forming a resist layer, the resist layer further contains a base generator, and
   in the flood exposure, a base is generated from the base generator.

3. The resist layer formation method according to claim 2, wherein
   a ratio ($C1=A1/B1$) of a value (A1) representing the acid in the pattern exposure to a value (B1) representing the base in the pattern exposure satisfies a relationship $0.9 \times C1 < C2 < 10 \times C1$ relative to a ratio ($C2=A2/B2$) of a value (A2) representing the acid in the flood exposure to a value (B2) representing the base in the flood exposure.

4. The resist layer formation method according to claim 3, wherein
   the value (A1) representing the acid in the pattern exposure indicates a peak concentration of the acid generated from the acid generator in the pattern exposure,
   the value (B1) representing the base in the pattern exposure indicates a concentration of the base contained in the resist layer in the forming a resist layer,
   the value (A2) representing the acid in the flood exposure indicates a peak concentration of a sum of an acid remaining after neutralization between the acid in the pattern exposure and the base in the pattern exposure and the acid generated from the acid generator by the flood exposure, and
   the value (B2) representing the base in the flood exposure indicates a concentration of a sum of the base contained in the resist layer in the forming a resist layer and the base generated from the base generator by the flood exposure.

5. The resist pattern formation method according to claim 3, wherein
   the value (A1) representing the acid in the pattern exposure indicates an amount of an acid generated from the acid generator in an acid remaining region of the resist layer in which an acid remains after neutralization between the acid in the pattern exposure and the base in the pattern exposure, the value (B1) representing the base in the pattern exposure indicates an amount of a base contained in the acid remaining region of the resist layer in the forming a resist layer, the value (A2) representing the acid in the flood exposure indicates a sum of an amount of the acid remaining in the acid remaining region of the resist layer after the neutralization between the acid in the pattern exposure and the base in the pattern exposure and an amount of the acid generated from the acid generator by the flood exposure, and the value (B2) representing the base in the flood exposure indicates an amount of a base generated in the acid remaining region of the resist layer from the base generator by the flood exposure.

6. The resist pattern formation method according to claim 1, wherein before the heating of the resist layer, a portion of the acid generated by the pattern exposure generates a sensitizer from the sensitizer precursor by the pattern exposure.

7. The resist pattern formation method according to claim 1, wherein in the forming a resist layer, the base includes a strong base and a weak base having a higher concentration than the strong base, in the pattern exposure, a portion of the acid generated by the pattern exposure reacts with the sensitizer precursor to generate a sensitizer, another portion of the acid generated by the pattern exposure is neutralized with the weak base to generate a weak acid, a portion of the weak acid reacts with the sensitizer precursor to generate a sensitizer, and another portion of the weak acid is neutralized with the strong base, and the sensitizer generated in the heating of the resist layer is generated from the sensitizer precursor in presence of the weak acid and the acid generated by the pattern exposure in the resist layer.

8. The resist pattern formation method according to claim 7, wherein in the pattern exposure on the resist layer, the pattern exposure is performed such that a size of a region of the resist layer in which the sensitizer is to be generated after the pattern exposure is equal to or smaller than a region of the resist layer in which the acid has been generated by the pattern exposure.

9. The resist pattern formation method according to claim 1, wherein a size (Wb) of a region in which an acid remains after neutralization between the acid in the flood exposure and the base in the flood exposure is equal to or smaller than a size (Wa) of a region in which an acid remains after neutralization between the acid in the pattern exposure and the base in the pattern exposure.

10. The resist pattern formation method according to claim 1, wherein a difference (A2-B2) between the value (A2) representing the acid in the flood exposure and the value (B2) representing the base in the flood exposure is larger than a difference (A1-B1) between the value (A1) representing the acid in the pattern exposure and the value (B1) representing the base in the pattern exposure.

11. The resist pattern formation method according to claim 1, wherein the pattern exposure uses electromagnetic waves including a KrF excimer laser, an ArF excimer laser, or extreme ultraviolet having a wavelength shorter than 250 nm.

12. The resist pattern formation method according to claim 1, wherein the pattern exposure uses charge beams including electron beams or ion beams.

* * * * *